US012813102B2

(12) United States Patent
Du et al.

(10) Patent No.: US 12,813,102 B2
(45) Date of Patent: Nov. 24, 2026

(54) DISPLAY PANEL AND DISPLAY DEVICE

(71) Applicants: Chengdu BOE Optoelectronics Technology Co., Ltd., Chengdu (CN); BOE Technology Group Co., Ltd., Beijing (CN)

(72) Inventors: Mengmeng Du, Beijing (CN); Tingliang Liu, Beijing (CN); Yao Huang, Beijing (CN); Fan He, Beijing (CN); Xiangdan Dong, Beijing (CN); Zhiwei Xiang, Beijing (CN)

(73) Assignees: CHENGDU BOE OPTOELECTRONICS TECHNOLOGY CO., LTD., Chengdu (CN); BOE TECHNOLOGY GROUP CO., LTD., Beijing (CN)

( * ) Notice: Subject to any disclaimer, the term of this patent is extended or adjusted under 35 U.S.C. 154(b) by 412 days.

(21) Appl. No.: 18/289,573

(22) PCT Filed: Jan. 4, 2023

(86) PCT No.: PCT/CN2023/070523
§ 371 (c)(1),
(2) Date: Nov. 6, 2023

(87) PCT Pub. No.: WO2024/145841
PCT Pub. Date: Jul. 11, 2024

(65) Prior Publication Data
US 2024/0431160 A1 Dec. 26, 2024

(51) Int. Cl.
*H10K 59/131* (2023.01)
*H10K 59/35* (2023.01)

(52) U.S. Cl.
CPC ........... *H10K 59/131* (2023.02); *H10K 59/35* (2023.02)

(58) Field of Classification Search
None
See application file for complete search history.

(56) References Cited

U.S. PATENT DOCUMENTS

| | | | | |
|---|---|---|---|---|
| 9,755,002 | B2 * | 9/2017 | Lee | G09G 3/3233 |
| 2017/0147121 | A1 * | 5/2017 | Yang | G09G 3/3233 |

(Continued)

FOREIGN PATENT DOCUMENTS

| | | | |
|---|---|---|---|
| CN | 107591124 | A | 1/2018 |
| CN | 111354314 | A | 6/2020 |

(Continued)

OTHER PUBLICATIONS

Extended European search report of counterpart European application No. 23914000.7 issued on Oct. 7, 2025, total 14 pages.

*Primary Examiner* — Bilkis Jahan
(74) *Attorney, Agent, or Firm* — XSENSUS LLP

(57) ABSTRACT

Provided is a display panel. The display panel includes: a substrate and a plurality of pixels; wherein each of the plurality of pixels includes a plurality of sub-pixels, and each of the plurality of sub-pixels includes a pixel circuit and a light-emitting element. The pixel circuit includes: a drive circuit, coupled to a first node, a second node and a third node; and a reset circuit, coupled to a first reset line, a second reset line, a first initialization line, a second initialization line, a third initialization line, the first node, the second node, and a first electrode of a light-emitting element, wherein the reset circuit is configured to control connection or disconnection between the first initialization line and the second node, between the second initialization line and the first electrode of the light-emitting element, and between the third initialization line and the first node.

20 Claims, 46 Drawing Sheets

(56) References Cited

U.S. PATENT DOCUMENTS

| | | | | |
|---|---|---|---|---|
| 2018/0061317 | A1 | 3/2018 | Morita et al. | |
| 2018/0151115 | A1 | 5/2018 | Tseng et al. | |
| 2021/0159295 | A1* | 5/2021 | Miao | G09G 3/3233 |
| 2022/0028317 | A1* | 1/2022 | Kim | G09G 3/20 |
| 2022/0101778 | A1* | 3/2022 | Kim | G09G 3/3233 |
| 2022/0198987 | A1* | 6/2022 | Kim | G09G 3/2074 |
| 2022/0336566 | A1 | 10/2022 | Chen et al. | |
| 2024/0078976 | A1 | 3/2024 | Cheng et al. | |
| 2024/0119897 | A1 | 4/2024 | Zhang et al. | |

FOREIGN PATENT DOCUMENTS

| | | | | |
|---|---|---|---|---|
| CN | 111477669 | A | 7/2020 | |
| CN | 111883055 | A | 11/2020 | |
| CN | 113658995 | * | 11/2021 | G06F 3/041 |
| CN | 113658995 | A | 11/2021 | |
| CN | 113707704 | A | 11/2021 | |
| CN | 113793568 | A | 12/2021 | |
| CN | 114222615 | A | 3/2022 | |
| CN | 114258320 | A | 3/2022 | |
| CN | 114373773 | A | 4/2022 | |
| CN | 114974130 | A | 8/2022 | |
| CN | 115023756 | A | 9/2022 | |
| CN | 115394252 | * | 11/2022 | G09G 3/3225 |
| CN | 115394252 | A | 11/2022 | |
| CN | 115398640 | A | 11/2022 | |
| WO | 2022/078076 | A1 | 4/2022 | |
| WO | 2022226845 | A1 | 11/2022 | |

* cited by examiner

BSM+Poly+Gate1

BSM+Poly+Gate1+Gate2+IGZO+Gate3

BSM+Poly+Gate1+Gate2+IGZO+Gate3+ILD_L+ILD_O+SD1

BSM+Poly+Gate1+Gate2+IGZO+Gate3+
ILD_L+ILD_O+SD1+PLN1+SD2+PLN2

PLN1+SD2+PLN2+Anode+PDL

BSM+Poly+Gate1+Gate2+IGZO+Gate3+ILD_L+
ILD_O+SD1+PLN1+SD2+PLN2+Anode+PDL

BSM+Poly+Gate1

BSM+Poly+Gate1+Gate2

BSM+Poly+Gate1+Gate2+IGZO+Gate3

Gate3+IGZO+ILD_L+ILD_O

BSM+Poly+Gate1+Gate2+IGZO+Gate3+ILD_L+ILD_O

BSM+Poly+Gate1+Gate2+IGZO+Gate3+ILD_L+ILD_O+SD1

BSM+Poly+Gate1+Gate2+IGZO+Gate3+ILD_L
+ILD_O+SD1+PLN1+SD2+PLN2

BSM+Poly+Gate1+Gate2+IGZO+Gate3+ILD_L
+ILD_O+SD1+PLN1+SD2+PLN2+Anode+PDL

DISPLAY PANEL AND DISPLAY DEVICE

CROSS-REFERENCE TO RELATED APPLICATION

This application is a U.S. national stage of international application No. PCT/CN2023/070523, filed on Jan. 4, 2023, the disclosure of which is incorporated herein by reference in its entirety.

TECHNICAL FIELD

The present disclosure relates to the field of display technologies, and in particular, to a display panel and a display device.

BACKGROUND

Organic light-emitting diode (OLED) display panels are widely used in various display devices because of their advantages of self-illumination, fast response speed, low power consumption and the like.

SUMMARY

A display panel and a display device are provided. The technical solutions are as follows.

In some embodiments of the present disclosure, a display panel is provided. The display panel includes:

- a substrate and a plurality of pixels disposed on the substrate;
- wherein each of the plurality of pixels includes a plurality of sub-pixels, and each of the plurality of sub-pixels includes a pixel circuit and a light-emitting element. The pixel circuit includes:
- a drive circuit, coupled to a first node, a second node and a third node, wherein the drive circuit is configured to control a potential of the second node based on a potential of the third node and a potential of the first node; and
- a reset circuit, coupled to a first reset line, a second reset line, a first initialization line, a second initialization line, a third initialization line, the first node, the second node, and a first electrode of a light-emitting element which are disposed on the substrate, wherein the reset circuit is configured to control connection or disconnection between the first initialization line and the second node based on a first reset signal provided by the first reset line, and control, based on a second reset signal provided by the second reset line, connection or disconnection between the second initialization line and the first electrode of the light-emitting element and connection or disconnection between the third initialization line and the first node;
- wherein at least one of the first initialization line, the second initialization line and the third initialization line is mesh-shaped.

In some embodiments, the pixel circuit further includes:

- a light emission control circuit, coupled to a first gate line, a second gate line, a light emission control line, a data line, a first power line, the first node, the second node, the third node and the first electrode of the light-emitting element which are disposed on the substrate, wherein the light emission control circuit is configured to control connection or disconnection between the data line and the first node based on a first gate driving signal provided by the first gate line, control connection or disconnection between the second node and the third node based on a second gate driving signal provided by the second gate line, and control, based on a light emission control signal provided by the light emission control line, connection or disconnection between the first power line and the first node and connection or disconnection between the second node and the first electrode of the light-emitting element;
- wherein a second electrode of the light-emitting element is coupled to a second power line, and the light-emitting element is configured to emit light based on a potential of the first electrode and a potential of the second electrode.

In some embodiments, the substrate has a display region; wherein

- at least part of the second power line is disposed in the display region, and the part of the second power line disposed in the display region is mesh-shaped.

In some embodiments, for each mesh-shaped signal line, the signal line coupled to each sub-pixel has a first portion extending along a first direction, and the first portions of the signal line coupled to the plurality of sub-pixels in each pixel are communicated with each other in the first direction, the signal line coupled to at least one sub-pixel has a second portion extending along a second direction, and the second portions of the signal line coupled to different sub-pixels are spaced apart from each other in the first direction, and the first portion and the second portion of each of the signal lines are coupled to each other; and for at least part of the mesh-shaped signal lines, the first portion and the second portion of each of the signal lines are disposed in different layers, and for other mesh-shaped signal lines except the at least part of the mesh-shaped signal lines, the first portion and the second portion of each of the signal lines are disposed in a same layer;

- for other signal lines except the mesh-shaped signal lines, each of the signal lines extends along the first direction or extends along the second direction;
- wherein the first direction intersects the second direction.

In some embodiments, at least two of the first initialization line, the second initialization line and the third initialization line are mesh-shaped; and each pixel includes at least three sub-pixels;

- wherein for each of the at least two mesh-shaped initialization lines, the initialization line coupled to one of the at least three sub-pixels has the second portion.

In some embodiments, different sub-pixels are coupled to different initialization lines having the second portion.

In some embodiments, at least two of the first initialization line, the second initialization line and the third initialization line are mesh-shaped; and each pixel includes at least three sub-pixels;

- wherein for each of the at least two mesh-shaped initialization lines, the initialization line coupled to partial sub-pixels of the at least three sub-pixels has the second portion.

In some embodiments, a number of the partial sub-pixels is greater than or equal to 1, and the partial sub-pixels are not adjacent in the first direction; and

- two sub-pixels adjacent in the first direction are coupled to different initialization lines having the second portion.

In some embodiments, at least two of the first initialization line, the second initialization line and the third initialization line are mesh-shaped; and each pixel includes at least three sub-pixels;

wherein for one part of the at least two mesh-shaped initialization lines, the initialization line coupled to each sub-pixel of the at least three sub-pixels has the second portion, and for the other part of the at least two mesh-shaped initialization lines except the one part of the at least two mesh-shaped initialization lines, the initialization line coupled to partial sub-pixels of the at least three sub-pixels has the second portion.

In some embodiments, a number of the partial sub-pixels is greater than or equal to 1, and the partial sub-pixels are not adjacent in the first direction.

In some embodiments, each pixel includes three sub-pixels or four sub-pixels;

each of the first initialization line, the second initialization line and the third initialization line is mesh-shaped; or, the second initialization line and the third initialization line are mesh-shaped.

In some embodiments, the three sub-pixels in each pixel include: one red sub-pixel, one green sub-pixel and one blue sub-pixel; and the four sub-pixels in each pixel include: one red sub-pixel, two green sub-pixels and one blue sub-pixel.

In some embodiments, the pixel in the display panel includes: a plurality of metal layers sequentially stacked in a direction going away from the substrate; wherein for the at least part of the mesh-shaped signal lines, the first portion is disposed in a same layer as one metal layer of the plurality of metal layers, and the second portion is disposed in a same layer as another metal layer of the plurality of metal layers; and for the other mesh-shaped signal lines except the at least part of the mesh-shaped signal lines, the first portion and the second portion are disposed in a same layer as a same metal layer of the plurality of metal layers;

each of the other signal lines is disposed in a same layer as any metal layer of the plurality of metal layers.

In some embodiments, the plurality of metal layers include: a first gate metal layer, a second gate metal layer, a third gate metal layer, a first source-drain metal layer and a second source-drain metal layer which are sequentially stacked;

the mesh-shaped signal lines include: the second initialization line and the third initialization line; wherein the first portion of the second initialization line is disposed in a same layer as the first source-drain metal layer, and the second portion of the second initialization line is disposed in a same layer as the second source-drain metal layer; or, the first portion and the second portion of the second initialization line are disposed in a same layer as the first source-drain metal layer; and the first portion of the third initialization line is disposed in a same layer as the third gate metal layer, and the second portion of the third initialization line is disposed in a same layer as the second source-drain metal layer.

In some embodiments, the light emission control line extends along the first direction, and is disposed in a same layer as the first gate metal layer;

the second gate line extends along the first direction, and is disposed in a same layer as the second gate metal layer and the third gate metal layer;

the data line extends along the second direction, and is disposed in a same layer as the second source-drain metal layer;

the first power line includes three portions coupled to each other, wherein one portion extends along the first direction, and is disposed in a same layer as the second source-drain metal layer; another portion extends along the second direction, and is disposed in a same layer as the first source-drain metal layer, and the other portion extends along the second direction, and is disposed in a same layer as the second source-drain metal layer;

the first reset line, the first gate line and the second reset line extend along the first direction, and are disposed in a same layer as the first gate metal layer or disposed in a same layer as the first source-drain metal layer.

In some embodiments, the first initialization line extends along the first direction, and is disposed in a same layer as the second gate metal layer;

the mesh-shaped signal lines further include: a second power line disposed in a display region of the substrate; wherein a first portion of the second power line is disposed in a same layer as the first source-drain metal layer, and a second portion of the second power line is disposed in a same layer as the second source-drain metal layer.

In some embodiments, the second power line disposed in the display region of the substrate extends along the second direction, and is disposed in a same layer as the second source-drain metal layer;

the mesh-shaped signal lines further include: the first initialization line; wherein a first portion of the first initialization line is disposed in a same layer as the second gate metal layer, and a second portion of the first initialization line is disposed in a same layer as the second source-drain metal layer.

In some embodiments, the light emission control circuit includes: a first transistor, a second transistor, a third transistor, a fourth transistor and a storage capacitor; the reset circuit includes: a fifth transistor, a sixth transistor and a seventh transistor; and the drive circuit includes an eighth transistor; wherein a gate of the first transistor is coupled to the first gate line, a first electrode of the first transistor is coupled to the data line, and a second electrode of the first transistor is coupled to the first node;

a gate of the second transistor is coupled to the second gate line, a first electrode of the second transistor is coupled to the second node, and a second electrode of the second transistor is coupled to the third node;

a gate of the third transistor is coupled to the light emission control line, a first electrode of the third transistor is coupled to the first power line, and a second electrode of the third transistor is coupled to the first node;

a gate of the fourth transistor is coupled to the light emission control line, a first electrode of the fourth transistor is coupled to the second node, and a second electrode of the fourth transistor is coupled to the first electrode of the light-emitting element;

one terminal of the storage capacitor is coupled to the first power line, and the other terminal of the storage capacitor is coupled to the third node;

a gate of the fifth transistor is coupled to the first reset line, a first electrode of the fifth transistor is coupled to the first initialization line, and a second electrode of the fifth transistor is coupled to the second node;

a gate of the sixth transistor is coupled to the second reset line, a first electrode of the sixth transistor is coupled to the second initialization line, and a second electrode of the sixth transistor is coupled to the first electrode of the light-emitting element;

a gate of the seventh transistor is coupled to the second reset line, a first electrode of the seventh transistor is coupled to the third initialization line, and a second electrode of the seventh transistor is coupled to the first node; and a gate of the eighth transistor is coupled to the third node, a first electrode of the eighth transistor is coupled to the first node, and a second electrode of the eighth transistor is coupled to the second node.

In some embodiments, the second transistor is an N-type oxide transistor; and the first transistor, the third transistor, the fourth transistor, the fifth transistor, the sixth transistor, the seventh transistor and the eighth transistor are P-type low-temperature poly-silicon transistors.

In some embodiments of the present disclosure, a display device is provided. The display device includes: a power supply assembly, and the display panel described in the above embodiments; wherein the power supply assembly is coupled to the display panel, and configured to supply power to the display panel.

BRIEF DESCRIPTION OF DRAWINGS

For clearer descriptions of the technical solutions in the embodiments of the present disclosure, the accompanying drawings required for describing the embodiments are described below. The accompanying drawings in the following description show merely some embodiments of the present disclosure, and those of ordinary skill in the art may still derive other drawings from these accompanying drawings without creative effort.

DETAILED DESCRIPTION

To make the objectives, technical solutions, and advantages of the present disclosure clearer, the embodiments of the present disclosure will be further described in detail below with reference to the accompanying drawings.

At present, an OLED display panel generally includes a substrate and a plurality of pixels disposed on the substrate. Each pixel includes a pixel circuit and a light-emitting element. The pixel circuit includes a driving transistor. The pixel circuit is coupled to a plurality of signal lines and the light-emitting element. The pixel circuit is configured to generate, based on signals provided by the plurality of signal lines, driving current through a driving transistor and transmit the driving current to the light-emitting element to drive the light-emitting element to emit light.

However, because the electrodes of the driving transistor in the pixel circuit have different voltages, when the OLED display panel switches display at different frequencies, the brightness difference is caused, and the display effect is poor.

Figure 1:
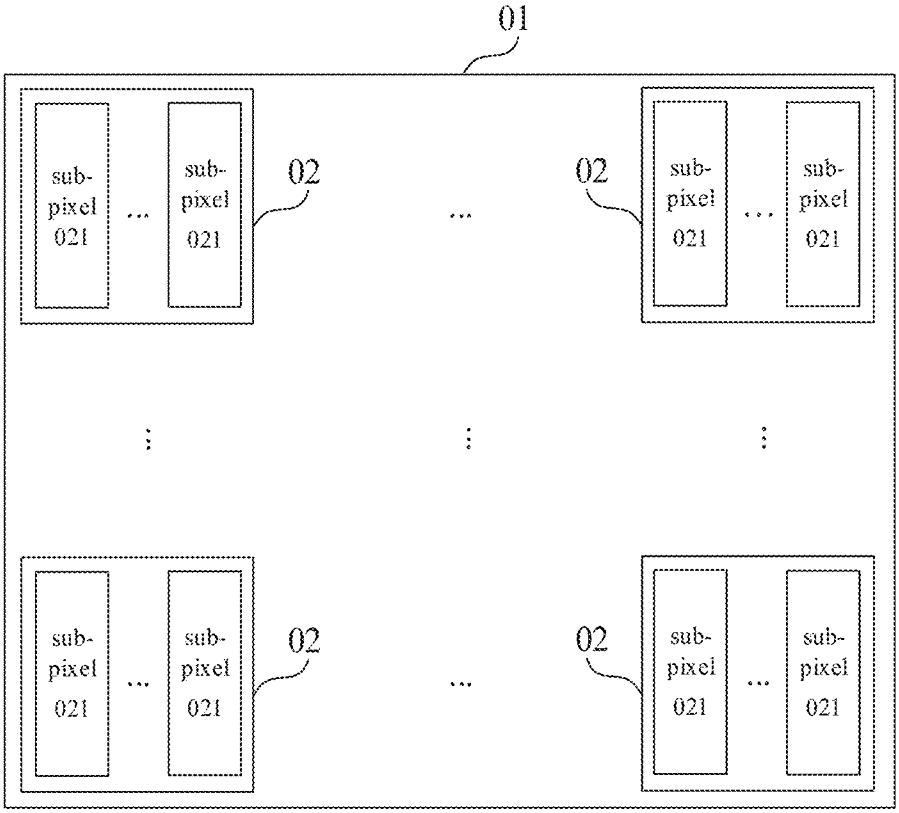
FIG. 1 is a schematic structural diagram of a display panel according to some embodiments of the present disclosure.

FIG. 1 is a schematic structural diagram of a display panel according to some embodiments of the present disclosure. As shown in FIG. 1, the display panel includes a substrate 01 and a plurality of pixels 02 disposed on the substrate 01. Each of the pixels 02 includes a plurality of sub-pixels 021.

Figure 2:
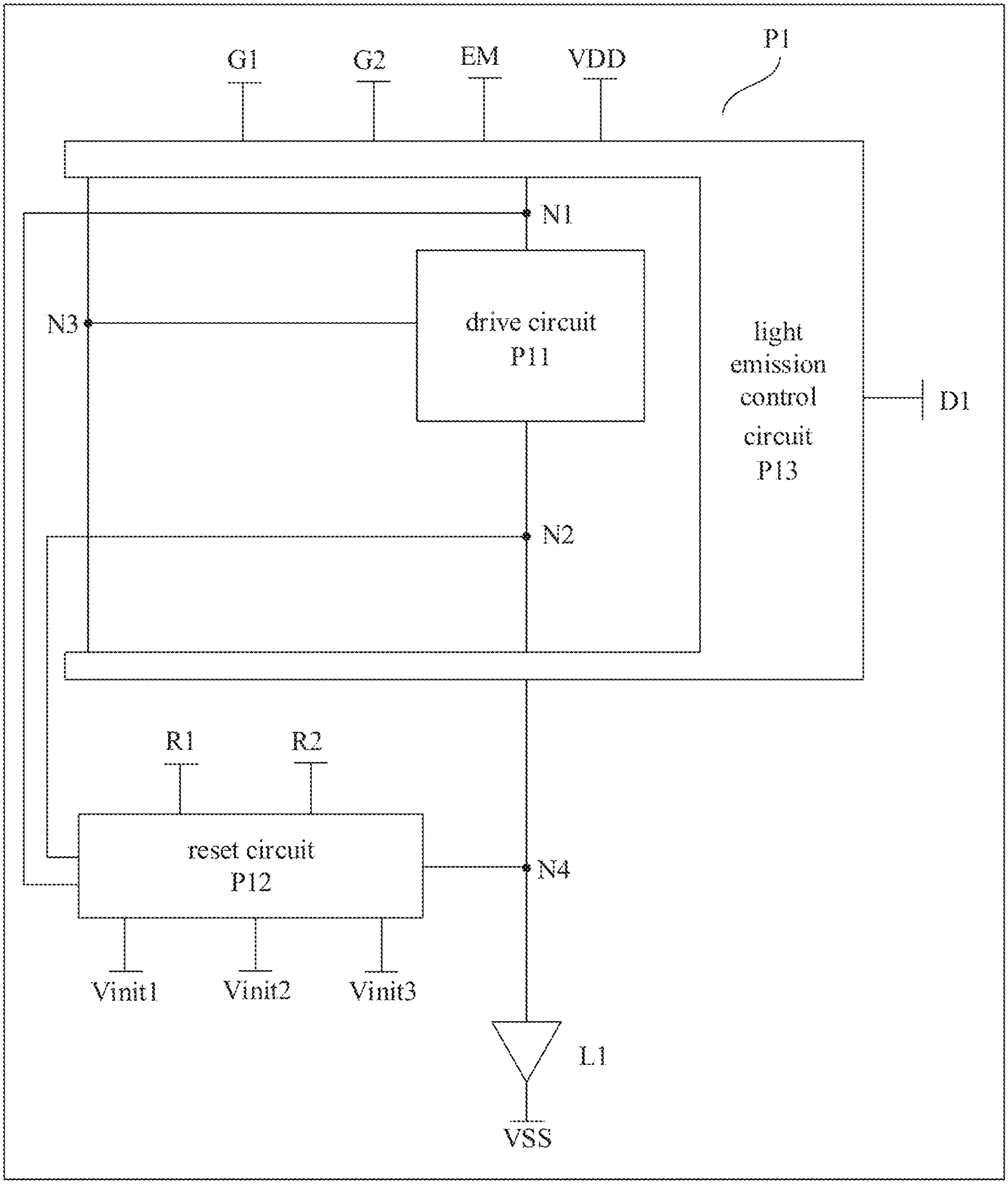
FIG. 2 is a schematic structural diagram of a pixel in a display panel according to some embodiments of the present disclosure.

On the basis of FIG. 1, it can be seen from FIG. 2 that each sub-pixel 021 includes a pixel circuit P1 and alight-emitting element L1, and the pixel circuit P1 includes a drive circuit P11 and a reset circuit P12.

The drive circuit P1 is coupled to (i.e., electrically connected to) a first node N1, a second node N2 and a third node N3. The drive circuit P11 is configured to control a potential of the second node N2 based on a potential of the third node N3 and a potential of the first node N1.

For example, when applied to the OLED display panel, the drive circuit P11 generates a light emission driving signal (i.e., driving current) for driving the OLED to emit light based on the potential of the third node N3 and the potential of the first node N1, and transmit the light emission driving signal to the second node N2. When the second node N2 is connected to the light-emitting element L1, the light emission driving signal is further transmitted to the light-emitting element L1 to drive the light-emitting element L1 to emit light.

The reset circuit P12 is coupled to a first reset line R1, a second reset line R2, a first initialization line Vinit1, a second initialization line Vinit2, a third initialization line Vinit3 (which is also referred to as a reference power line Vref), the first node N1, the second node N2, and a first electrode of the light-emitting element L1 which are disposed on the substrate 01. The reset circuit P12 is configured to control the connection or disconnection between the first initialization line Vinit1 and the second node N2 based on a first reset signal provided by the first reset line R1, and control, based on a second reset signal provided by the second reset line R2, the connection or disconnection between the second initialization line Vinit2 and the first electrode of the light-emitting element L1 and the connection or disconnection between the third initialization line Vinit3 and the first node N1. In FIG. 2, the node coupled to the first electrode of the light-emitting element L1 is marked with a fourth node N4.

For example, the reset circuit P12 controls the first initialization line Vinit1 to be connected to the second node N2 when the potential of the first reset signal provided by the first reset line R1 is a first potential. In this case, a first initialization signal provided by the first initialization line Vinit1 is transmitted to the second node N2, thereby resetting the second node N2. When the second node N2 is connected to the third node N3, the first initialization signal is further transmitted to the third node N3, thereby resetting the third node N3. The reset circuit P12 controls the first initialization line Vinit1 to be disconnected from the second node N2 when the potential of the first reset signal provided by the first reset line R1 is a second potential.

Similarly, when the potential of the second reset signal provided by the second reset line R2 is the first potential, the reset circuit P12 controls the second initialization line Vinit2 to be connected to the first electrode of the light-emitting element L1, and controls the third initialization line Vinit3 to be connected to the first node N1. In this case, a second initialization signal provided by the second initialization line Vinit2 is transmitted to the first electrode of the light-emitting element L1, thereby resetting the first electrode of the light-emitting element L1, and a third initialization signal provided by the third initialization line Vinit3 is transmitted to the first node N1, thereby resetting the first node N1. In addition, when the potential of the second reset signal provided by the second reset line R2 is the second potential, the reset circuit P12 controls the second initialization line Vinit2 to be disconnected from the first electrode of the light-emitting element L1 and controls the third initialization line Vinit3 to be disconnected from the first node N1.

That is, the reset circuit P12 resets the first node N1, the second node N2, the third node N3 and the first electrode of the light-emitting element L1 (i.e., the fourth node N4 in FIG. 2).

It should be noted that the first potential is an effective potential, and the second potential is an ineffective potential; and one of the first potential and the second potential (i.e., the effective potential and the ineffective potential) is a high potential, and the other potential is a low potential. The high potential and the low potential herein are relative.

At present, due to the instability of the manufacturing process of the display panel, there is a difference between the threshold voltages Vth of the driving transistors included in the drive circuits in the sub-pixels in the display panel. Thus, even if the same data signal (reflected as grayscale) is loaded to the drive circuits in the sub-pixels, the driving currents transmitted to the light-emitting elements in different sub-pixels are different, resulting in poor display uniformity. In addition, the current reset circuit can only reset the third node N3 and the fourth node N4, but cannot reset the first node N1 and the second node N2. As a result, because the reset voltages of the first node N1 and the second node N2 in the refresh frame and the hold frame are different when display is switched between different frequencies, the variable refresh rate (VRR) is poor, resulting in a brightness difference, and human eyes can observe brightness flickers. In addition, since only the third node N3 is reset to bias the driving transistor, and at different grayscales, different potentials are written into the first node N1, the bias potentials are different at different grayscales, the bias effect is poor, and the driving transistor has hysteresis.

In the embodiments of the present disclosure, the reset circuit P12 is configured to reset the third node N3 and the first electrode (i.e., the fourth node N4) of the light-emitting element L1, and reset the first node N1 and the second node N2, so that the potential of the first node N1 and the potential of the second node N2 remain consistent in the refresh frame and the hold frame. In this way, not only the driving transistor can be biased more flexibly to solve the hysteresis problem of the driving transistor, but also the poor VRR can be effectively improved. Therefore, when the display panel switches the display between different frequencies, the brightness difference is small, and the display effect is better.

Additionally, in the embodiments of the present disclosure, at least one of the first initialization line Vinit1, the second initialization line Vinit2 and the third initialization line Vinit3 is mesh-shaped. For example, in the layout shown in FIG. 3, the third initialization line Vinit3 is mesh-shaped.

Figure 3:
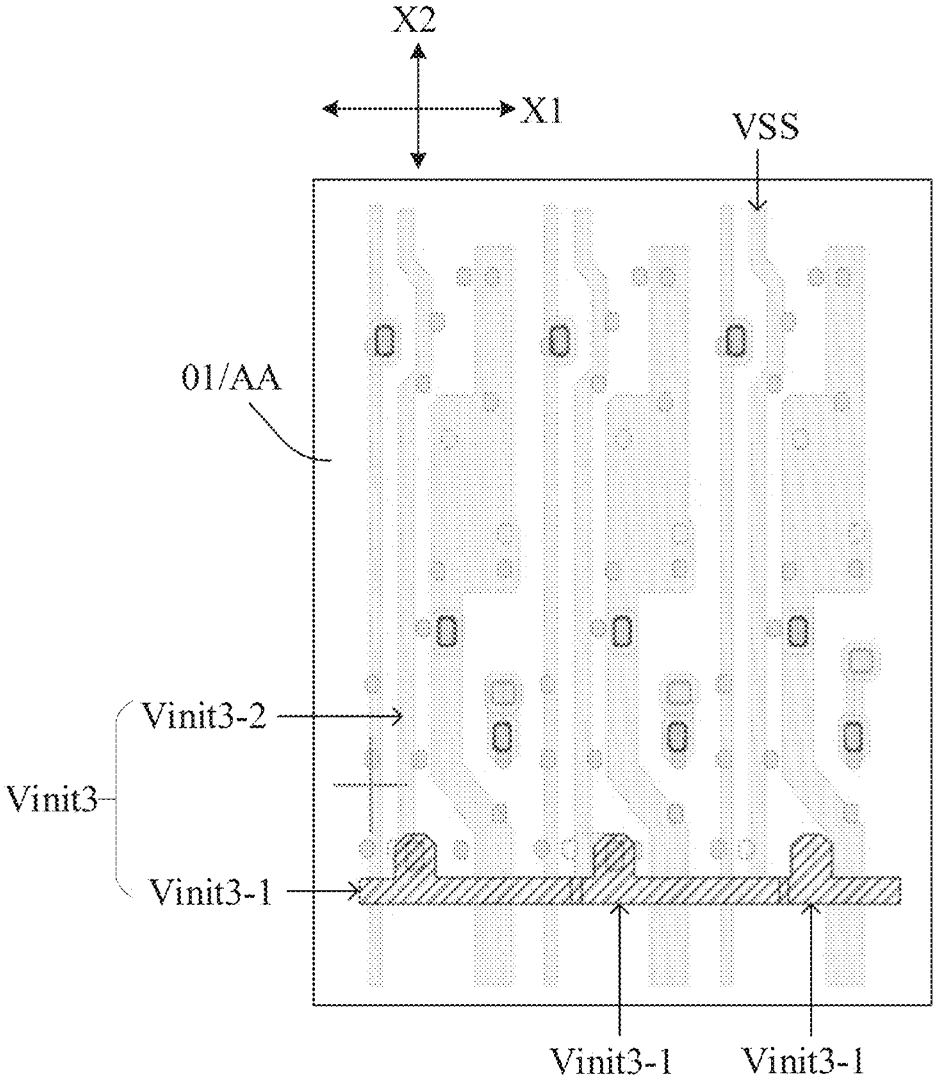
FIG. 3 is a partial structural layout of a pixel in a display panel according to some embodiments of the present disclosure.

As can be seen from FIG. 3, a meshed-shaped signal line includes two portions coupled to each other, and the two portions extend in two non-parallel directions, that is, the two portions intersect. For example, as shown in FIG. 3, the mesh-shaped third initialization line Vinit3 includes two portions Vinit3-1 and Vinit3-2 intersecting each other.

It should be noted that the stability of the initialization signal provided by the initialization line (e.g., the third initialization signal provided by the third initialization line Vinit3) can be improved by setting the initialization line to be meshed. In this way, the node can be reset more reliably, thereby ensuring that the display panel has a better display effect.

In summary, the embodiments of the present disclosure provide a display panel. In the display panel, the pixel circuit of each sub-pixel includes a drive circuit and a reset circuit. The drive circuit can control the potential of the second node based on the potential of the first node and the potential of the third node, and when the second node is connected to the light-emitting element, the potential transmitted by the drive circuit to the second node can drive the light-emitting element to emit light. The reset circuit can transmit an initialization signal to the first node, the second node and the light-emitting element, respectively, to reset the first node, the second node and the light-emitting element. In this way, the potentials of the nodes in the pixel circuit can keep consistent, and each pixel circuit can reliably drive the light-emitting element to emit light, thereby solving the brightness difference and ensuring a better display effect.

In addition, in the embodiments of the present disclosure, at least one of the initialization lines which provide the initialization signals is set to be mesh-shaped, which can improve the stability of the initialization signal provided by the initialization line, thereby further ensuring a better display effect.

In some embodiments, with continued reference to FIG. 2, the pixel circuit P1 described in the embodiments of the present disclosure further includes a light emission control circuit P13.

The light emission control circuit P13 is coupled to a first gate line G1, a second gate line G2, a light emission control line EM, a data line D1, a first power line VDD, the first node N1, the second node N2, the third node N3 and the first electrode (i.e., the fourth node N4) of the light-emitting element L1 that are disposed on the substrate 01. The light emission control circuit P13 is configured to control the connection or disconnection between the data line D1 and the first node N1 based on a first gate driving signal provided by the first gate line G1, control the connection or disconnection between the second node N2 and the third node N3 based on a second gate driving signal provided by the second gate line G2, and control, based on a light emission control signal provided by the light emission control line EM, the connection or disconnection between the first power line VDD and the first node N1 and the control connection or disconnection between the second node N2 and the first electrode of the light-emitting element L1.

For example, the light emission control circuit P13 controls the data line D1 to be connected to the first node N1 when the potential of the first gate driving signal provided by the first gate line G1 is the first potential. In this case, the data signal provided by the data line D1 is further transmitted to the first node N1. The light emission control circuit P13 controls the data line D1 to be disconnected from the first node N1 when the potential of the first gate driving signal provided by the first gate line G1 is the second potential.

Similarly, the light emission control circuit P13 controls the second node N2 to be connected to the third node N3 when the potential of the second gate driving signal provided by the second gate line G2 is the first potential. In this case, the potential of the second node N2 and the potential of the third node N3 interact. The light emission control circuit P13 controls the second node N2 to be disconnected from the third node N3 when the potential of the second gate driving signal provided by the second gate line G2 is the second potential.

Similarly, when the potential of the light emission control signal provided by the light emission control line EM is the first potential, the light emission control circuit P13 controls the first power line VDD to be connected to the first node N1, and controls the second node N2 to be connected to the first electrode (i.e., the fourth node N4) of the light-emitting element L1. In this case, the first power signal provided by the first power line VDD is further transmitted to the first node N1, and the signal transmitted to the second node N2 is further transmitted to the first electrode of the light-emitting element L1. When the potential of the light emission control signal provided by the light emission control line EM is the second potential, the light emission control circuit P13 controls the first power line VDD to be disconnected from the first node N1, and controls the second node N2 to be disconnected from the first electrode of the light-emitting element L1.

In some embodiments, with continued reference to FIG. 2, the second electrode of the light-emitting element L1 is coupled to a second power line VSS. The light-emitting element L1 is configured to emit light based on the potential of the first electrode and the potential of the second electrode.

For example, when the light-emitting element L1 is an OLED, the light-emitting element L1 emits light based on a voltage difference between the light emission driving signal transmitted by the pixel circuit P1 and the second power signal provided by the second power line VSS.

In some embodiments, one of the first electrode and the second electrode of the light-emitting element L1 is an anode, and the other electrode is a cathode. The embodiments of the present disclosure are described by taking an example where the first electrode is an anode and the second electrode is a cathode. On this basis, the potential of the first power signal provided by the first power line VDD is a high potential, and the potential of the second power signal provided by the second power line VSS is a low potential.

In some embodiments, with continued reference to FIG. 3, the embodiments of the present disclosure, the substrate 01 includes a display region AA, and includes a non-display region (not shown in the figure) adjacent to the display region AA. Each signal line coupled to the pixel circuit P1 shown in FIG. 2 is partially disposed in the non-display region, and partially disposed in the display region AA. The portion of the signal line disposed in the non-display region is configured to be coupled to a signal providing circuit, to receive a signal provided by the signal providing circuit. Taking the first gate line G1 as an example, the part of the first gate line G1 disposed in the non-display region is coupled to the gate drive circuit, to receive the first gate driving signal transmitted by the gate drive circuit. Here, the gate drive circuit is the signal providing circuit. The other signal lines are similar to the first gate line G1, and details are not described herein again.

Currently, the second power line VSS coupled to the light-emitting element L1 is generally disposed in the non-display region and disposed around the display region AA. In the embodiments of the present disclosure, referring to FIG. 3, the second power line VSS is disposed in the display region AA. That is, VSS in AA is designed. In this way, compared with the case where the second power line VSS is disposed in the non-display region, a shorter second power line VSS is provided to be coupled to the light-emitting element L1 in the display region AA, which can reduce the voltage drop (IR Drop) on the second power line VSS and ensure that the second power line VSS reliably provides the second power signal to the second electrode of the light-emitting element L1, thereby ensuring reliable light emission of the light-emitting element L1.

In some embodiments of the present disclosure, with reference to FIG. 3, on the basis of the second power line VSS in AA, the second power line VSS is also designed to be mesh-shaped. That is, like the third initialization line Vinit3, the second power line VSS also includes two portions which intersect and are coupled to each other. In this way, the stability of the second power supply signal provided by the second power line VSS can also be improved, and the light-emitting element L1 can emit light reliably, thereby further ensuring that the display panel has a better display effect.

Figure 4:
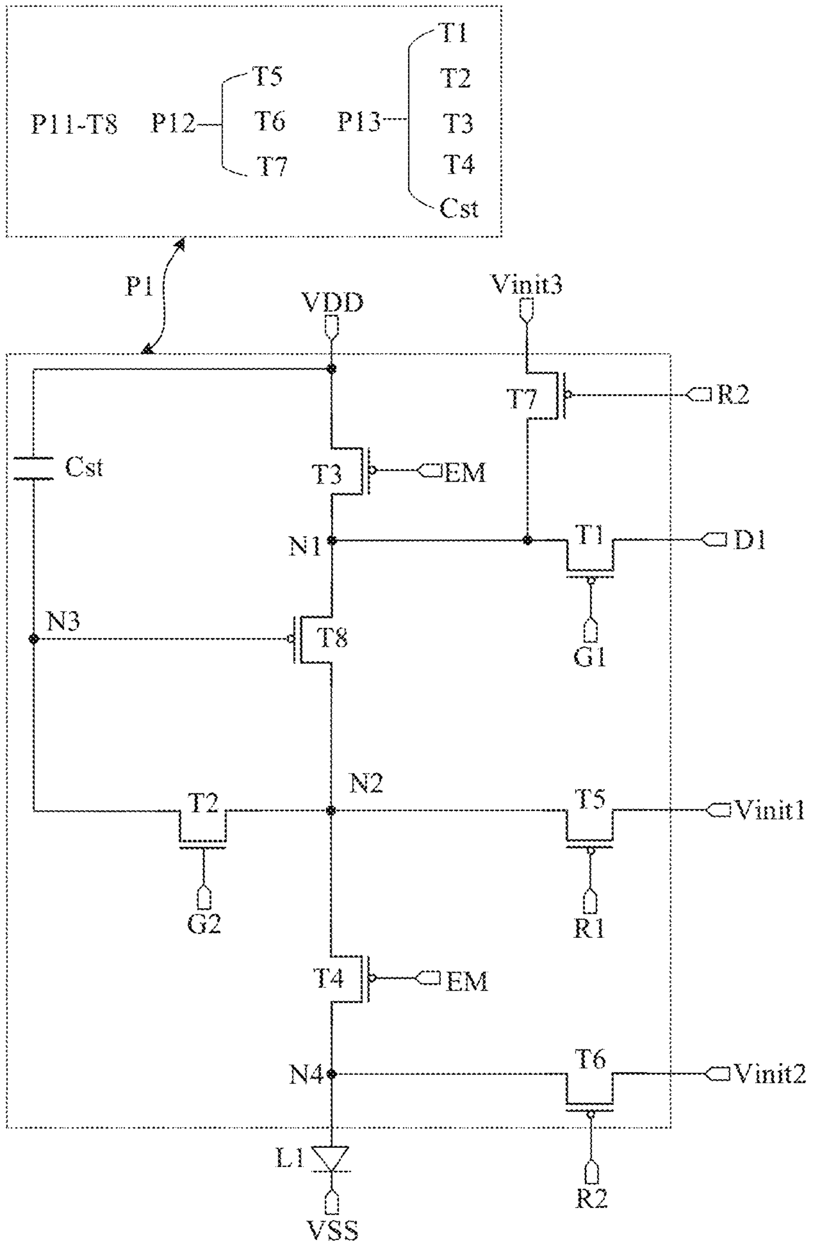
FIG. 4 is a circuit structure diagram of a pixel in a display panel according to some embodiments of the present disclosure.

In some embodiments, FIG. 4 is a schematic structural diagram of another pixel circuit according to some embodiments of the present disclosure. As shown in FIG. 4, in the pixel circuit P1 described in the embodiments of the present disclosure, the light emission control circuit P13 includes a first transistor T1, a second transistor T2, a third transistor T3, a fourth transistor T4 and a storage capacitor Cst. The reset circuit P12 includes a fifth transistor T5, a sixth transistor T6 and a seventh transistor T7. The drive circuit P11 includes an eighth transistor T8 (i.e., the driving transistor described in the foregoing embodiments).

A gate of the first transistor T1 is coupled to the first gate line G1, a first electrode of the first transistor T1 is coupled to the data line D1, and a second electrode of the first transistor T1 is coupled to the first node N1.

A gate of the second transistor T2 is coupled to the second gate line G2, a first electrode of the second transistor T2 is coupled to the second node N2, and a second electrode of the second transistor T2 is coupled to the third node N3.

A gate of the third transistor T3 is coupled to the light emission control line EM, a first electrode of the third transistor T3 is coupled to the first power line VDD, and a second electrode of the third transistor T3 is coupled to the first node N1.

Agate of the fourth transistor T4 is coupled to the light emission control line EM, a first electrode of the fourth transistor T4 is coupled to the second node N2, and a second electrode of the fourth transistor T4 is coupled to the first electrode (i.e., the fourth node N4) of the light-emitting element L1.

One terminal of the storage capacitor Cst is coupled to the first power line VDD, and the other terminal of the storage capacitor Cst is coupled to the third node N3.

Agate of the fifth transistor T5 is coupled to the first reset line R1, a first electrode of the fifth transistor T5 is coupled to the first initialization line Vinit1, and a second electrode of the fifth transistor T5 is coupled to the second node N2.

Agate of the sixth transistor T6 is coupled to the second reset line R2, a first electrode of the sixth transistor T6 is coupled to the second initialization line Vinit2, and a second electrode of the sixth transistor T6 is coupled to the first electrode of the light-emitting element L1.

Agate of the seventh transistor T7 is coupled to the second reset line R2, a first electrode of the seventh transistor T7 is coupled to the third initialization line Vinit3, and a second electrode of the seventh transistor T7 is coupled to the first node N1.

A gate of the eighth transistor T8 is coupled to the third node N3, a first electrode of the eighth transistor T8 is coupled to the first node N1, and a second electrode of the eighth transistor T8 is coupled to the second node N2.

It should be noted that the transistors used in all the embodiments of the present disclosure are field-effect transistors or other devices having the same characteristics. The transistors used in the embodiments of the present disclosure are mainly switching transistors according to the functions in the circuit. Since the source (S) and the drain (D) of the switching transistor used here are symmetrical, the source and the drain are interchangeable. In the embodiments of the present disclosure, the source is referred to as a first electrode, and the drain is referred to as a second electrode, or the drain is referred to as a first electrode, and the source is referred to as a second electrode. According to the form in the drawings, an intermediate terminal of the transistor is a gate, a signal input terminal is the source, and a signal output terminal is the drain. In addition, the switching transistors used in the embodiments of the present disclosure include any one of a P-type switching transistor and an N-type switching transistor. The P-type switching transistor is turned on when the gate is at a low level and is turned off when the gate is at a high level, and the N-type switching transistor is turned on when the gate is at a high level and turned off when the gate is at a low level. In addition, the plurality of signals in various embodiments of the present disclosure each correspond to an effective potential and an ineffective potential. The effective potential and the ineffective potential only represent that the signal has potentials with two different state quantities, but do not represent that the effective potential or the ineffective potential has a specific value in the whole text.

For example, referring to FIG. 4, in the pixel circuit P1 described in the embodiments of the present disclosure, the second transistor T2 is an N-type oxide transistor; and the first transistor T1, the third transistor T3, the fourth transistor T4, the fifth transistor T5, the sixth transistor T6, the seventh transistor T7 and the eighth transistor T8 are P-type low-temperature poly-silicon (LTPS) transistors. That is, the second transistor T2 is an N-type transistor, and the N-type transistor is made from an oxide material; and the first transistor T1, the third transistor T3, the fourth transistor T4, the fifth transistor T5, the sixth transistor T6, the seventh transistor T7 and the eighth transistor T8 are P-type transistors, and the P-type transistor is made from LTPS. On this basis, the pixel circuit P1 shown in FIG. 4 is also referred to as an LTPO pixel circuit. Certainly, in some other embodiments, all the transistors are P-type LTPS transistors, and accordingly, the pixel circuit including only the P-type transistors is also referred to as an LTPS pixel circuit.

Additionally, the structure shown in FIG. 4 is a pixel circuit having an 8T1C structure (i.e., including 8 transistors and 1 capacitors), the seventh transistor T7 is considered as a newly added transistor, and the coupling position of the fifth transistor T5 is adjusted relative to the current transistor which resets the third node N3. The second reset signal received by the gate of the seventh transistor T7 is a pulse signal. Accordingly, the 8T1C structure is also referred to as a 7T1C pulse structure. Certainly, in some other embodiments, the pixel circuit P1 is not limited to the 8T1C structure shown in FIG. 4, as long as the pixel circuit P1 includes the reset circuit P12 as shown in FIG. 4.

Figure 5:
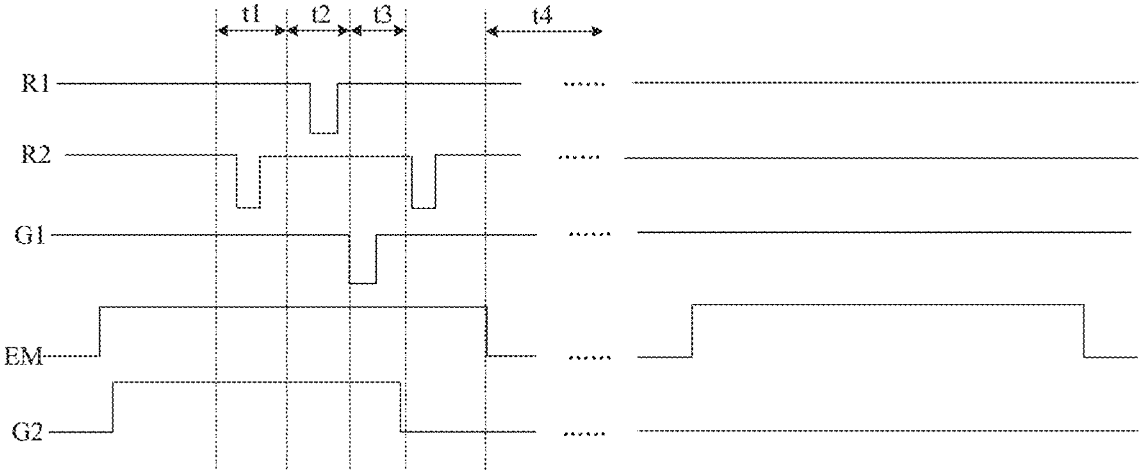
FIG. 5 is a timing diagram of signal lines coupled to a pixel circuit according to some embodiments of the present disclosure.

Taking the pixel circuit shown in FIG. 4 as an example, the driving principle for the pixel circuit described in the embodiments of the present disclosure is described as follows. FIG. 5 is a timing diagram of signal lines in a pixel circuit in a multi-frame refresh according to some embodiments of the present disclosure. As shown in FIG. 5:

In the first phase t1, the potential of the first reset signal provided by the first reset line R1, the potential of the first gate driving signal provided by the first gate line G1, the potential of the second gate driving signal provided by the second gate line G2, and the potential of the light emission control signal provided by the light emission control line EM are the high potential, and the potential of the second reset signal provided by the second reset line R2 is the low potential. Accordingly, the second transistor T2, the sixth transistor T6 and the seventh transistor T7 are turned on; and the first transistor T1, the third transistor T3, the fourth transistor T4, the fifth transistor T5 and the eighth transistor T8 are turned off. In this way, the second initialization signal provided by the second initialization line Vinit2 is transmitted to the anode of the light-emitting element L1 through the turned-on sixth transistor T6, and the third initialization signal provided by the third initialization line Vinit3 is transmitted to the first node N1 through the turned-on seventh transistor T7, thereby resetting the anode of the light-emitting element L1 and the first node N1. Correspondingly, the first phase t1 is also referred to as a first reset phase.

In the second phase t2, the potential of the first reset signal provided by the first reset line R1 jumps to the low potential, the potential of the second reset signal provided by the second reset line R2 jumps to the high potential, and the potential of the first gate driving signal provided by the first gate line G1, the potential of the second gate driving signal provided by the second gate line G2, and the potential of the light emission control signal provided by the light emission control line EM remain the high potential. Accordingly, the second transistor T2 and the fifth transistor T5 are turned on; and the first transistor T1, the third transistor T3, the fourth transistor T4, the sixth transistor T6 and the seventh transistor T7 are turned off. In this way, the first initialization signal provided by the first initialization line Vinit1 is transmitted to the second node N2 through the turned-on fifth transistor T5, and the first initialization signal transmitted to the second node N2 is further transmitted to the third node N3 through the turned-on second transistor T2, thereby resetting the second node N2 and the third node N3. Thus, the eighth transistor T8 remains turned-off. Correspondingly, the second phase t2 is also referred to as a second reset phase.

In the third phase t3, the potential of the first gate driving signal provided by the first gate line G1 jumps to the low potential, the potential of the first reset signal provided by the first reset line R1 jumps to the high potential, and the potential of the second reset signal provided by the second reset line R2, the potential of the second gate driving signal provided by the second gate line G2, and the potential of the light emission control signal provided by the light emission control line EM remain the high potential. Accordingly, the first transistor T1 and the second transistor T2 are turned on; and the third transistor T3, the fourth transistor T4, the fifth transistor T5, the sixth transistor T6 and the seventh transistor T7 are turned off. Under the coupling effect of the storage capacitor Cst, the third node N3 remains at the low potential as in the previous phase, and the eighth transistor T8 is turned on. In this way, the data signal provided by the data line D1 is transmitted to the first node N1 through the turned-on first transistor T1, and the second transistor T2 adjusts the potential of the third node N3 based on the potential of the second node N2 to compensate for the threshold voltage of the eighth transistor T8. Correspondingly, the third phase t3 is also referred to as a data writing and compensation phase.

In the fourth phase t4, the potential of the first gate driving signal provided by the first gate line G1 jumps to the high potential, the potential of the second gate driving signal provided by the second gate line G2 and the potential of the light emission control signal provided by the light emission control line EM jump to the low potential, and the potential of the first reset signal provided by the first reset line R1 and the potential of the second reset signal provided by the second reset line R2 are the high potential. Accordingly, the third transistor T3 and the fourth transistor T4 are turned on, and under the coupling effect of the storage capacitor Cst, the potential of the third node N3 is the low potential, the eighth transistor T8 is turned on, and the first transistor T1, the second transistor T2, the fifth transistor T5, the sixth transistor T6 and the seventh transistor T7 are turned off. In this way, a path is formed between the first power line VDD and the second power line VSS. The eighth transistor T8 generates a driving current based on the potential of the third node N3 and the potential of the first node N1, and transmits the driving current to the light-emitting element L1 through the turned-on fourth transistor T4, so that the light-emitting element L1 emits light. Correspondingly, the fourth phase t4 is also referred to as a light-emitting phase.

As can be seen from FIG. 3, for each mesh-shaped signal line, the signal line coupled to each sub-pixel 021 has a first portion (e.g., Vinit3-1) extending along the first direction X1, and the first portions of the signal line coupled to the plurality of sub-pixels 021 in each pixel 02 are communicated with each other in the first direction X1. For example, three first portions Vinit3-1 of the third initialization line Vinit3 coupled to three sub-pixels 021 shown in FIG. 3 are communicated with each other in the first direction X1. The signal line coupled to at least one (i.e., one or more) sub-pixel 021 has a second portion (e.g., Vinit3-2) extending along the second direction X2, and the second portions of the signal line coupled to different sub-pixels 021 are spaced from each other in the first direction X1, that is, not communicated with each other. Moreover, the first portion and the second portion are coupled to each other. For a signal line coupled to a sub-pixel 021 without the second portion, the first portion of the signal line is in communication with the first portion of the signal line coupled to another sub-pixel 021 so as to be coupled to the second portion of the signal line coupled to another sub-pixel 021 having the second portion. That is, in the embodiments of the present disclosure, each mesh-shaped signal line includes a second portion, and the plurality of sub-pixels 021 share the second portion. Alternatively, each mesh-shaped signal line includes a plurality of second portions, and the plurality of sub-pixels 021 are in one-to-one correspondence to the plurality of second portions. For at least part of the mesh-shaped signal lines, the first portion and the second portion of each of the signal lines are disposed in different layers. Correspondingly, for other mesh-shaped signal lines except the at least part of the mesh-shaped signal lines, the first portion and the second portion of each of the signal lines are disposed in the same layer.

For other signal lines except the mesh-shaped signal lines, each of the signal lines extends along the first direction X1 or the second direction X2. For example, the second power line VSS shown in FIG. 3 extends along the second direction X2.

The first direction X1 and the second direction X2 intersect. For example, in FIG. 3, the first direction X1 and the second direction X2 are perpendicular to each other. On the basis that the plurality of pixels 02 are arranged in an array, the first direction X1 is the pixel row direction, and the second direction X2 is the pixel column direction.

In some embodiments of the present disclosure, each pixel 02 includes at least three sub-pixels 021.

Figure 6:
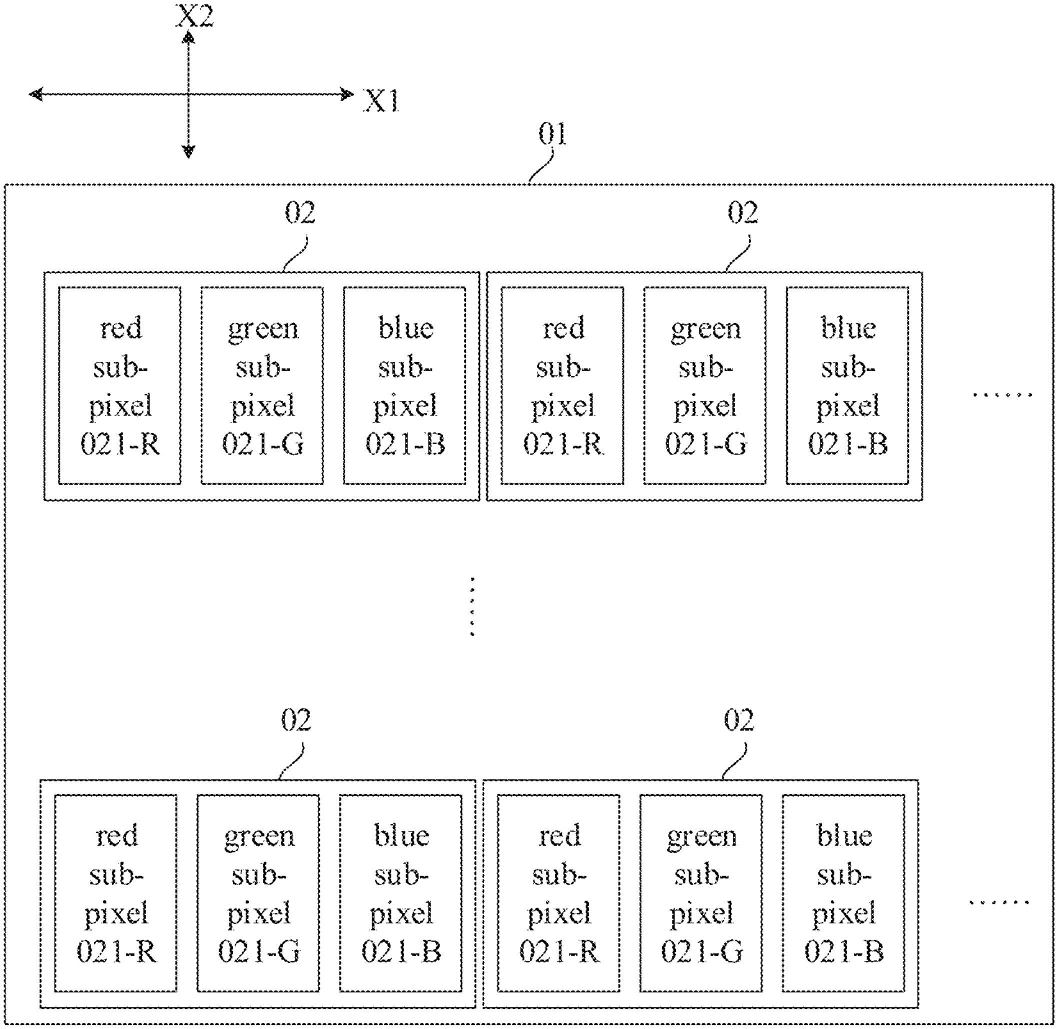
FIG. 6 is a schematic structural diagram of another display panel according to some embodiments of the present disclosure.

For example, referring to FIG. 6, each pixel 02 described in the embodiments of the present disclosure includes three sub-pixels 021. In some embodiments, the three sub-pixels 021 in each pixel 02 include a red (R) sub-pixel 021R, a green (G) sub-pixel 021G and a blue (B) sub-pixel 021B. That is, each pixel 02 has an RGB pixel structure, which is also referred to as a real RGB pixel structure.

Figure 7:
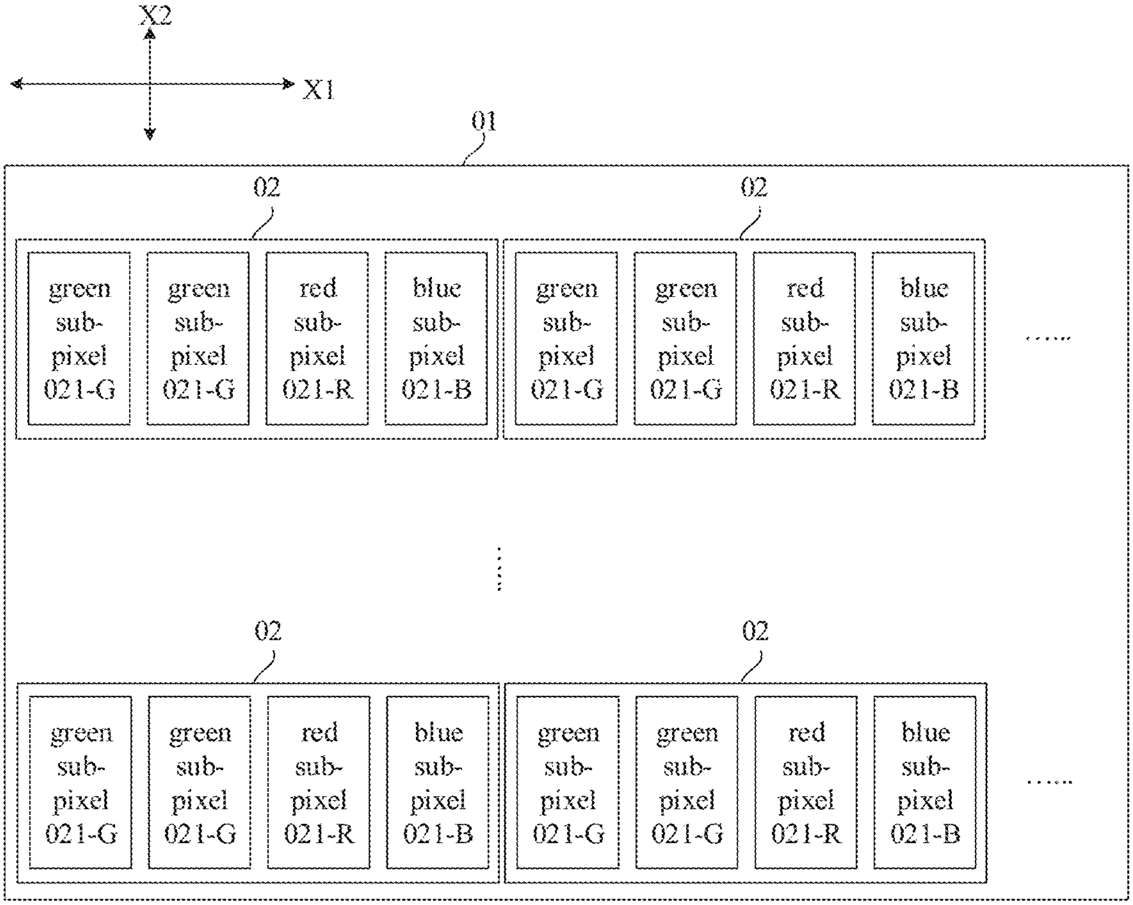
FIG. 7 is a schematic structural diagram of still another display panel according to some embodiments of the present disclosure.

For another example, referring to FIG. 7, each pixel 02 described in the embodiments of the present disclosure includes four sub-pixels 021. In some embodiments, the four sub-pixels 021 in each pixel 02 include one red sub-pixel 021R, two green sub-pixels 021G and one blue sub-pixel 021B. That is, each pixel 02 has a GGRB pixel structure, which is also referred to as an RGBG pixel structure.

In some embodiments, the real RGB pixel structure and the GGRB pixel structure are commonly applicable to large-size display panels, or wearable display products, or mobile display products. In addition, the real RGB pixel structure and the GGRB pixel structure are also applicable to some special display products with a via hole therein, e.g., a mobile phone with a hole in the middle of the screen.

In some embodiments, at least two of the first initialization line Vinit1, the second initialization line Vinit2 and the third initialization line Vinit3 are mesh-shaped.

For example, each of the first initialization line Vinit1, the second initialization line Vinit2 and the third initialization line Vinit3 is set to be mesh-shaped, that is, all of the first initialization line Vinit1, the second initialization line Vinit2 and the third initialization line Vinit3 are set to be mesh-shaped. In this way, the stability of the first initialization signal provided by the first initialization line Vinit1 can be improved, thereby reliably resetting the second node N2 and the third node N3; the stability of the second initialization signal provided by the second initialization line Vinit2 can be improved, thereby reliably resetting the anode of the light-emitting element L1; and the stability of the third initialization signal provided by the third initialization line Vinit3 can be improved, thereby reliably resetting the first node N1.

Alternatively, considering that it's more important to reset the anode of the light-emitting element L1 and the first node N1 than reset the second node N2, the second initialization line Vinit2 and the third initialization line Vinit3 of the three initialization lines are set to be mesh-shaped, which can simplify the structure and save costs.

In an optional implementation, for each of the at least two mesh-shaped initialization lines, the initialization line coupled to one of the at least three sub-pixels 021 has the second portion. That is, the initialization line coupled to only one of the at least three sub-pixels 021 has the second portion.

Figure 8:
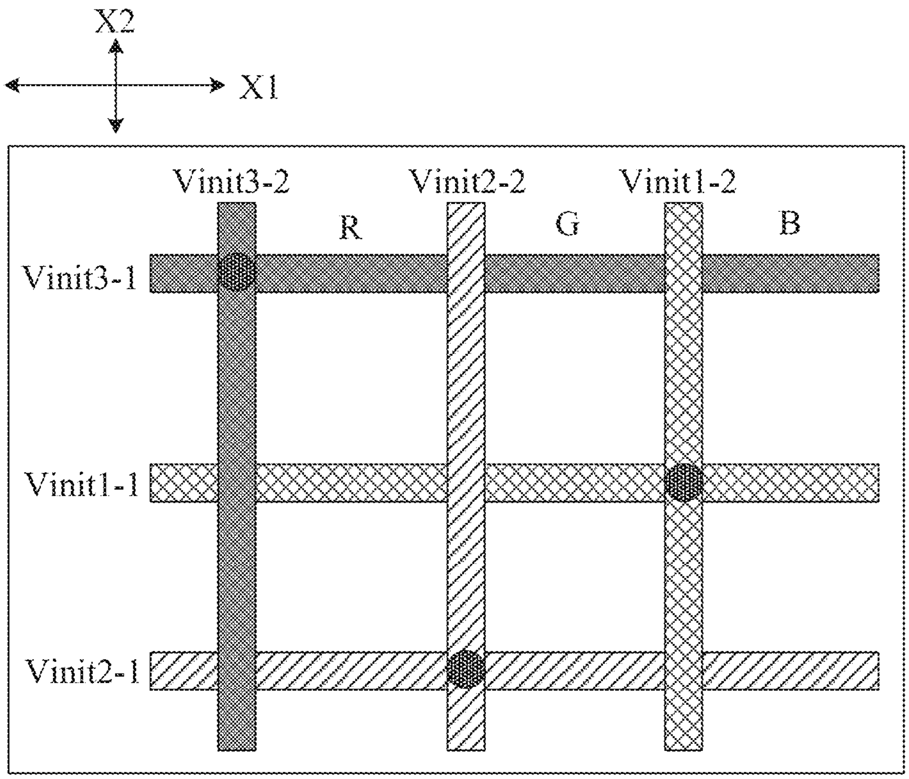
FIG. 8 is a schematic layout diagram of signal lines in a display panel according to some embodiments of the present disclosure.

For example, taking an example where the first initialization line Vinit1, the second initialization line Vinit2 and the third initialization line Vinit3 are all mesh-shaped, and each pixel 02 includes three sub-pixels 021 (R, G, and B) as shown in FIG. 6, referring to FIG. 8, in the three sub-pixels 021, the first initialization line Vinit1 coupled to only one sub-pixel 021 has the second portion Vinit1-2, the second initialization line Vinit2 coupled to only one sub-pixel 021 has the second portion Vinit2-2, and the third initialization line Vinit3 coupled to only one sub-pixel 021 has the second portion Vinit3-2.

Figure 9:
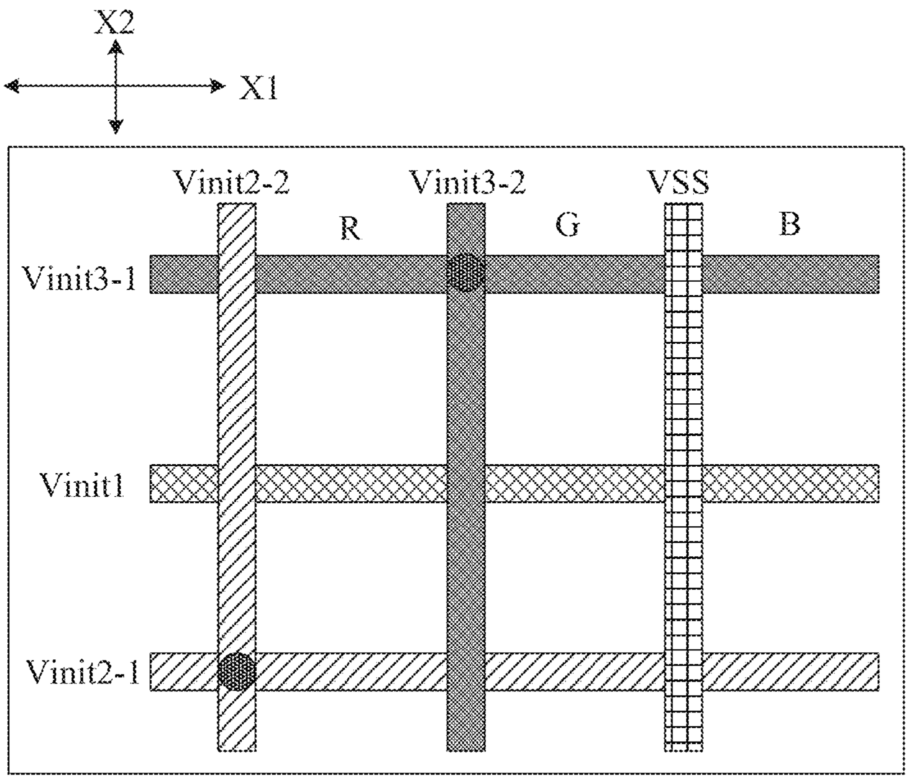
FIG. 9 is a schematic layout diagram of signal lines in another display panel according to some embodiments of the present disclosure.

For another example, taking an example where the second initialization line Vinit2 and the third initialization line Vinit3 are mesh-shaped, and each pixel 02 includes three sub-pixels 021 (R, G, and B) as shown in FIG. 6, referring to FIG. 9, in the three sub-pixels 021, the second initialization line Vinit2 coupled to only one sub-pixel 021 has the second portion Vinit2-2, and the third initialization line Vinit3 coupled to only one sub-pixel 021 has the second portion Vinit3-2.

Based on this implementation, different sub-pixels 021 are coupled to different initialization lines having the second portion, which can facilitate the wiring in the space, simplify the structure, and save the wiring costs.

For example, still referring to FIG. 8, the initialization lines having the second portion coupled to the three sub-pixels 021 are the first initialization line Vinit1, the second initialization line Vinit2 and the third initialization line Vinit3, respectively. That is, it can be considered that the second portion of the first initialization line Vinit1, the second portion of the second initialization line Vinit2 and the second portion of the third initialization line Vinit3 are in one-to-one correspondence with the three sub-pixels 021. This design approach is referred to as a simultaneous Vinit1, Vinit2 and Vinit3 mesh design.

Alternatively, referring to FIG. 9, in the three sub-pixels 021, the initialization line having the second portion coupled to the first sub-pixel R is the second initialization line Vinit2, and the initialization line having the second portion coupled to the second sub-pixel G is the third initialization line Vinit3. In this way, as can be seen from FIG. 3, there is remaining space in the area where the third sub-pixel B is disposed, and correspondingly, the second power line VSS is disposed near the area where the third sub-pixel B is disposed, to implement the VSS in AA design. This design is referred to as: Vinit2 and Vinit3 mesh design, and simultaneous VSS in AA design.

This implementation is applicable to the large-size, medium-size, wearable or mobile display panels described in the foregoing embodiments. In addition, the pixel structure in the display panel is the RGB pixel structure shown in FIG. 6, or the GGRB pixel structure shown in FIG. 7. Certainly, this implementation is also applicable to other types of display panels as long as the space allows.

In some embodiments, in another optional implementation, for each of the at least mesh-shaped two initialization lines, the initialization line coupled to partial sub-pixels 021 of the at least three sub-pixels 021 has the second portion.

The number of the partial sub-pixels is greater than or equal to 1. That is, for each mesh-shaped initialization line, the initialization line coupled to one or more than one sub-pixels 021 has the second portion. In addition, since the initialization line coupled to partial sub-pixels rather than all sub-pixels 021 has the second portion, the number of the partial sub-pixels is less than the number of the sub-pixels 021 included in each pixel 02.

Figure 10:
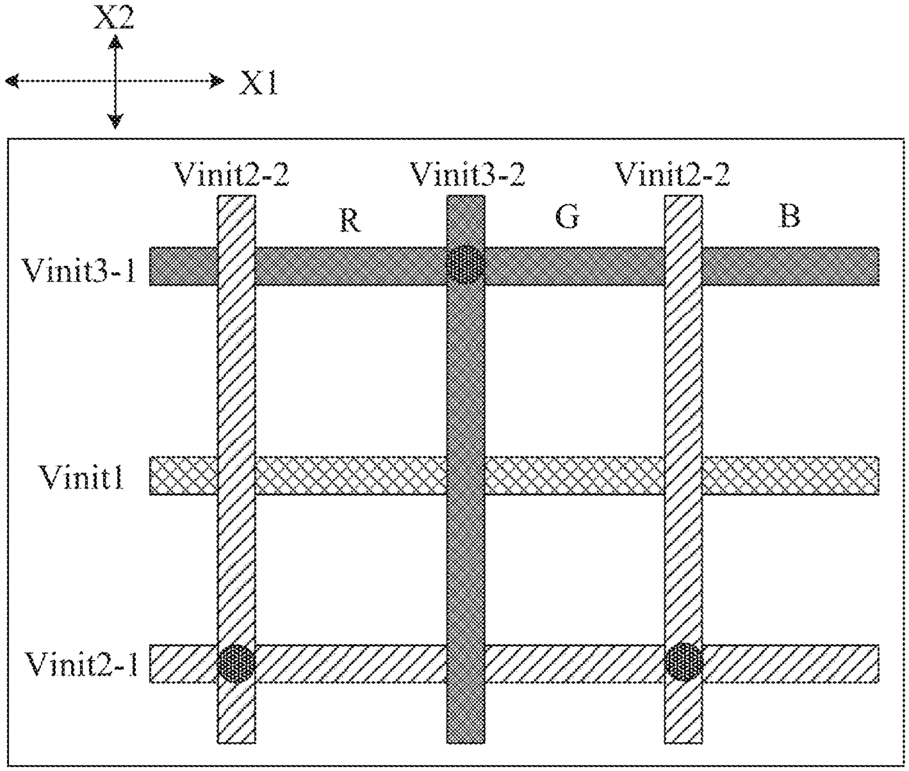
FIG. 10 is a schematic layout diagram of signal lines in still another display panel according to some embodiments of the present disclosure.

For example, taking an example where the second initialization line Vinit2 and the third initialization line Vinit3 are mesh-shaped, and each pixel 02 includes three sub-pixels 021 (R, G, and B) shown in FIG. 6, referring to FIG. 10, in the three sub-pixels 021, the second initialization line Vinit2 coupled to two sub-pixels 021 (R and B) has the second portion Vinit2-2, and the third initialization line Vinit3 coupled to only one sub-pixel (G) has the second portion Vinit3-2. That is, for the second initialization line Vinit2, second initialization line Vinit2 coupled to two sub-pixels 021 has the second portion Vinit2-2; and for the third initialization line Vinit3, the third initialization line Vinit3 coupled to one sub-pixel 021 has the second portion Vinit3-2.

Figure 11:
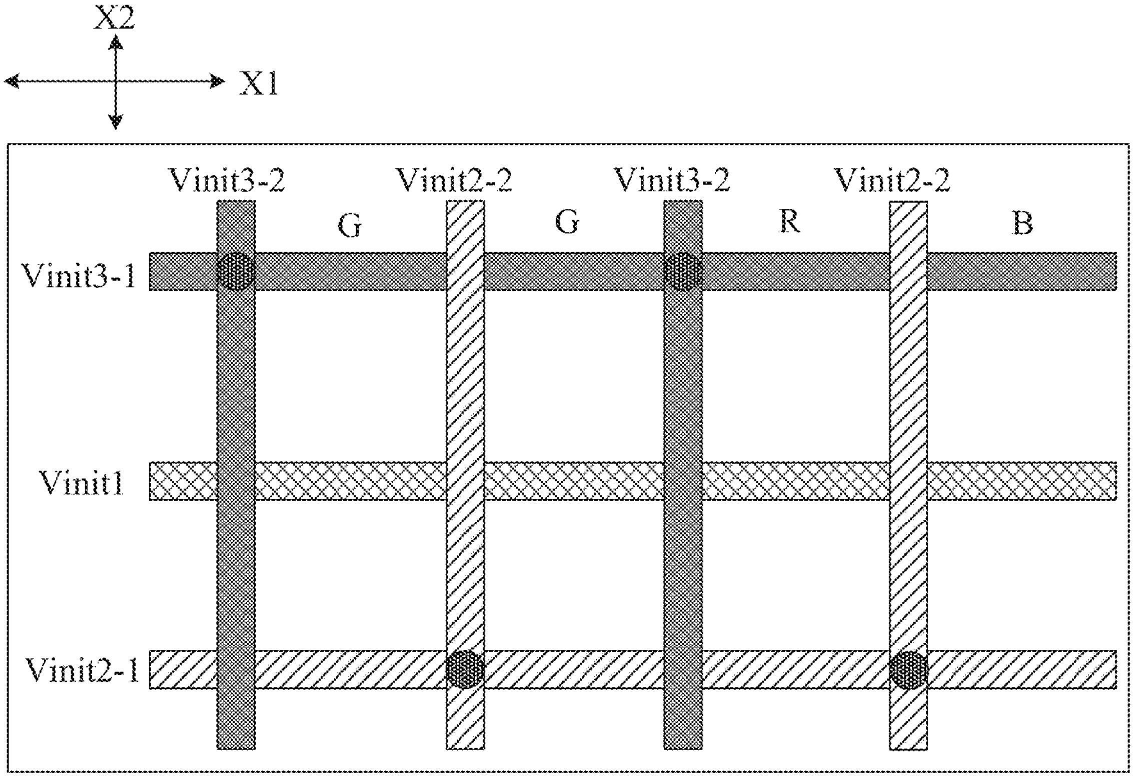
FIG. 11 is a schematic layout diagram of signal lines in still another display panel according to some embodiments of the present disclosure.

For another example, taking an example where the second initialization line Vinit2 and the third initialization line Vinit3 are mesh-shaped, and each pixel 02 includes four sub-pixels 021 (G, G, R, and B) shown in FIG. 7, referring to FIG. 11, in the four sub-pixels 021, the second initialization line Vinit2 coupled to two sub-pixels 021 (one G and B) has the second portion Vinit2-2, and the third initialization lines Vinit3 coupled to two sub-pixels 021 (the other G and R) has the second portion Vinit3-2. That is, for the second initialization line Vinit2, the second initialization line Vinit2 coupled to two sub-pixels 021 has the second portion Vinit2-2; and for the third initialization line Vinit3, the third initialization line Vinit3 coupled to two sub-pixels 021 has the second portion Vinit3-2.

The partial sub-pixels 021 described in the foregoing embodiments are sub-pixels 021 that are not adjacent in the first direction X1, and two sub-pixels 021 adjacent in the first direction X1 are coupled to different initialization lines having the second portion, which can facilitate the layout and avoid signal crosstalk.

For example, still referring to FIG. 10, the second initialization line Vinit2 coupled to the first sub-pixel R and the third sub-pixel B which are not adjacent has the second portion Vinit2-2. Accordingly, the initialization lines having the second portion coupled to the first sub-pixel R and second sub-pixel G which are adjacent are the second initialization line Vinit2 and the third initialization line Vinit3, respectively, and the initialization lines having the second portion coupled to the second sub-pixel G and third sub-pixel B which are adjacent are the third initialization line Vinit3 and the second initialization line Vinit2, respectively. This design is referred to as Vinit2, Vinit3 and Vinit2 mesh design.

Alternatively, still referring to FIG. 11, the third initialization line Vinit3 coupled to the first sub-pixel G and the third sub-pixel R which are not adjacent has the second portion Vinit3-2, and the second initialization line Vinit2 coupled to the second sub-pixel G and the fourth sub-pixel B which are not adjacent has the second portion Vinit2-2.

Accordingly, the initialization lines having the second portion coupled to the first sub-pixel G and second sub-pixel G which are adjacent are the third initialization line Vinit3 and the second initialization line Vinit2, respectively; the initialization lines having the second portion coupled to the second sub-pixel G and third sub-pixel R which are adjacent are the second initialization line Vinit2 and the third initialization line Vinit3, respectively; and the initialization lines having the second portion coupled to the third sub-pixel R and fourth sub-pixel B which are adjacent are the third initialization line Vinit3 and the second initialization line Vinit2, respectively. This design approach is referred to as Vinit2, Vinit3, Vinit2 and Vinit3 mesh design.

This implementation is applicable to display panels having the special structure described in the foregoing embodiments, for example, a mobile phone with a hole in the middle of the screen. Certainly, it is also applicable to other types of display panels as long as the space allows.

In some embodiments, in still another optional implementation, for one part of the at least two mesh-shaped initialization lines, the initialization line coupled to each sub-pixel 021 of the at least three sub-pixels 021 has the second portion, and for the other part of the at least two mesh-shaped initialization lines except the one part of the at least two mesh-shaped initialization lines, the initialization line coupled to partial sub-pixels 021 of the at least three sub-pixels 021 has the second portion.

In addition, as described in the foregoing embodiments, the number of the partial sub-pixels 021 is greater than or equal to 1, and the partial sub-pixels 021 are sub-pixels 021 that are not adjacent in the first direction X1.

Figure 12:
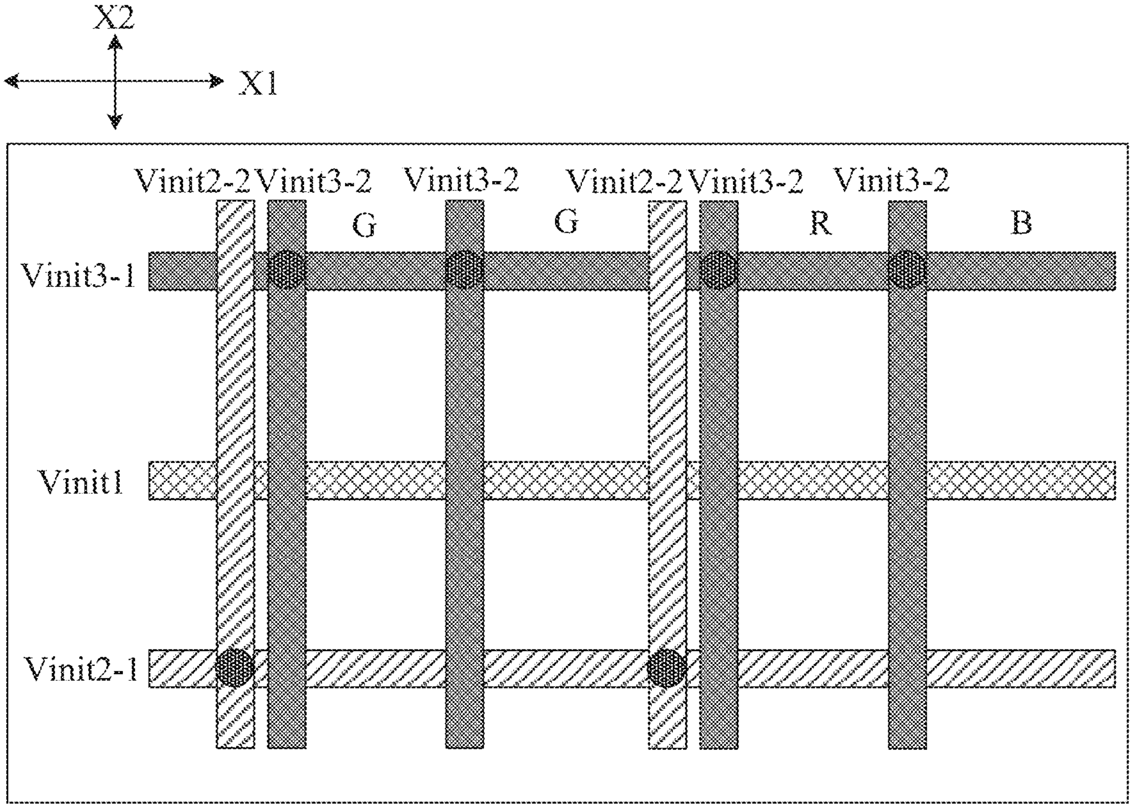
FIG. 12 is a schematic layout diagram of signal lines in still another display panel according to some embodiments of the present disclosure.

For example, taking an example where the second initialization line Vinit2 and the third initialization line Vinit3 are mesh-shaped, and each pixel 02 includes four sub-pixels 021 (G, G, R, and B) shown in FIG. 7 as an example, referring to FIG. 12, the third initialization line Vinit3 coupled to the four sub-pixels has the second portion Vinit3-2, and the second initialization line Vinit2 coupled to only two sub-pixels (one G and R) has the second portion Vinit2-2. That is, for the third initialization line Vinit3, the third initialization line Vinit3 coupled to each of the four sub-pixels 021 has the second portion Vinit3-2; and for the second initialization line Vinit2, the second initialization line Vinit2 coupled to only two of the four sub-pixels 021 has the second portion Vinit2-2, and the second initialization line Vinit2 coupled to the first sub-pixel G and the third sub-pixel R which are not adjacent has the second portion Vinit2-2. This design is referred to as Vinit32, Vinit3, Vinit32 and Vinit3 mesh design.

This implementation is applicable to display panels having the GGRB pixel structure described in the foregoing embodiments. Certainly, it is also applicable to other types of display panels as long as the space allows.

It should be noted that, in FIG. 8 to FIG. 12, the first portion of the first initialization line Vinit1 is marked with Vinit1-1, the first portion of the second initialization line Vinit2 is marked with Vinit2-1, and the first portion of the third initialization line Vinit3 is marked with Vinit3-1.

In some embodiments, the pixel 02 in the display panel includes a plurality of metal layers sequentially stacked in a direction going away from the substrate 01. Here, it means that the pixel circuit P1 in the pixel 02 includes a plurality of metal layers.

For the at least part of the mesh-shaped signal lines, a first portion of each of the signal lines is disposed in the same layer as one metal layer of the plurality of metal layers, and the second portion of each of the signal lines is disposed in the same layer as another metal layer of the plurality of metal layers. Each of the other signal lines is disposed in the same layer as any metal layer of the plurality of metal layers. As described in the foregoing embodiments, for the other mesh-shaped signal lines except the at least part of the mesh-shaped signal lines, the first portion and the second portion are both disposed in the same layer as the same metal layer of the plurality of metal layers.

It should be noted that "being disposed in the same layer" refers to that film layers for forming a specific pattern are formed by the same film forming process, and then the film layers are patterned by one patterning process using the same mask to form a layer structure. According to different specific patterns, the one patterning process includes multiple exposure, development, or etching processes, and the specific pattern in the formed layer structure is continuous or discontinuous. That is, the plurality of elements, components, structures and/or portions disposed in the same layer are made from the same material, and are formed by the same patterning process. In this way, the manufacturing process can be simplified, the manufacturing cost can be reduced, and the manufacturing efficiency can be increased.

Figure 13:
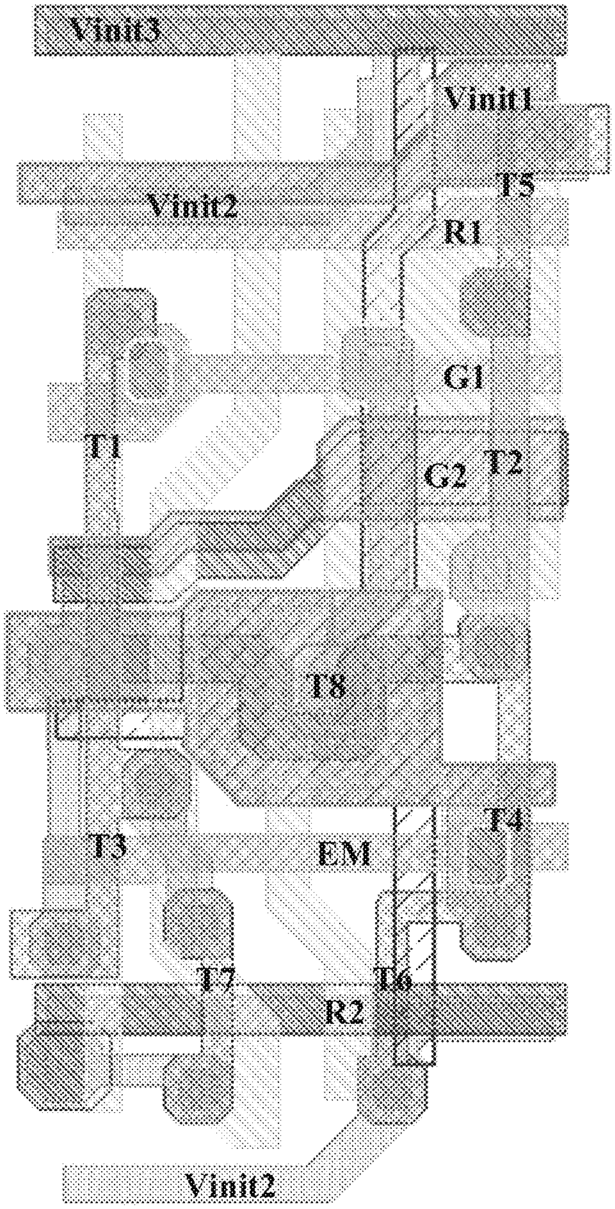
FIG. 13 is a schematic diagram of a layout shown on the basis of the structure shown in FIG. 4.
Figure 14:
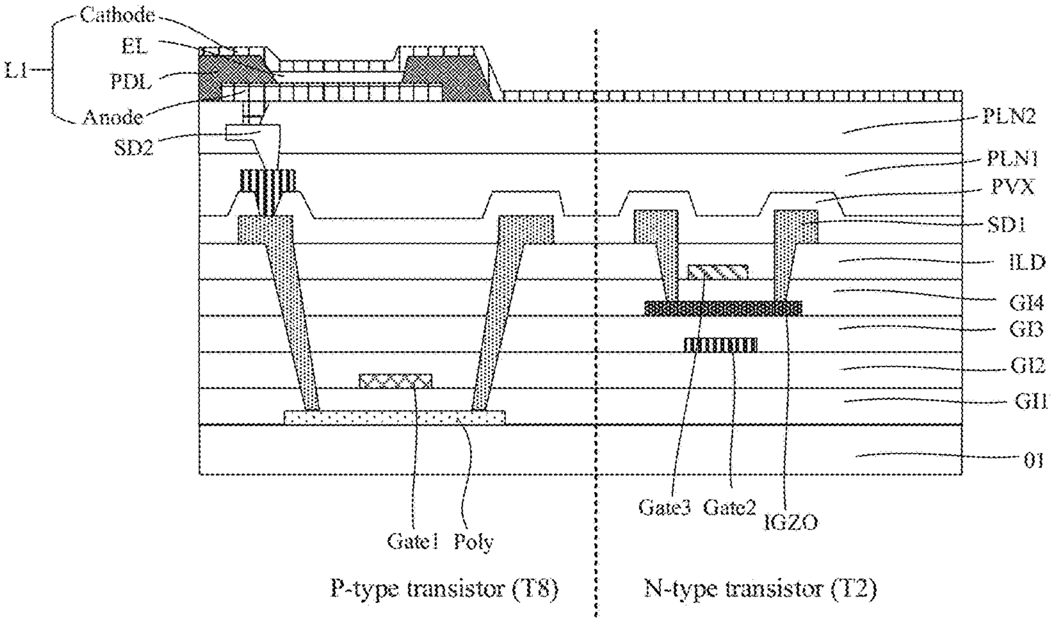
FIG. 14 is a cross-sectional view of a pixel according to some embodiments of the present disclosure.

In some embodiments, taking the structure shown in FIG. 4 as an example, referring to the structural layout shown in FIG. 13 and the cross-sectional view shown in FIG. 14, the plurality of metal layers in the pixel circuit P1 include a first gate metal layer Gate1, a second gate metal layer Gate2, a third gate metal layer Gate3, a first source-drain metal layer SD1 and a second source-drain metal layer SD2 that are sequentially stacked in the direction going away from the substrate 01.

The second gate metal layer Gate2 and the third gate metal layer Gate3 are used as the gate of the N-type oxide transistor T2, and the first gate metal layer Gate1 is used as the gate of the P-type LTPS transistor T8. The first source-drain metal layer SD1 is used as the source and the drain of each transistor. The second source-drain metal layer SD2 is coupled to the anode Anode of the light-emitting element L1, and is coupled to the first source-drain metal layer SD1 by an electrical connection line, so as to indirectly lap the first source-drain metal layer SD1 with the anode Anode of the light-emitting element L1.

In addition, as can be seen from FIG. 14, the pixel circuit P1 further includes an active layer. The active layer of the P-type transistor is marked with Poly, and the active layer of the N-type transistor is marked with IGZO. Indium gallium zinc oxide (IGZO) is an oxide material, and certainly, the oxide material is not limited to IGZO. The first source-drain metal layer SD1 is lapped with the active layer. An insulator layer is provided between every two adjacent film layers to insulate the two film layers from each other, thereby avoiding mutual interference.

For example, referring to FIG. 14, the insulator layer includes a first gate insulator (GI) layer GI1 disposed between the active layer Poly and the first gate metal layer Gate1, a second gate insulator layer GI2 disposed between the first gate metal layer Gate1 and the second gate metal layer Gate2, a third gate insulator layer GI3 disposed between the second gate metal layer Gate2 and the active layer IGZO, a fourth gate insulator layer GI4 disposed between the active layer IGZO and the third gate metal layer Gate3, an interlayer dielectric (ILD) layer disposed between the third gate metal layer Gate3 and the first source-drain metal layer SD1, and a passivation layer (PVX) and a first planarization layer (PLN) PLN1 that are disposed between the first source-drain metal layer SDT and the second source-drain metal layer SD2 and are sequentially stacked in the direction going away from the substrate 01, and a second planarization layer PLN2 disposed between the second source-drain metal layer SD2 and the anode Anode.

As can be known from the above, the first source-drain metal layer SDT is coupled to the film layer (e.g., the active layer Poly) that needs to be lapped with through a via hole penetrating through a plurality of film layers; the second source-drain metal layer SD2 is lapped with the first source-drain metal layer SDT through a via hole penetrating through the first planarization layer PLN1 and the passivation layer PVX; and the anode Anode is lapped with the second source-drain metal layer SD2 through a via hole penetrating through the second planarization layer PLN2.

Figure 15:
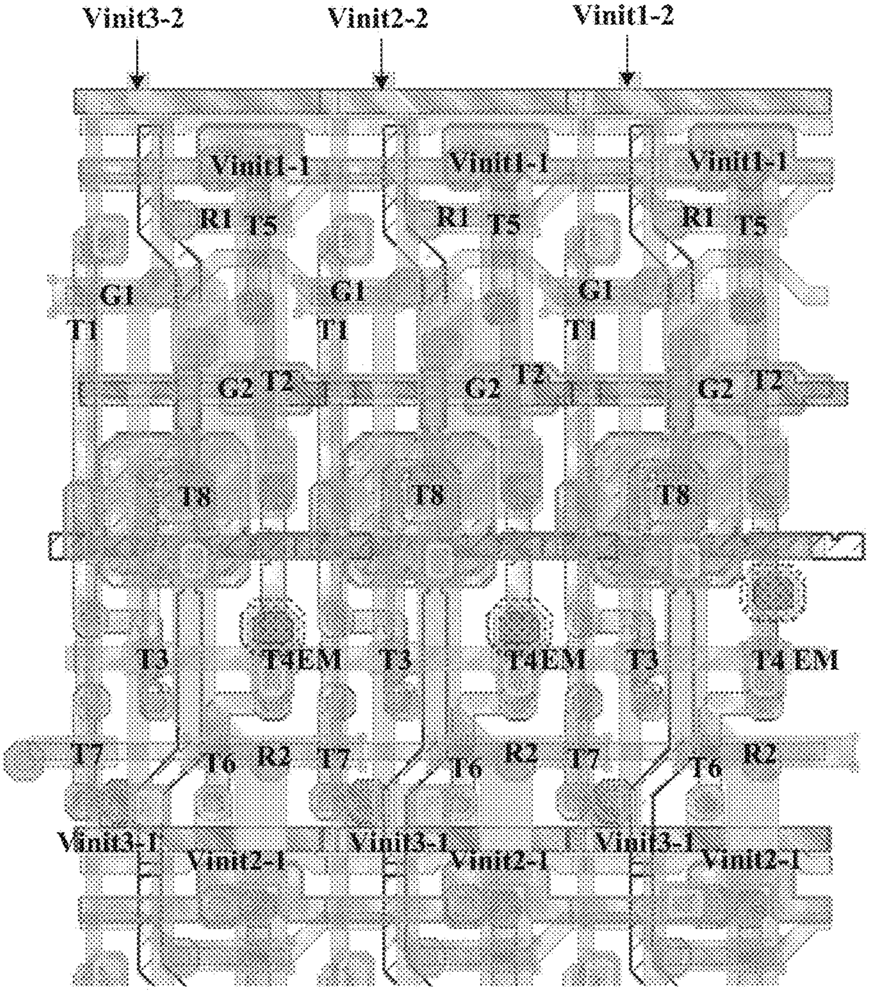
FIG. 15 is a structural layout of a display panel shown on the basis of the structure shown in FIG. 8.

Taking the structure shown in FIG. 8 as an example where Vinit1, Vinit2 and Vinit3 mesh design is adopted, FIG. 15 shows a partial structural layout of a display panel.

Figure 16:
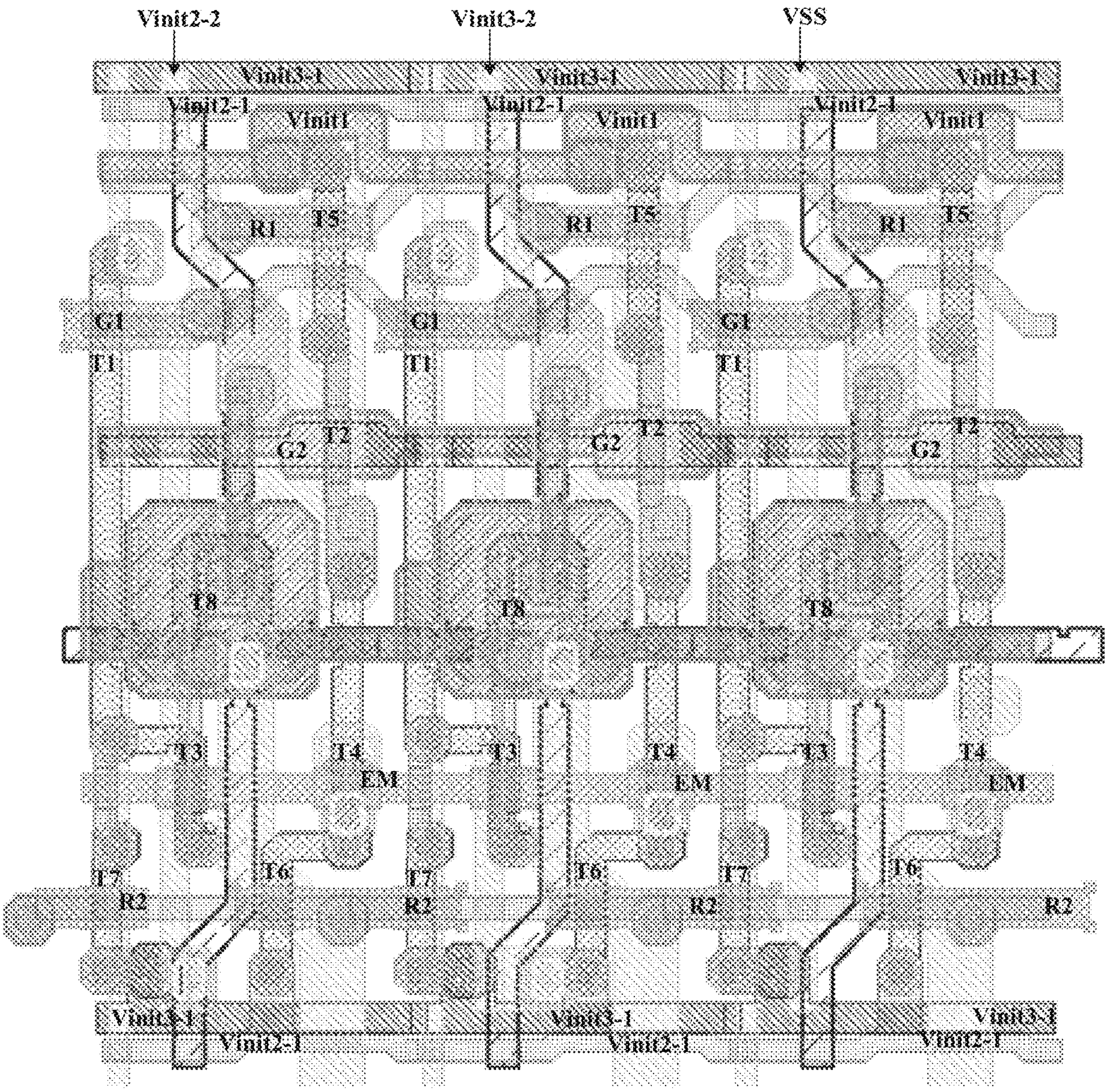
FIG. 16 is a structural layout of a display panel shown on the basis of the structure shown in FIG. 9.

Taking the structure shown in FIG. 9 as an example where Vinit2 and Vinit3 mesh design and VSS in AA design are adopted, FIG. 16 shows a partial structural layout of a display panel.

Figure 17:
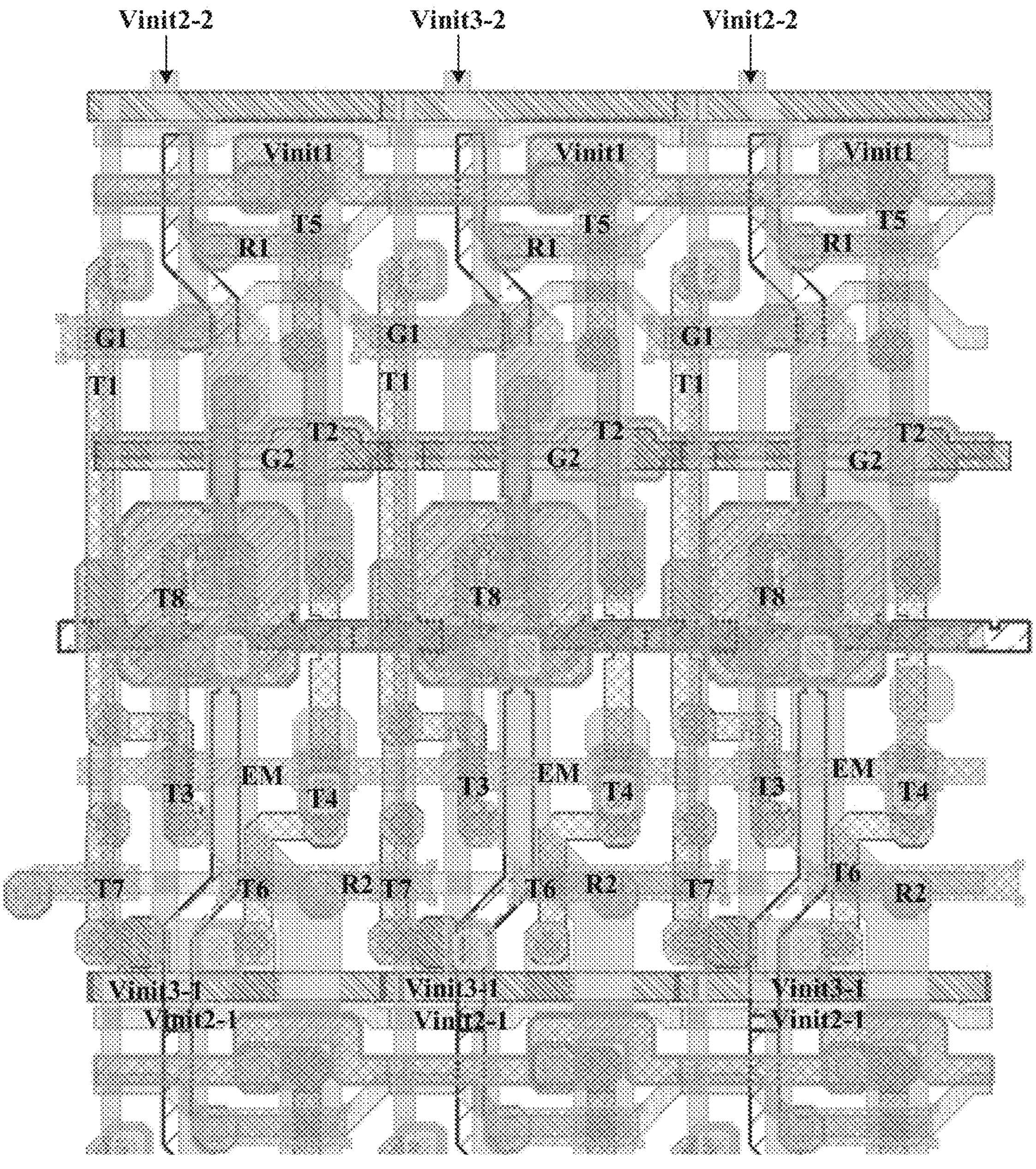
FIG. 17 is a structural layout of a display panel shown on the basis of the structure shown in FIG. 10.

Taking the structure shown in FIG. 10 as an example where Vinit2, Vinit3 and Vinit2 mesh design is adopted, FIG. 17 shows a structural layout of a display panel.

Figure 18:
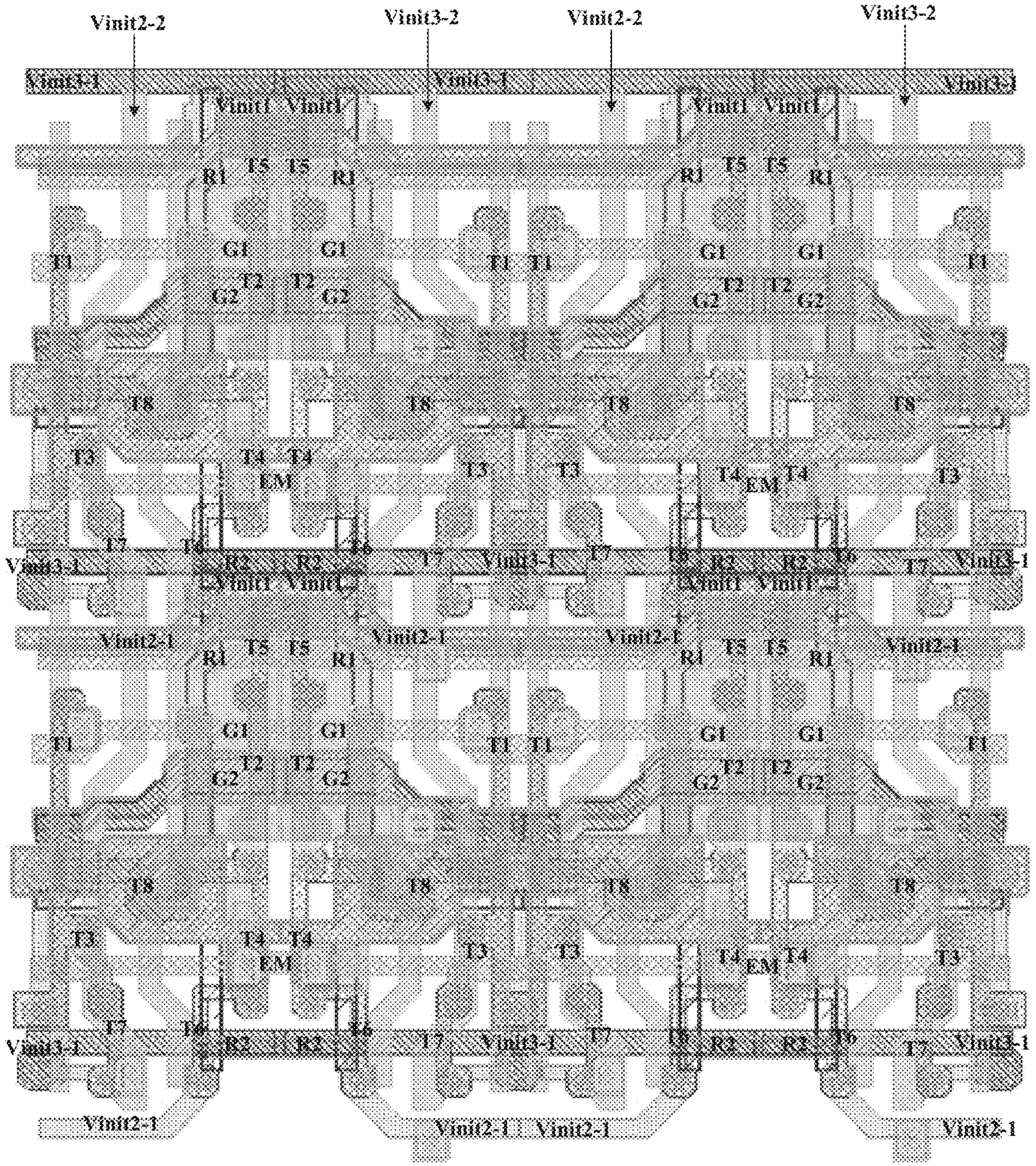
FIG. 18 is a structural layout of a display panel shown on the basis of the structure shown in FIG. 11.

Taking the structure shown in FIG. 11 as an example where Vinit2, Vinit3, Vinit2 and Vinit3 mesh design is adopted, FIG. 18 shows a structural layout of a display panel.

Figure 19:
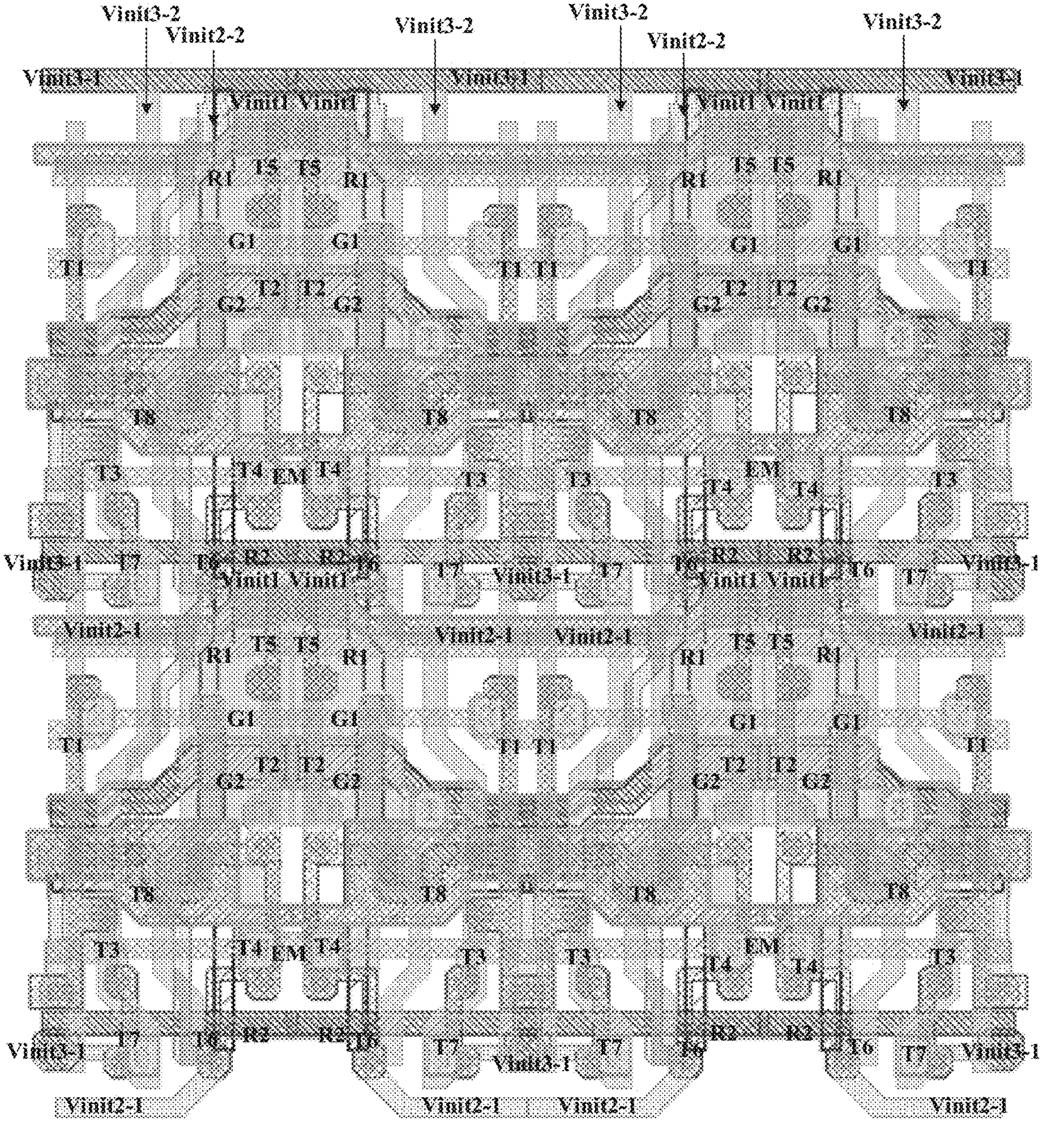
FIG. 19 is a structural layout of a display panel shown on the basis of the structure shown in FIG. 12.

Taking the structure shown in FIG. 12 as an example where Vinit32, Vinit3, Vinit32 and Vinit3 mesh design is adopted, FIG. 19 shows a structural layout of a display panel.

In addition, in order to clearly show each film layer, on the basis of the structure shown in FIG. 16, FIG. 20 to FIG. 32 sequentially show the structural layout of each single layer and the gradually stacked layers.

Figure 20:
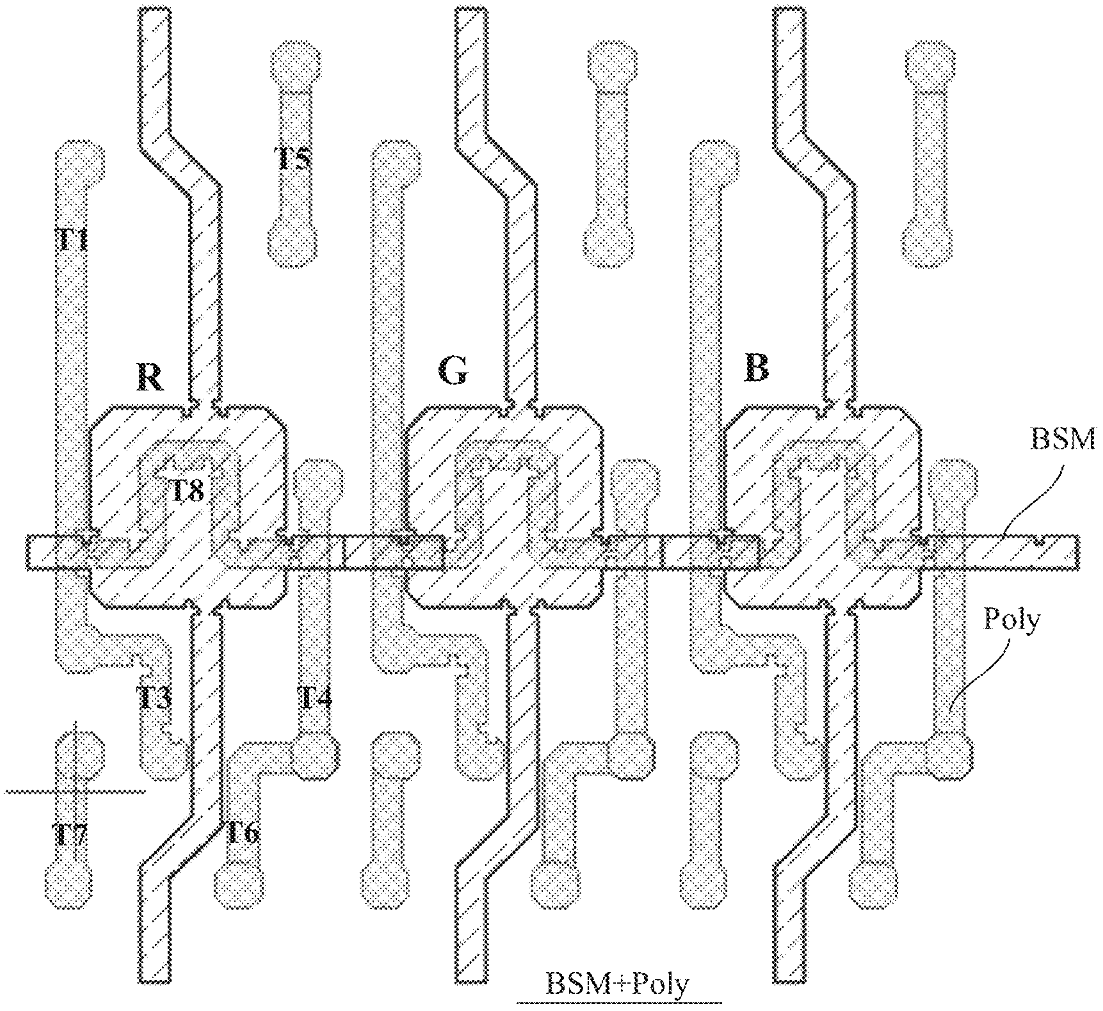
FIG. 20 is a structural layout of a base metal layer and an active layer in a display panel shown on the basis of the structure shown in FIG. 16.

The structural layout shown in FIG. 20 includes an base metal BSM and an active layer Poly, and FIG. 20 further schematically marks the positions of the active layers Poly in the P-type transistors except the N-type transistor (i.e., the second transistor T2), including the first transistor T1, the third transistor T3, the fourth transistor T4, the fifth transistor T5, the sixth transistor T6, the seventh transistor T7 and the eighth transistor T8, and also schematically marks the division of the sub-pixels R, G and B.

Figure 21:
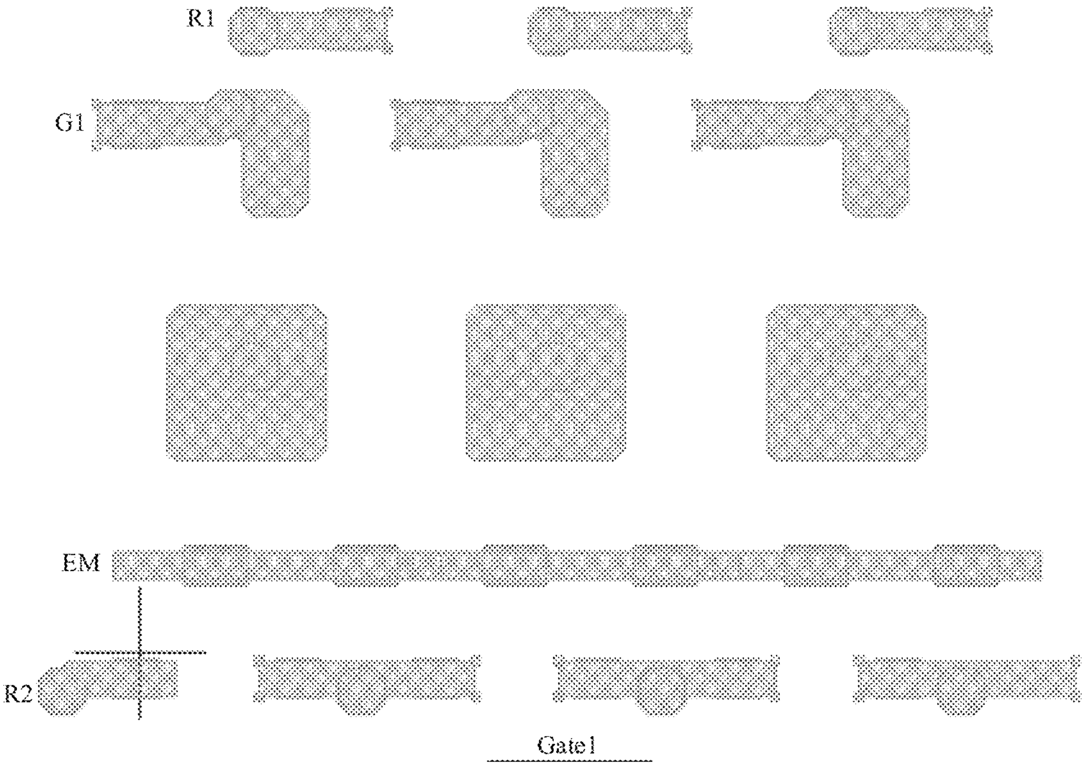
FIG. 21 is a structural layout of a first gate metal layer in a display panel shown on the basis of the structure shown in FIG. 16.

The structural layout shown in FIG. 21 includes a first gate metal layer Gate1.

Figure 22:
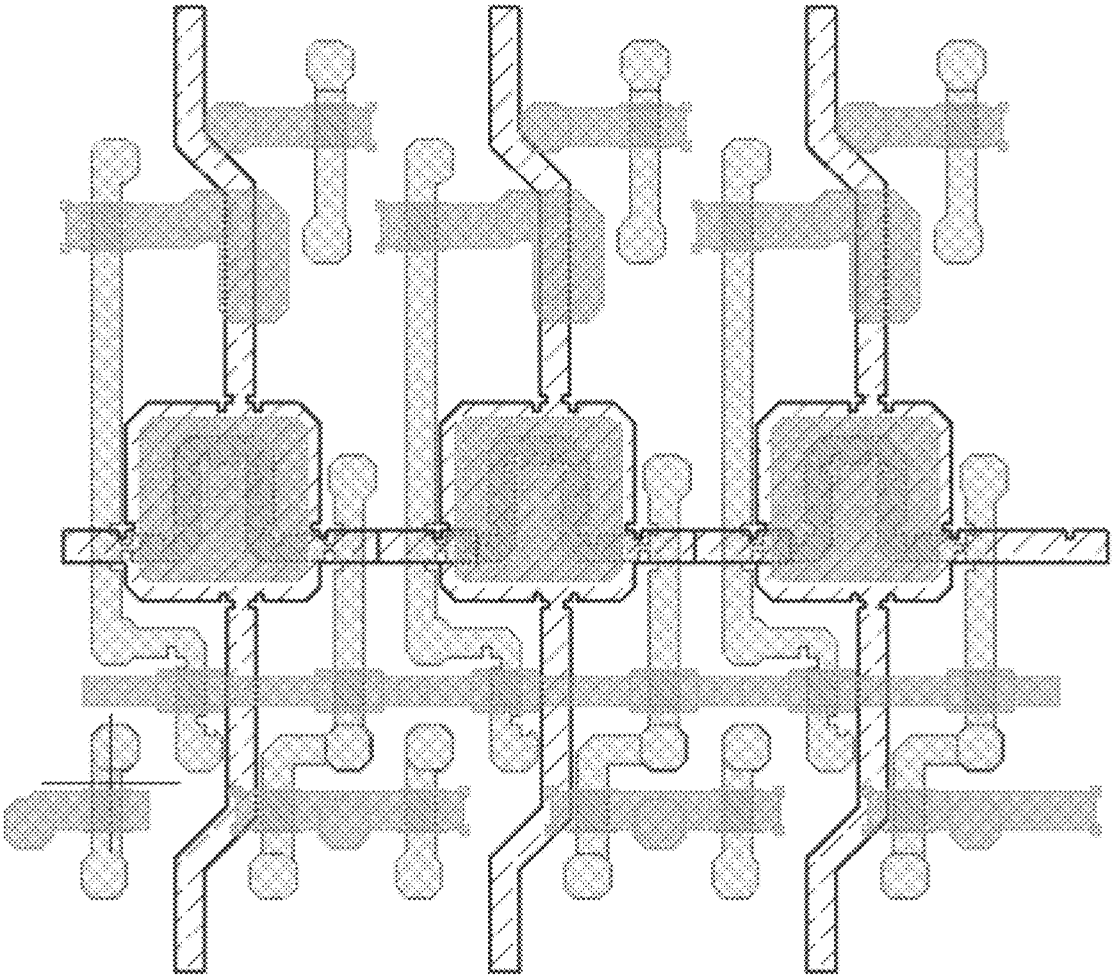
FIG. 22 is a structural layout of a base metal layer, an active layer and a first gate metal layer in a display panel shown on the basis of the structure shown in FIG. 16.

The structural layout shown in FIG. 22 includes the base metal BSM, the active layer Poly and the first gate metal layer Gate1 which are stacked.

Figure 23:
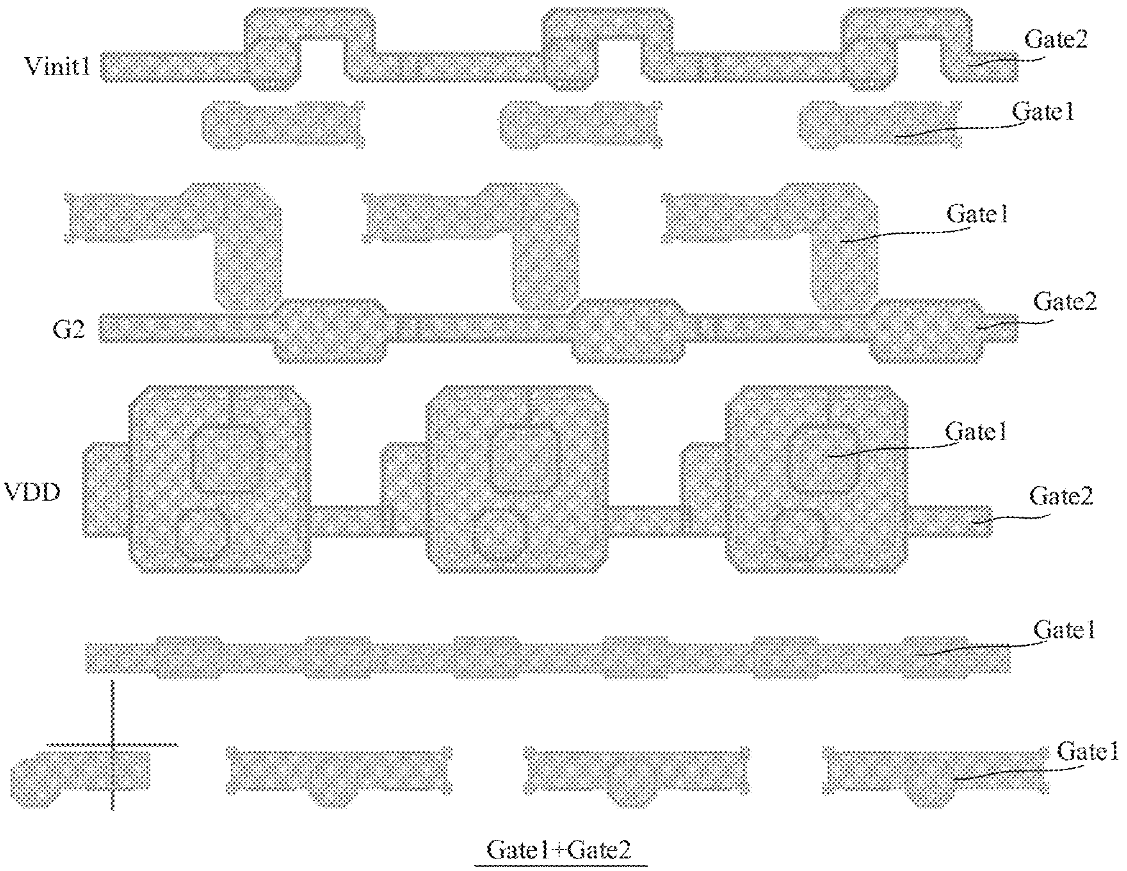
FIG. 23 is a structural layout of a first gate metal layer and a second gate metal layer in a display panel shown on the basis of the structure shown in FIG. 16.

The structural layout shown in FIG. 23 includes a second gate metal layer Gate2.

Figure 24:
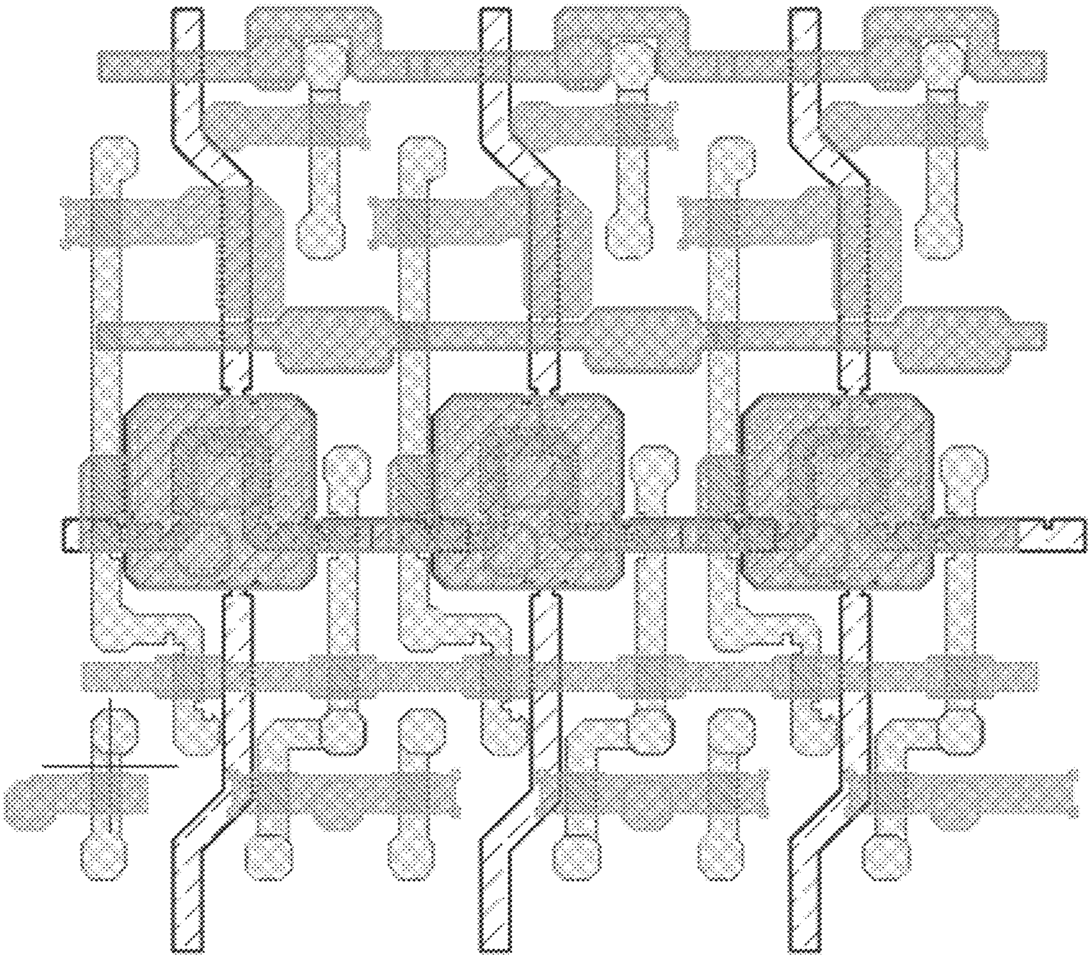
FIG. 24 is a structural layout of a base metal layer, an active layer, a first gate metal layer and a second gate metal layer in a display panel shown on the basis of the structure shown in FIG. 16.

The structural layout shown in FIG. 24 includes the base metal BSM, the active layer Poly, the first gate metal layer Gate1 and the second gate metal layer Gate2 which are stacked.

Figure 25:
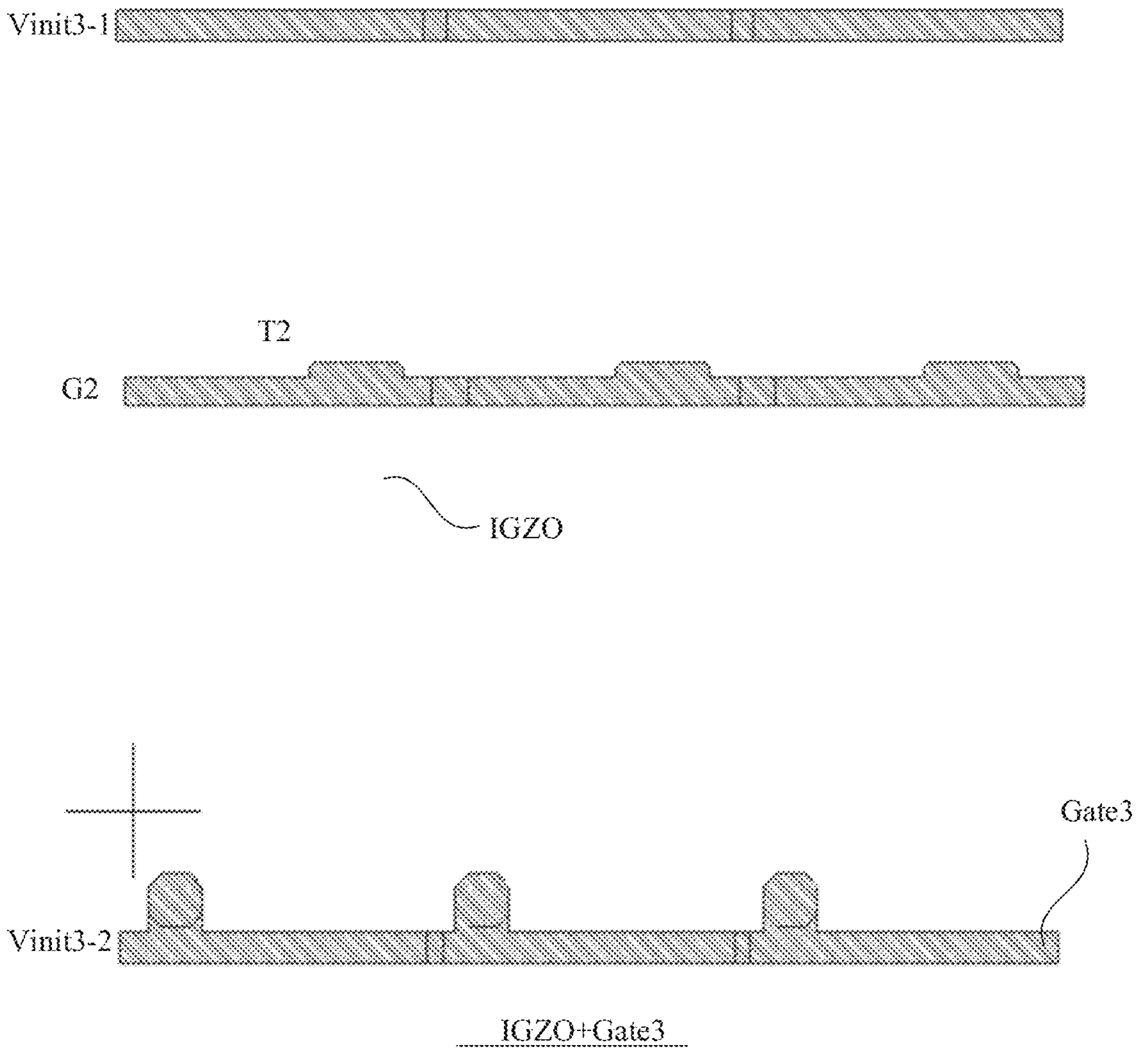
FIG. 25 is a structural layout of an active layer and a third gate metal layer in a display panel shown on the basis of the structure shown in FIG. 16.

The structural layout shown in FIG. 25 includes the active layer IGZO of the N-type transistor, and correspondingly marks the second transistor T2, and the structural layout further includes a third gate metal layer Gate3.

Figure 26:
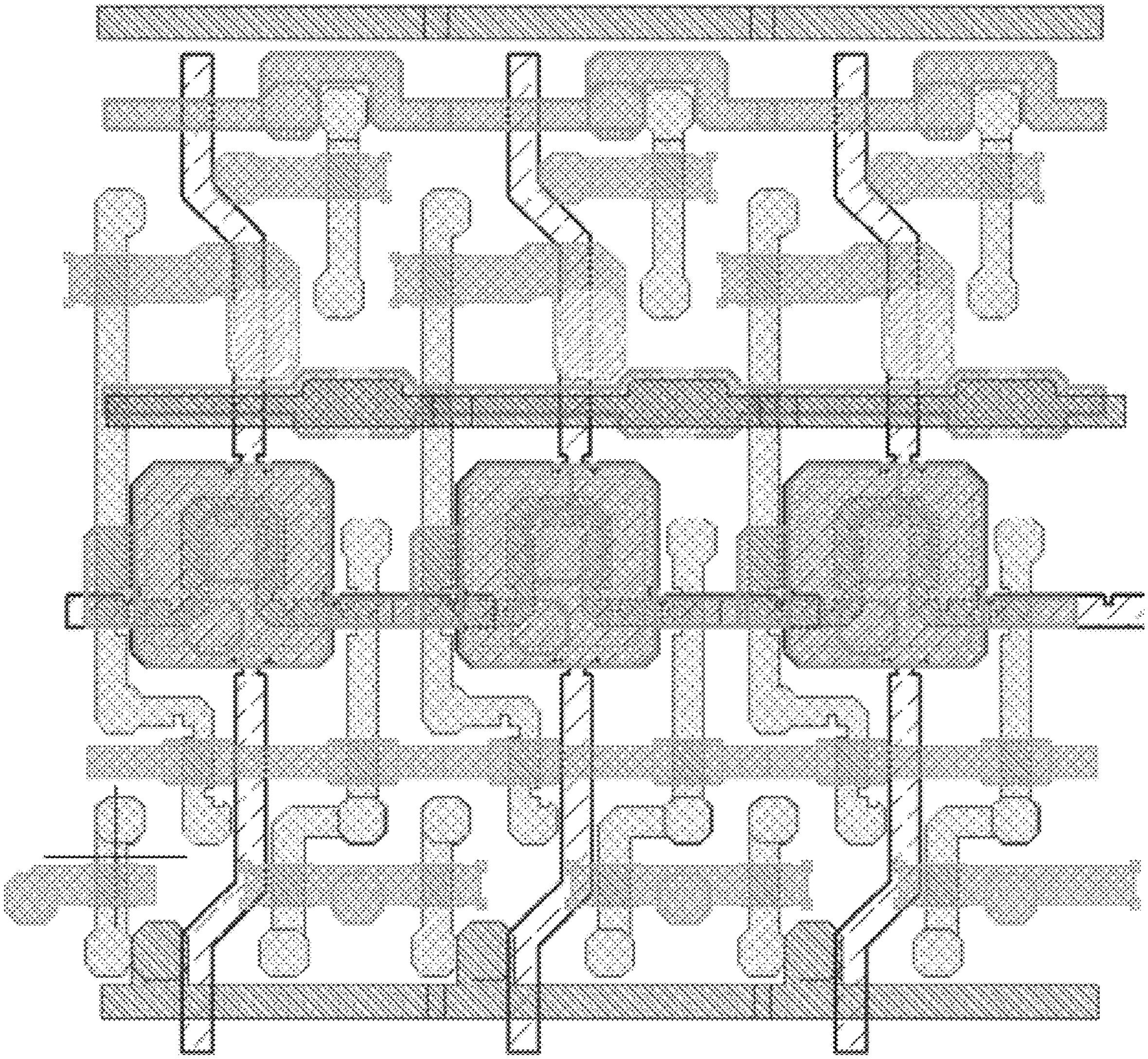
FIG. 26 is a structural layout of a base metal layer, an active layer, a first gate metal layer, a second gate metal layer, an active layer and a third gate metal layer in a display panel shown on the basis of the structure shown in FIG. 16.

The structural layout shown in FIG. 26 includes the base metal BSM, the active layer Poly, the first gate metal layer Gate1, the second gate metal layer Gate2, the active layer IGZO and the third gate metal layer Gate3 which are stacked.

Figure 27:
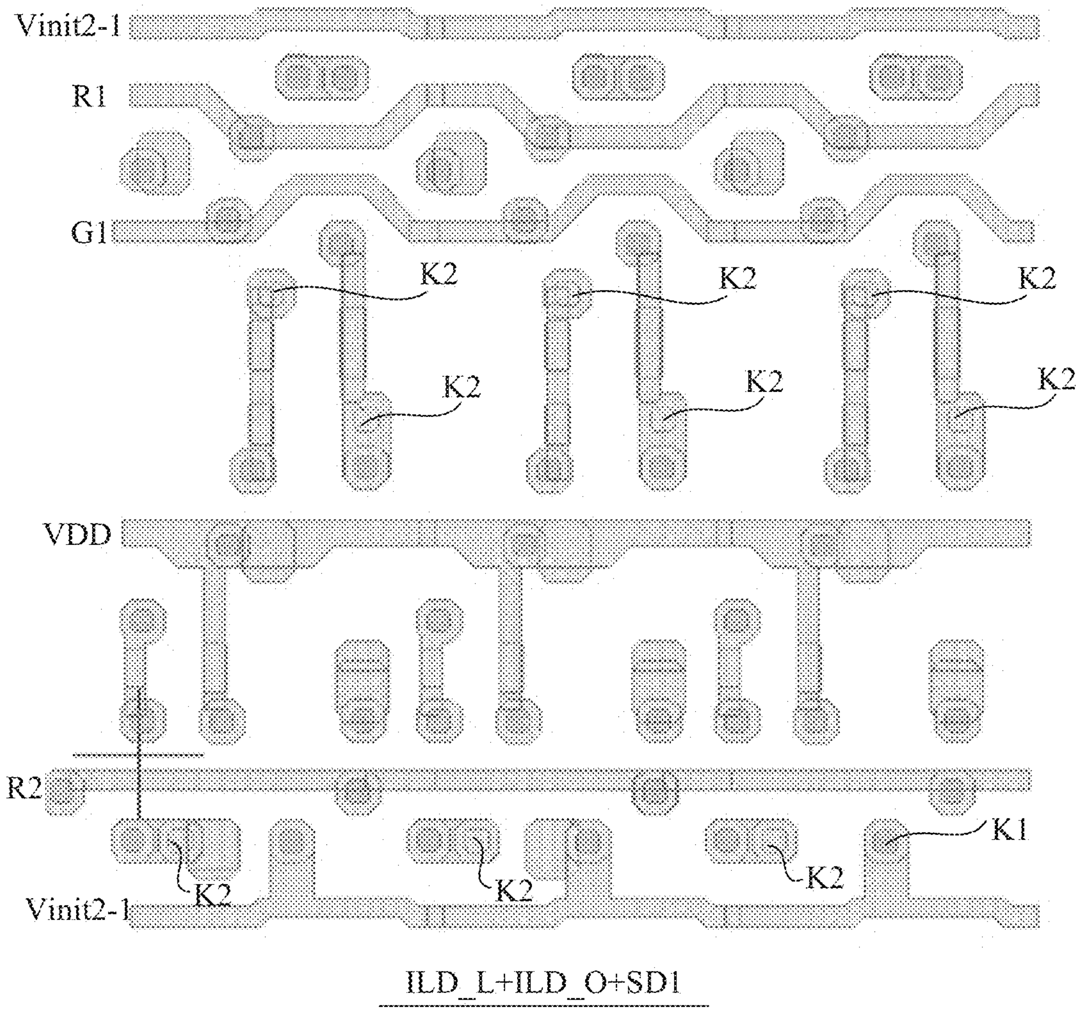
FIG. 27 is a structural layout of an interlayer insulator layer and a first source-drain metal layer in a display panel shown on the basis of the structure shown in FIG. 16.

The structural layout shown in FIG. 27 includes an interlayer insulator layer ILD and a first source-drain metal layer SDT. With reference to FIG. 14, the interlayer insulator layer ILD includes an ILD_L and an ILD_O that are configured to penetrate through different film layers to be lapped with different film layers. The via hole formed by ILD_L is marked with K1, and the via hole formed by ILD_O is marked with K2. FIG. 27 marks all via holes K2, and the remaining via holes which are not marked are via holes K1.

Figure 28:
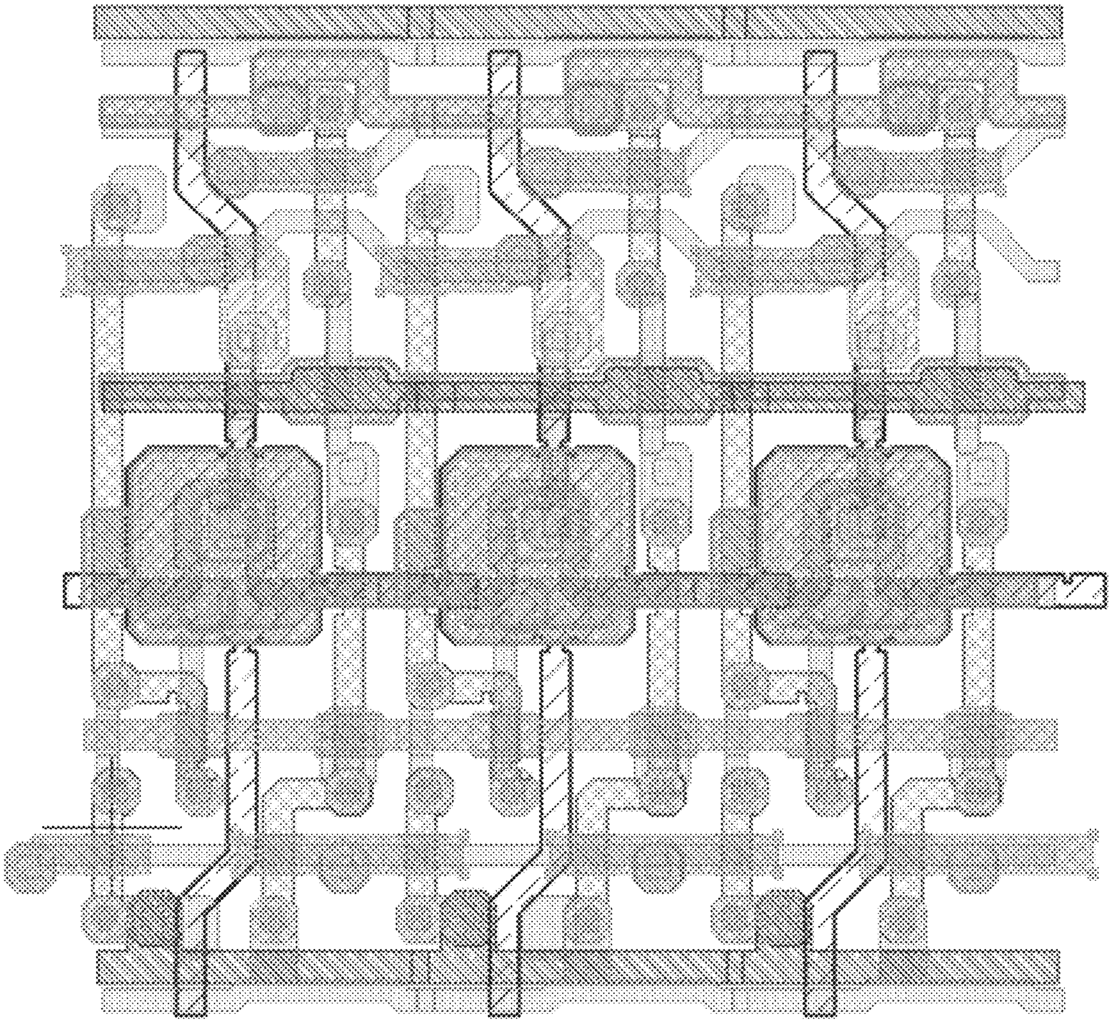
FIG. 28 is a structural layout of a base metal layer, an active layer, a first gate metal layer, a second gate metal layer, an active layer, a third gate metal layer, an interlayer insulator layer and a first source-drain metal layer in a display panel shown on the basis of the structure shown in FIG. 16.

The structural layout shown in FIG. 28 includes the base metal BSM, the active layer Poly, the first gate metal layer Gate1, the second gate metal layer Gate2, the active layer IGZO, the third gate metal layer Gate3, the interlayer insulator layer ILD, and the first source-drain metal layer SD1 which are stacked.

Figure 29:
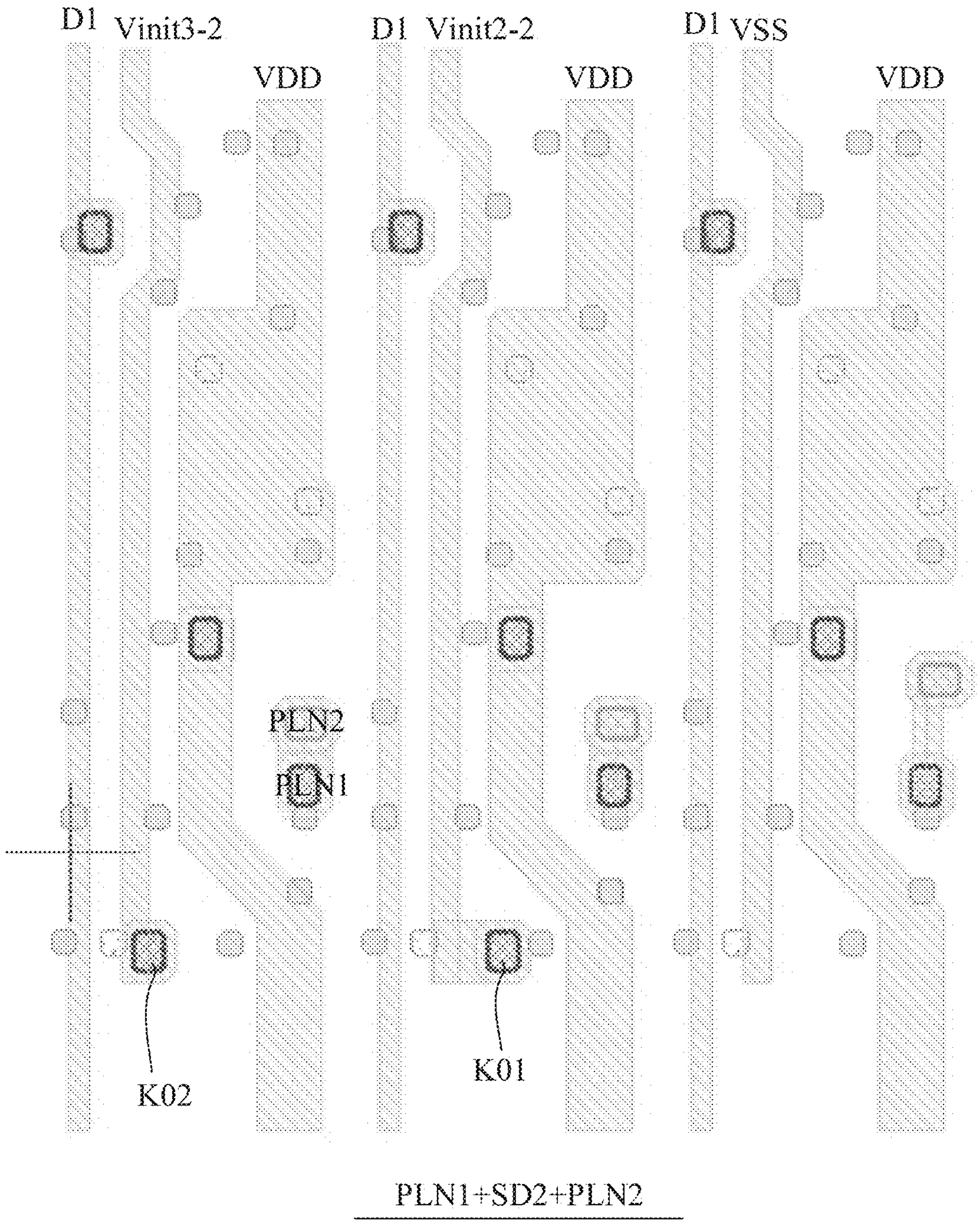
FIG. 29 is a structural layout of a first planarization layer, a second source-drain metal layer and a second planarization layer in a display panel shown on the basis of the structure shown in FIG. 16.

The structural layout shown in FIG. 29 includes a first planarization layer PLN1, a second source-drain metal layer SD2 and a second planarization layer PLN2.

Figure 30:
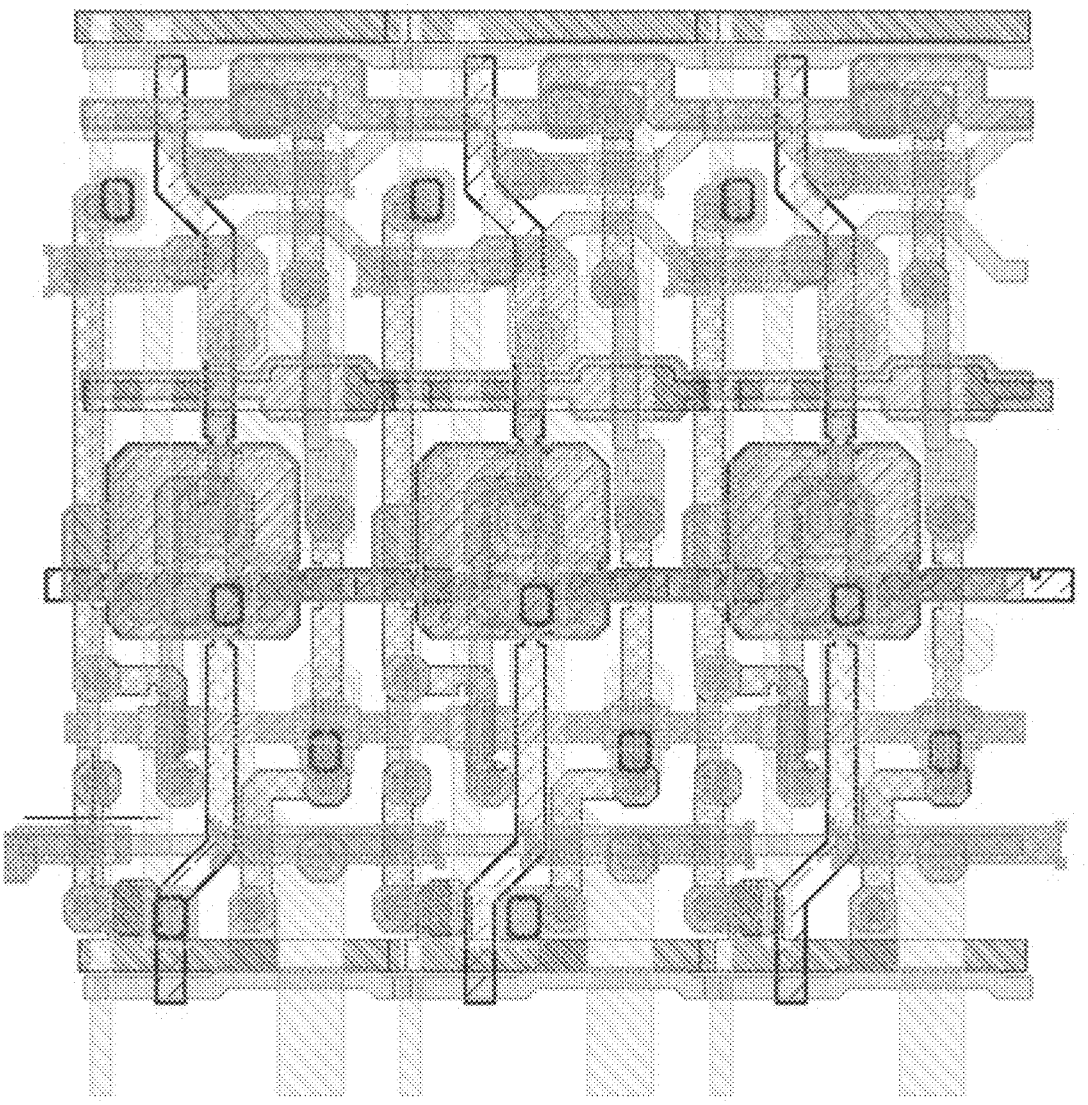
FIG. 30 is a structural layout of a base metal layer, an active layer, a first gate metal layer, a second gate metal layer, an active layer, a third gate metal layer, an interlayer insulator layer, a first source-drain metal layer, a first planarization layer, a second source-drain metal layer and a second planarization layer in a display panel shown on the basis of the structure shown in FIG. 16.

The structural layout shown in FIG. 30 includes the base metal BSM, the active layer Poly, the first gate metal layer Gate1, the second gate metal layer Gate2, the active layer IGZO, the third gate metal layer Gate3, the interlayer insulator layer ILD, the first source-drain metal layer SD1, the first planarization layer PLN1, the second source-drain metal layer SD2 and the second planarization layer PLN2 which are stacked.

Figure 31:
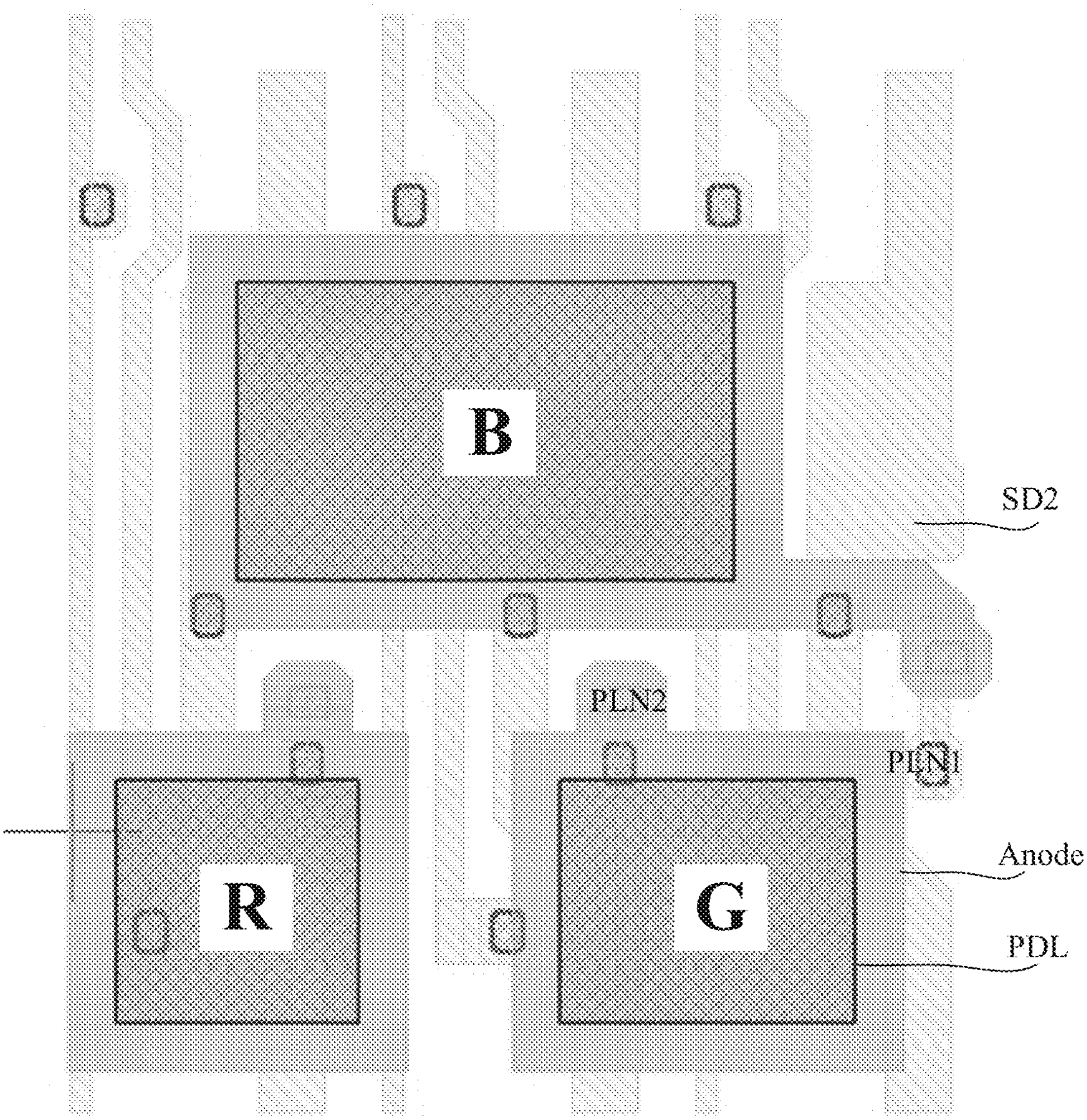
FIG. 31 is a structural layout of a first planarization layer, a second source-drain metal layer, a second planarization layer, an anode, and a pixel defining layer in a display panel shown on the basis of the structure shown in FIG. 16.

The structural layout shown in FIG. 31 includes an anode Anode and a pixel defining layer PDL in addition to the first planarization layer PLN1, the second source-drain metal layer SD2 and the second planarization layer PLN2 shown in FIG. 29. In addition, FIG. 31 further schematically marks a sub-pixel R, a sub-pixel G and a sub-pixel B.

Figure 32:
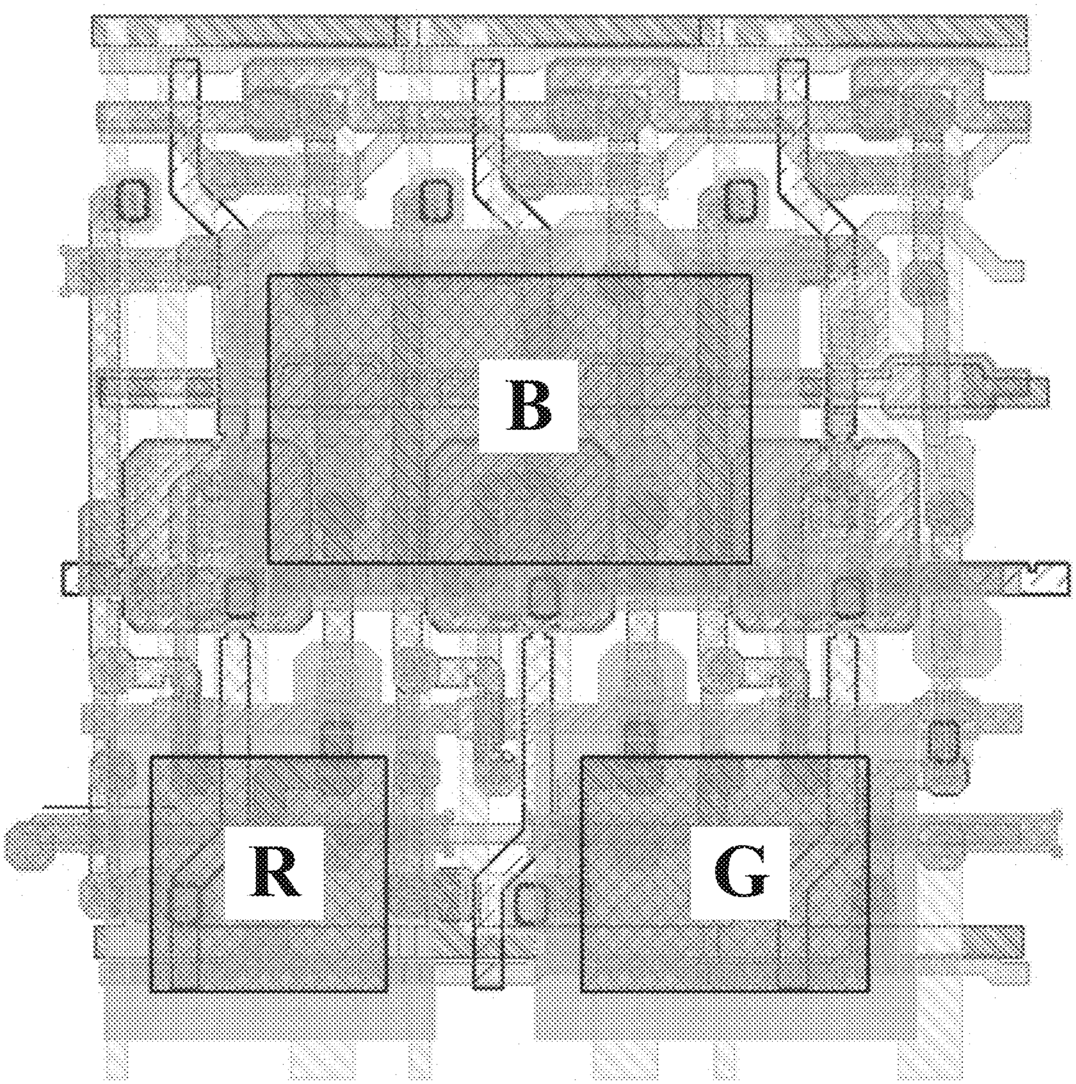
FIG. 32 is a structural layout of a base metal layer, an active layer, a first gate metal layer, a second gate metal layer, an active layer, a third gate metal layer, an interlayer insulator layer, a first source-drain metal layer, a first planarization layer, a second source-drain metal layer, a second planarization layer, a first planarization layer, a second source-drain metal layer, a second planarization layer, an anode, and a pixel defining layer in a display panel on the basis of the structure shown in FIG. 16.

The structural layout shown in FIG. 32 includes the base metal BSM, the active layer Poly, the first gate metal layer Gate1, the second gate metal layer Gate2, the active layer IGZO, the third gate metal layer Gate3, the interlayer insulator layer ILD, the first source-drain metal layer SDT, the first planarization layer PLN1, the second source-drain metal layer SD2, the second planarization layer PLN2, the anode Anode and the pixel defining layer PDL which are stacked.

On the basis of the structure shown in FIG. 18, FIG. 33 to FIG. 50 further sequentially show each single-layer and gradually stacked layers.

Figure 33:
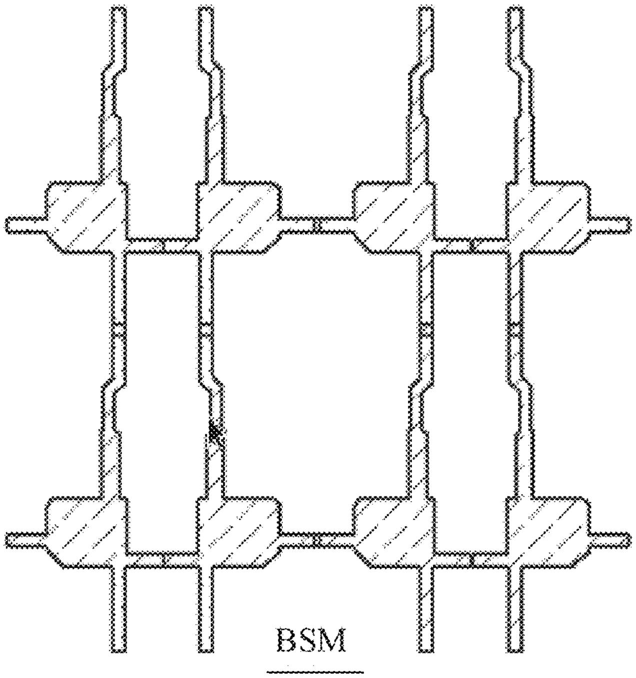
FIG. 33 is a structural layout of a base metal layer in a display panel shown on the basis of the structure shown in FIG. 18.

The structural layout shown in FIG. 33 includes a base metal BSM.

Figure 34:
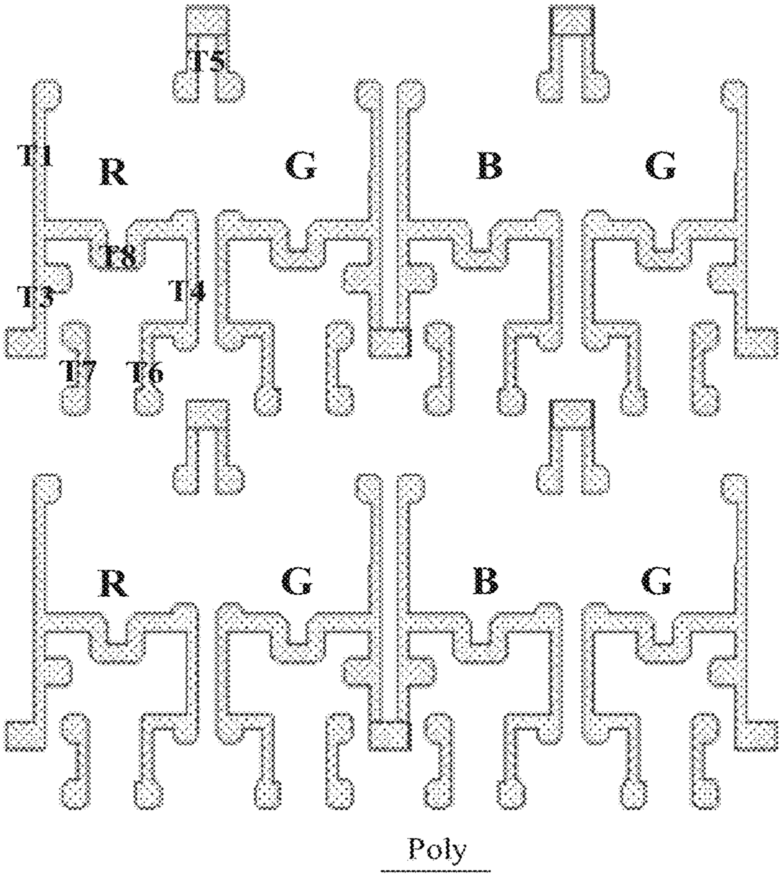
FIG. 34 is a structural layout of an active layer in a display panel shown on the basis of the structure shown in FIG. 18.

The structural layout shown in FIG. 34 includes an active layer Poly, and FIG. 34 further schematically marks the positions of the active layers Poly in the P-type transistors except the N-type transistor (i.e., the second transistor T2), including the first transistor T1, the third transistor T3, the fourth transistor T4, the fifth transistor T5, the sixth transistor T6, the seventh transistor T7 and the eighth transistor T8, and also schematically marks the division of the sub-pixel R, the sub-pixel G, the sub-pixel B and the sub-pixel G.

Figure 35:
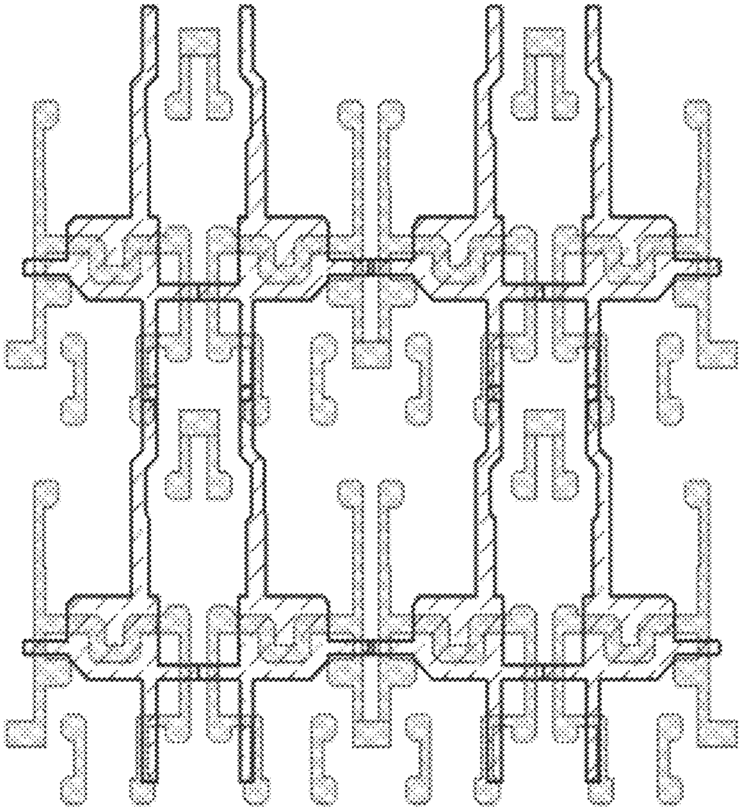
FIG. 35 is a structural layout of a base metal layer and an active layer in a display panel shown on the basis of the structure shown in FIG. 18.

The structural layout shown in FIG. 35 includes the base metal BSM and the active layer Poly which are stacked.

Figure 36:
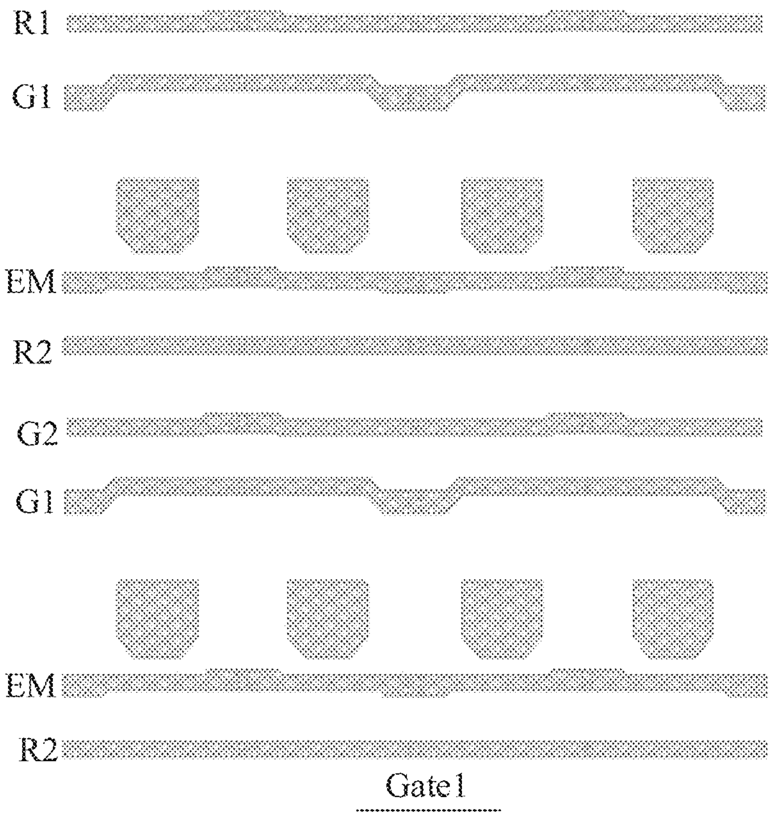
FIG. 36 is a structural layout of a first gate metal layer in a display panel shown on the basis of the structure shown in FIG. 18.

The structural layout shown in FIG. 36 includes a first gate metal layer Gate1.

Figure 37:
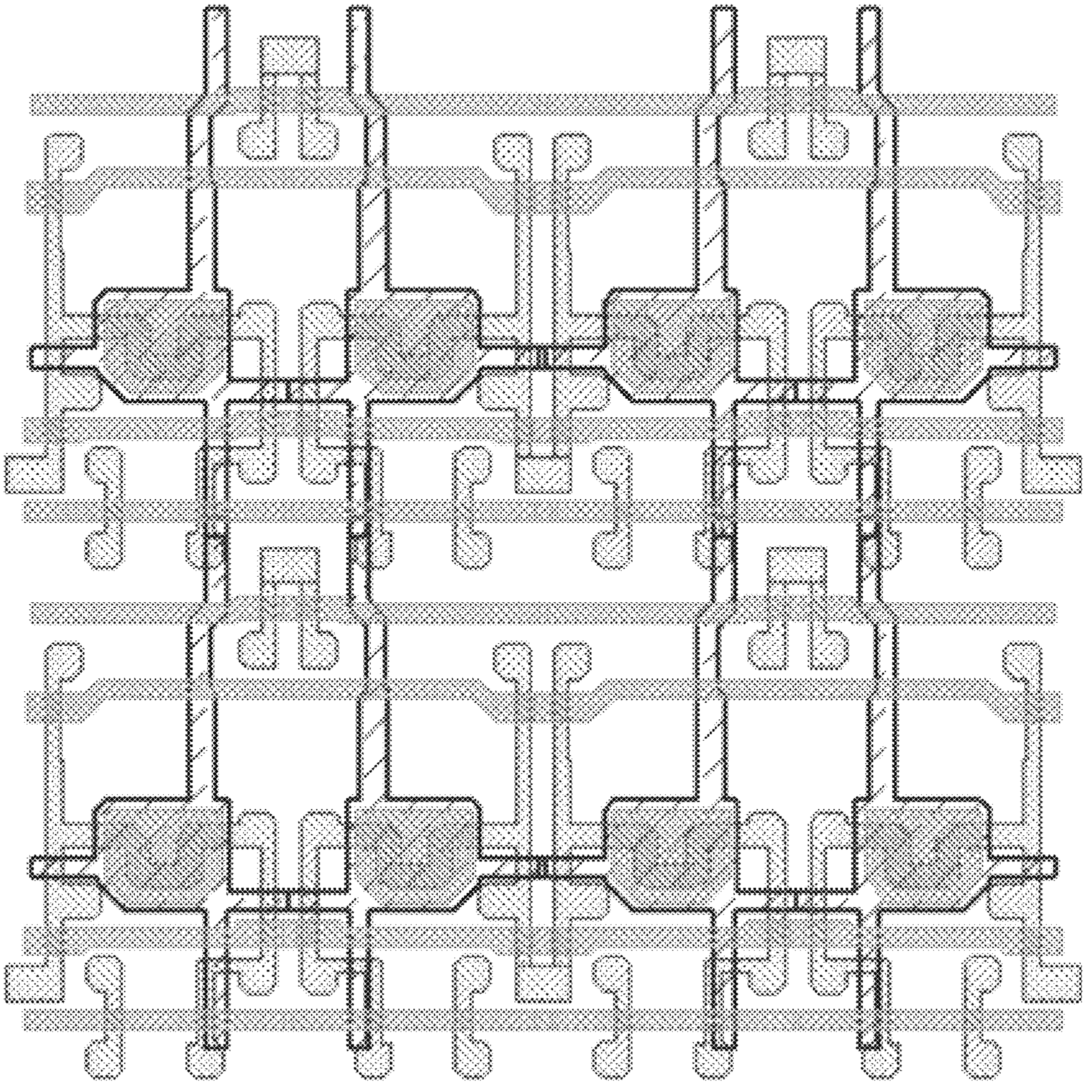
FIG. 37 is a structural layout of a base metal layer, an active layer and a first gate metal layer in a display panel shown on the basis of the structure shown in FIG. 18.

The structural layout shown in FIG. 37 includes the base metal BSM, the active layer Poly and the first gate metal layer Gate1 which are stacked.

Figure 38:
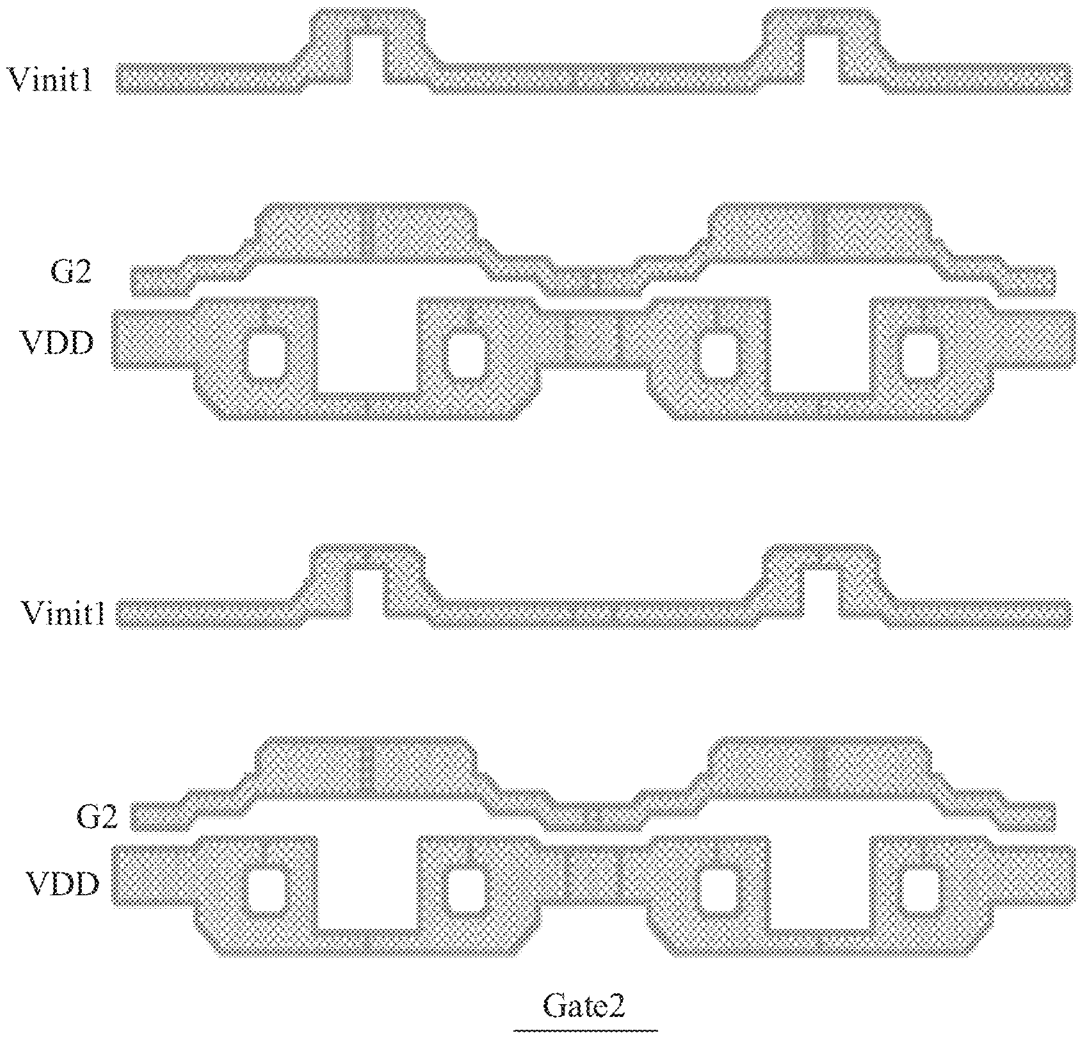
FIG. 38 is a structural layout of a second gate metal layer in a display panel shown on the basis of the structure shown in FIG. 18.

The structural layout shown in FIG. 38 includes a second gate metal layer Gate2.

Figure 39:
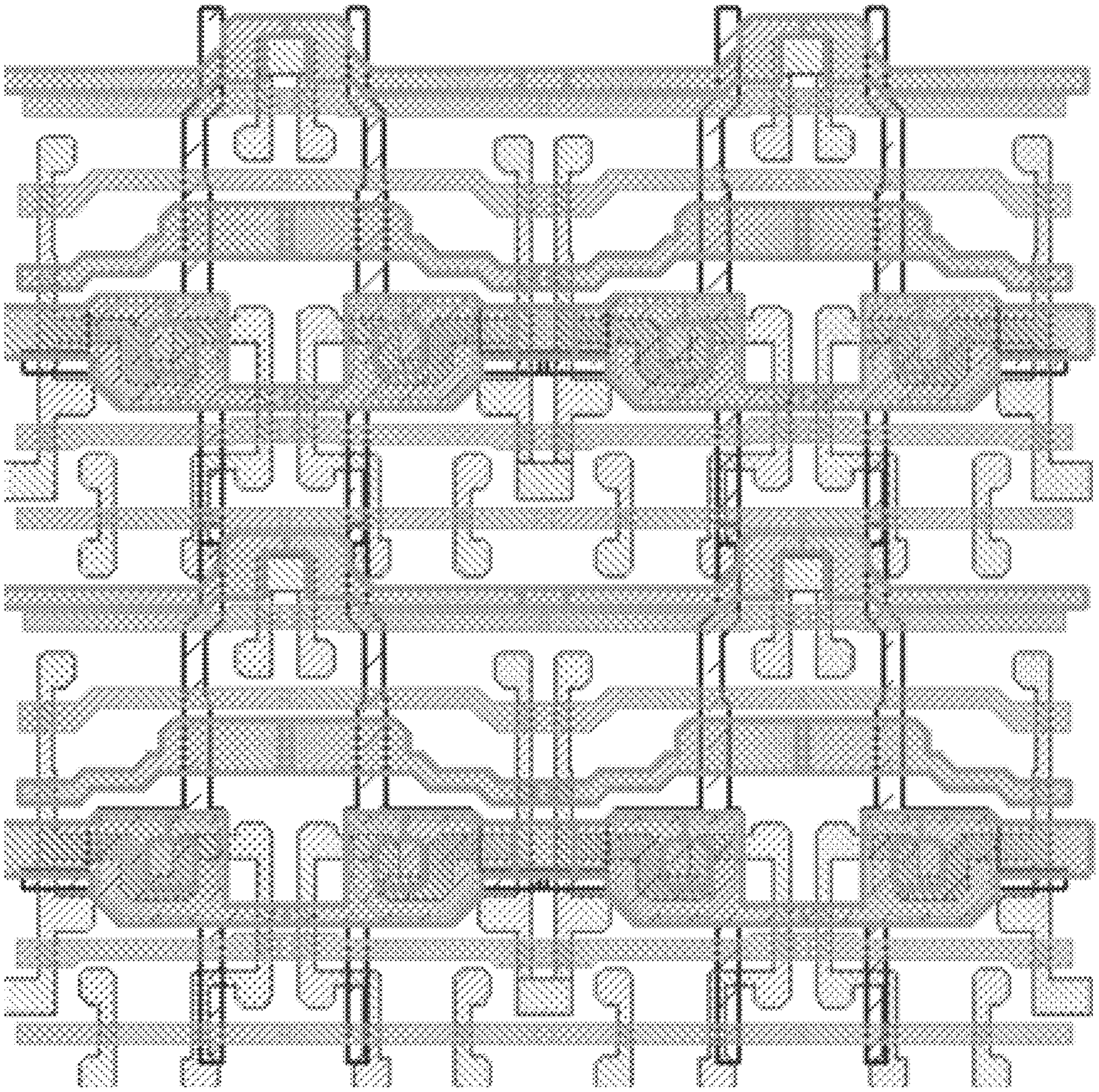
FIG. 39 is a structural layout of a base metal layer, an active layer, a first gate metal layer and a second gate metal layer in a display panel shown on the basis of the structure shown in FIG. 18.

The structural layout shown in FIG. 39 includes the base metal BSM, the active layer Poly, the first gate metal layer Gate1 and he second gate metal layer Gate2 which are stacked.

Figure 40:
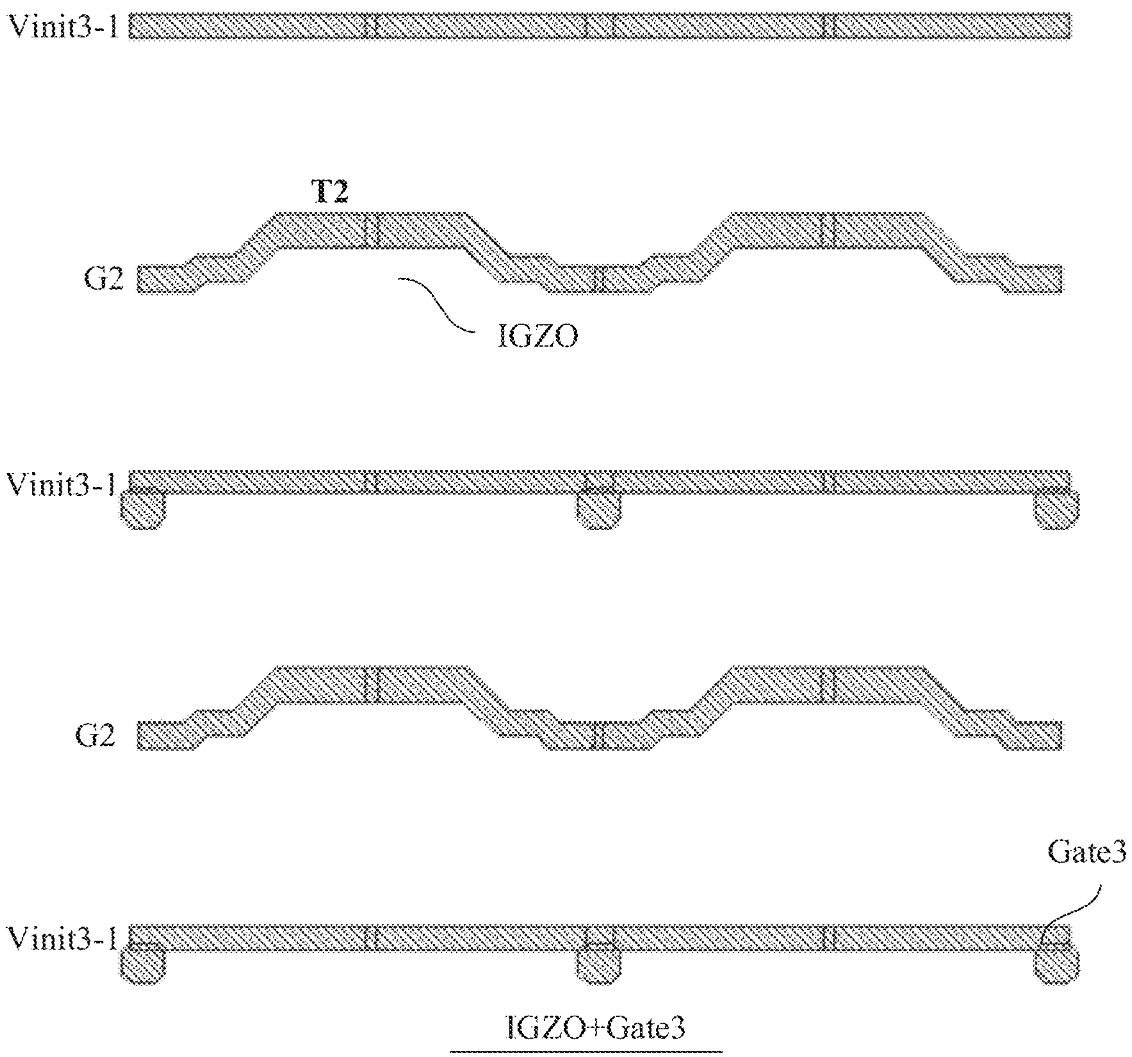
FIG. 40 is a structural layout of an active layer and a third gate metal layer in a display panel shown on the basis of the structure shown in FIG. 18.

The structural layout shown in FIG. 40 includes the active layer IGZO of the N-type transistor, and correspondingly marks the second transistor T2, and the structural layout further includes a third gate metal layer Gate3.

Figure 41:
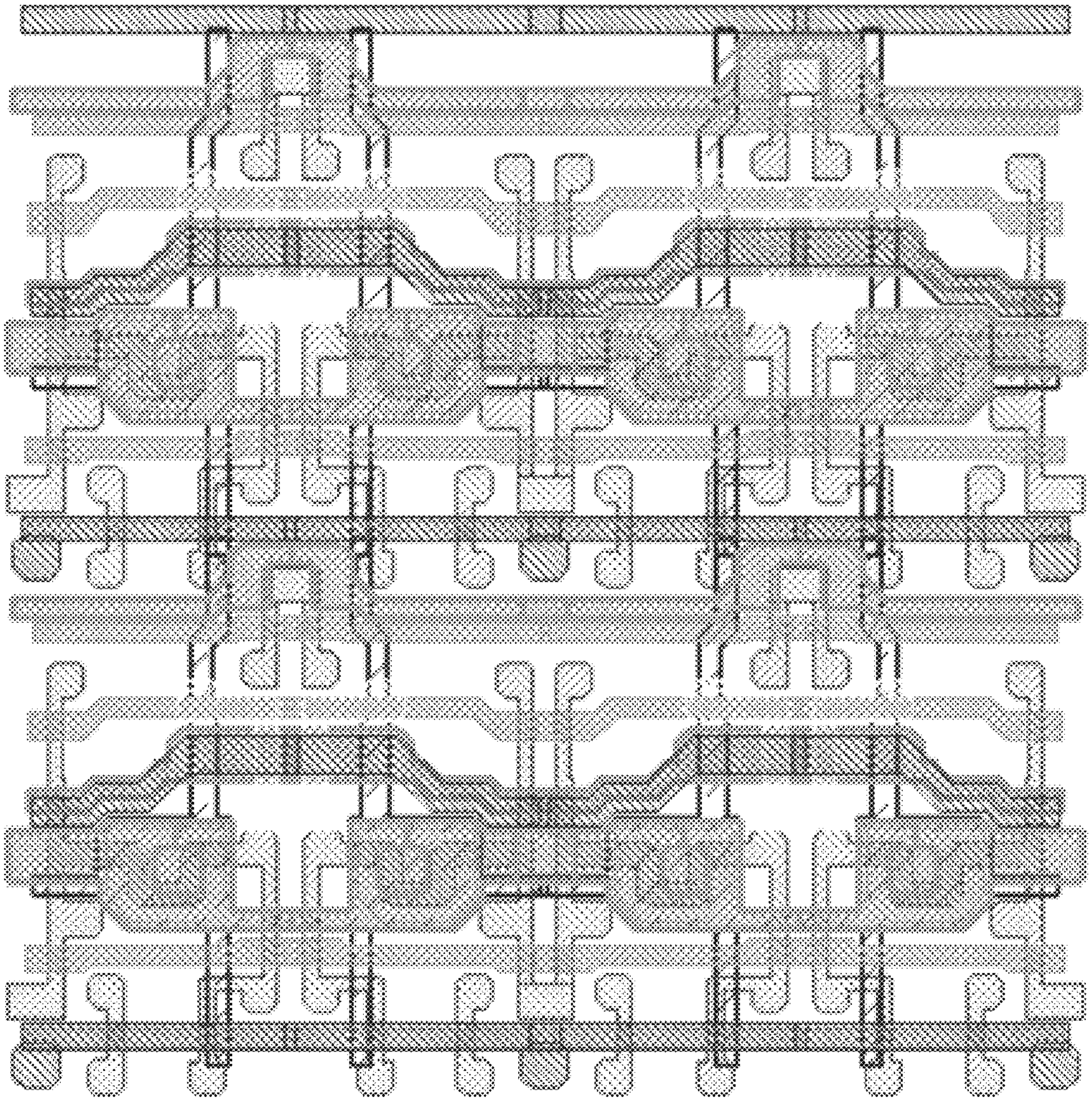
FIG. 41 is a structural layout of abase metal layer, an active layer, a first gate metal layer, a second gate metal layer, an active layer and a third gate metal layer in a display panel shown on the basis of the structure shown in FIG. 18.

The structural layout shown in FIG. 41 includes the base metal BSM, the active layer Poly, the first gate metal layer Gate1, the second gate metal layer Gate2, the active layer IGZO, and the third gate metal layer Gate3 which are stacked.

Figure 42:
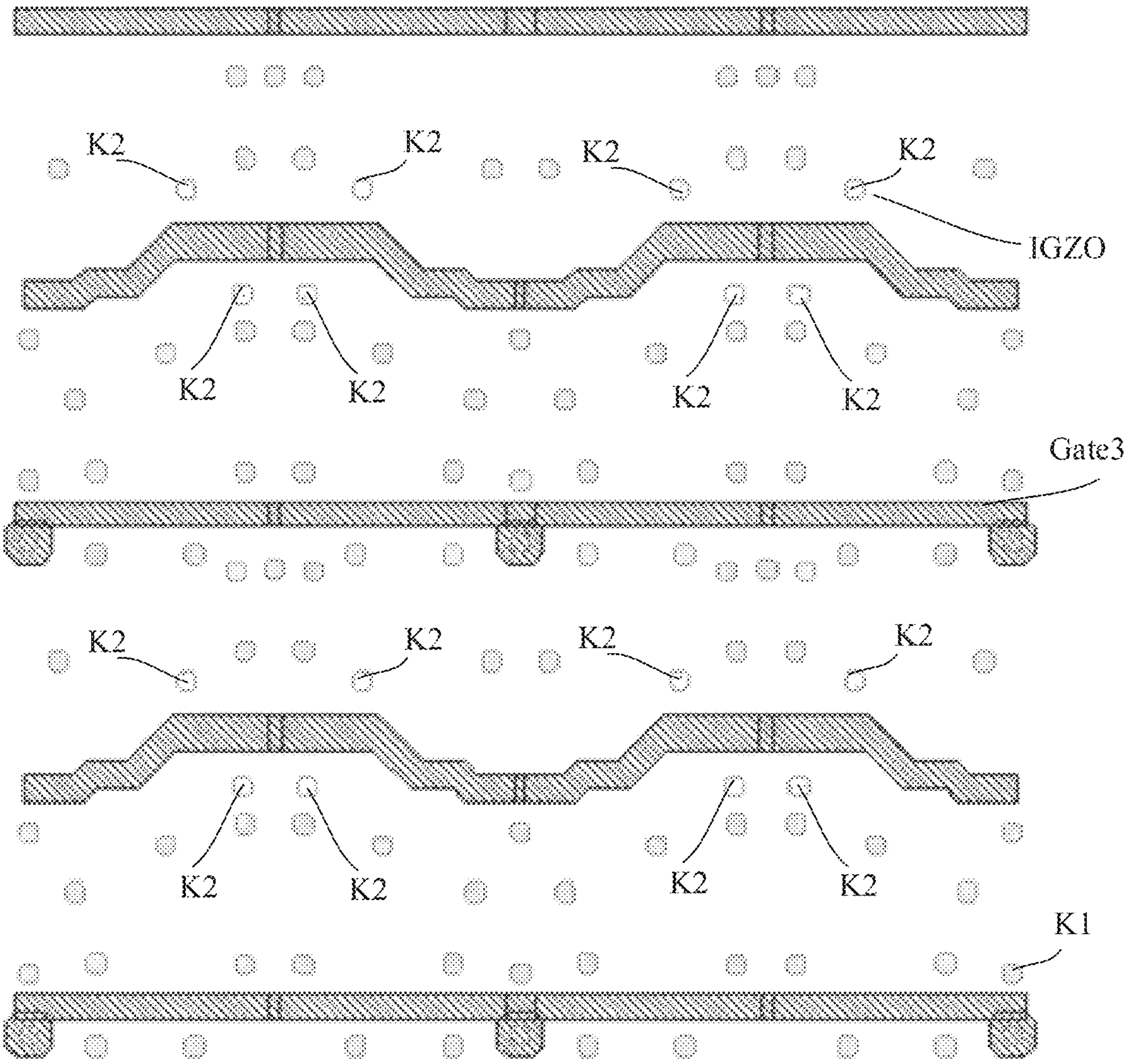
FIG. 42 is a structural layout of a third gate metal layer, an active layer and an interlayer insulator layer in a display panel shown on the basis of the structure shown in FIG. 18.

The structural layout shown in FIG. 42 includes an interlayer insulator layer ILD in addition to the third gate metal layer Gate3 and the active layer IGZO shown in FIG. 40. In combination with FIG. 14, the interlayer insulator layer ILD includes an ILD_L and an ILD_O that are configured to penetrate through different film layers to lap with different film layers. The via hole formed by ILD_L is marked with K1, and the via hole formed by ILD_O is marked with K2. FIG. 42 marks all via holes K2, and the remaining via holes which are not marked are via holes K1.

Figure 43:
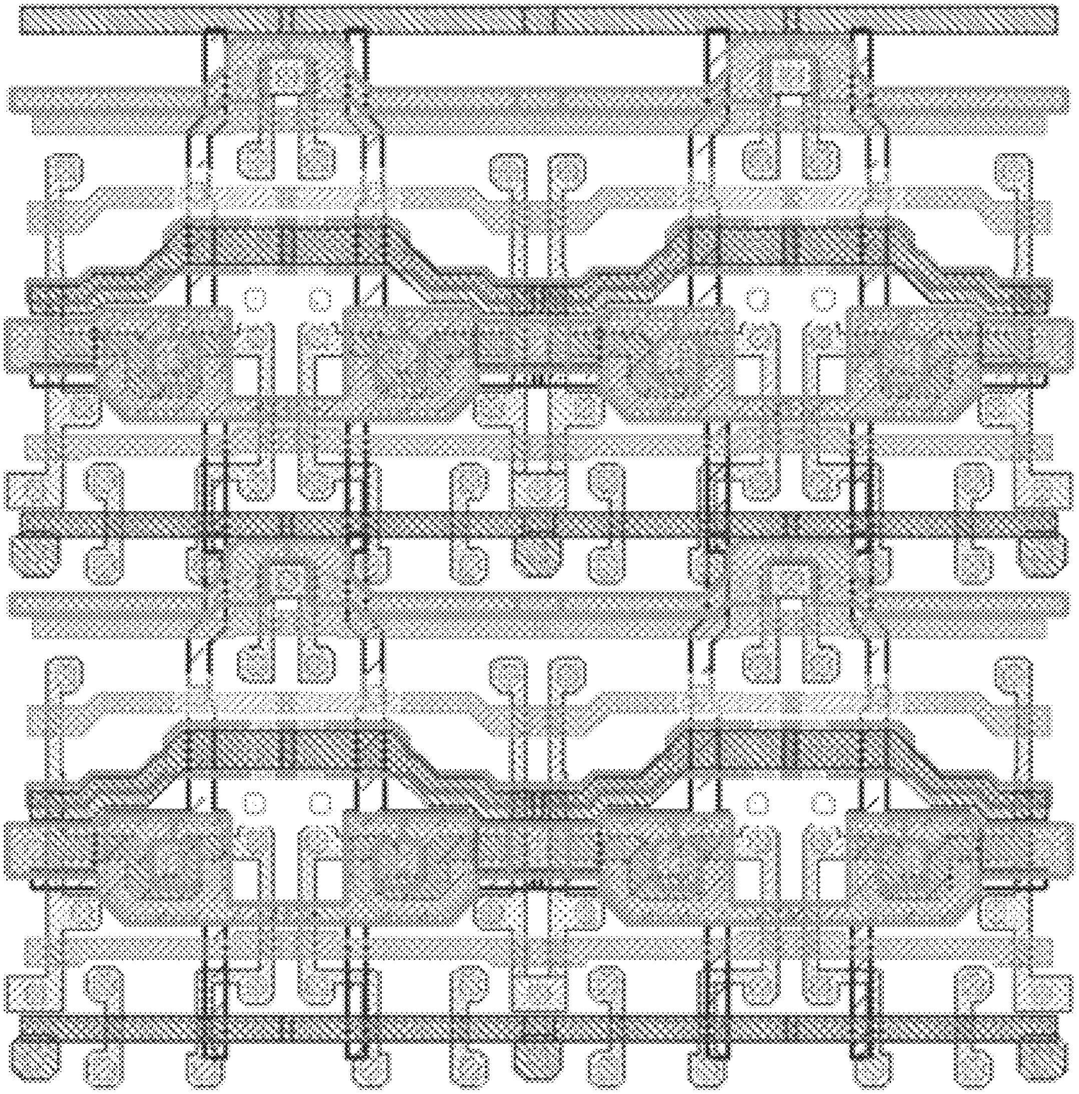
FIG. 43 is a structural layout of abase metal layer, an active layer, a first gate metal layer, a second gate metal layer, an active layer, a third gate metal layer, an active layer and an interlayer insulator layer in a display panel shown on the basis of the structure shown in FIG. 18.

The structural layout shown in FIG. 43 includes the base metal BSM, the active layer Poly, the first gate metal layer Gate1, the second gate metal layer Gate2, the active layer IGZO, the third gate metal layer Gate3 and the interlayer insulator layer ILD which are stacked.

Figure 44:
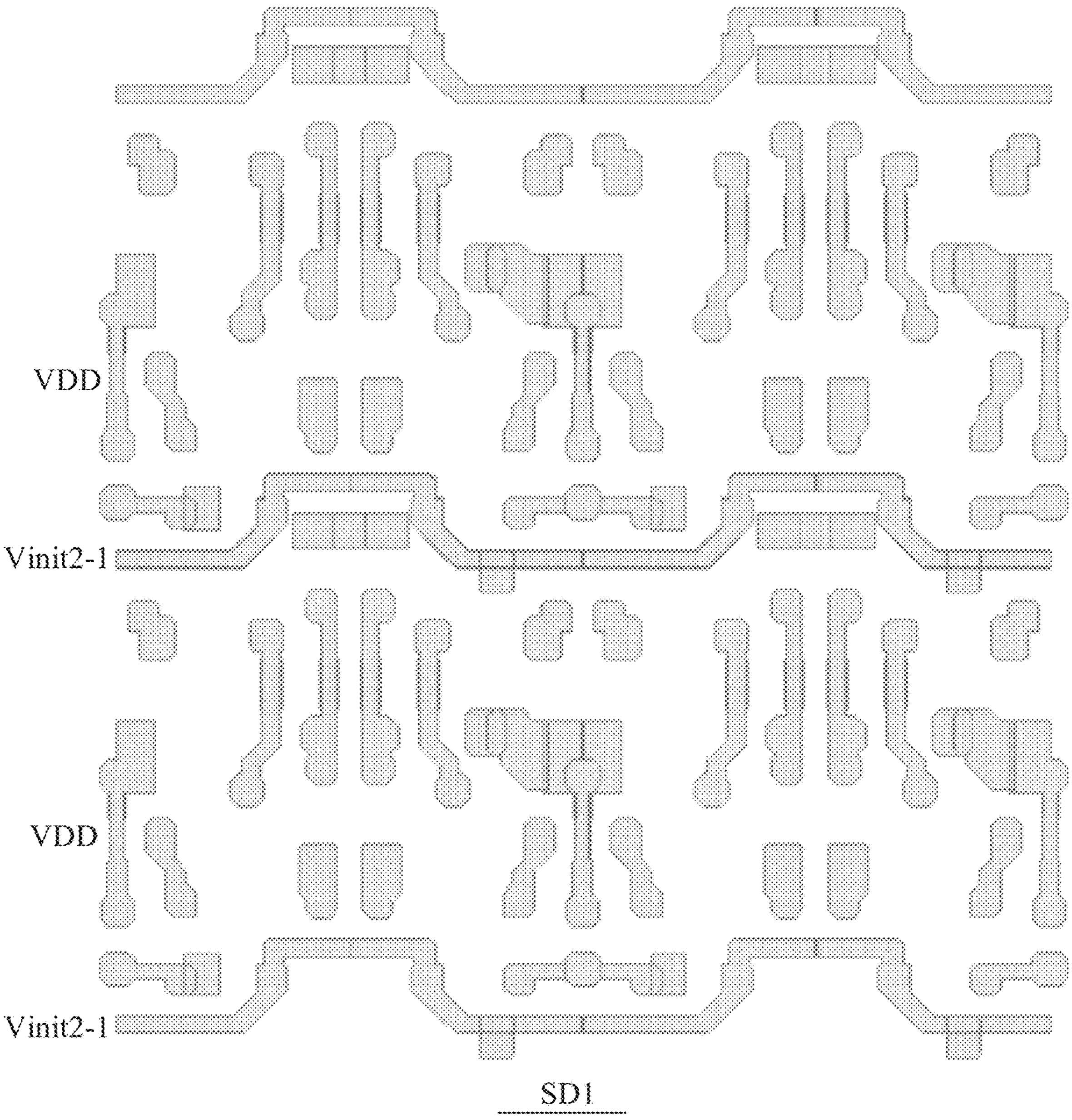
FIG. 44 is a structural layout of a first source-drain metal layer in a display panel shown on the basis of the structure shown in FIG. 18.

The structural layout shown in FIG. 44 includes a first source-drain metal layer SDT.

Figure 45:
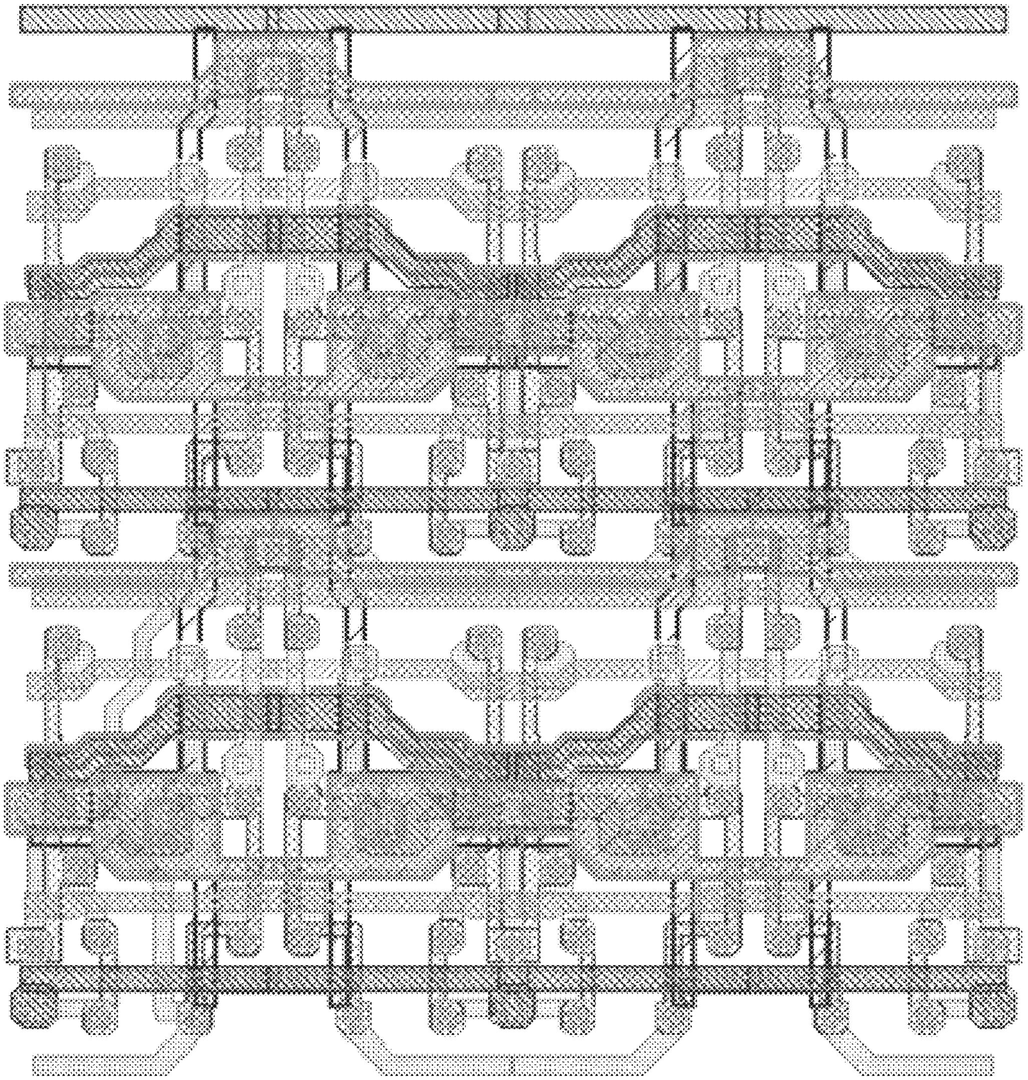
FIG. 45 is a structural layout of abase metal layer, an active layer, a first gate metal layer, a second gate metal layer, an active layer, a third gate metal layer, an active layer, an interlayer insulator layer and a first source-drain metal layer in a display panel shown on the basis of the structure shown in FIG. 18.

The structural layout shown in FIG. 45 includes the base metal BSM, the active layer Poly, the first gate metal layer Gate1, the second gate metal layer Gate2, the active layer IGZO, the third gate metal layer Gate3, the interlayer insulator layer ILD and the first source-drain metal layer SD1 which are stacked.

Figure 46:
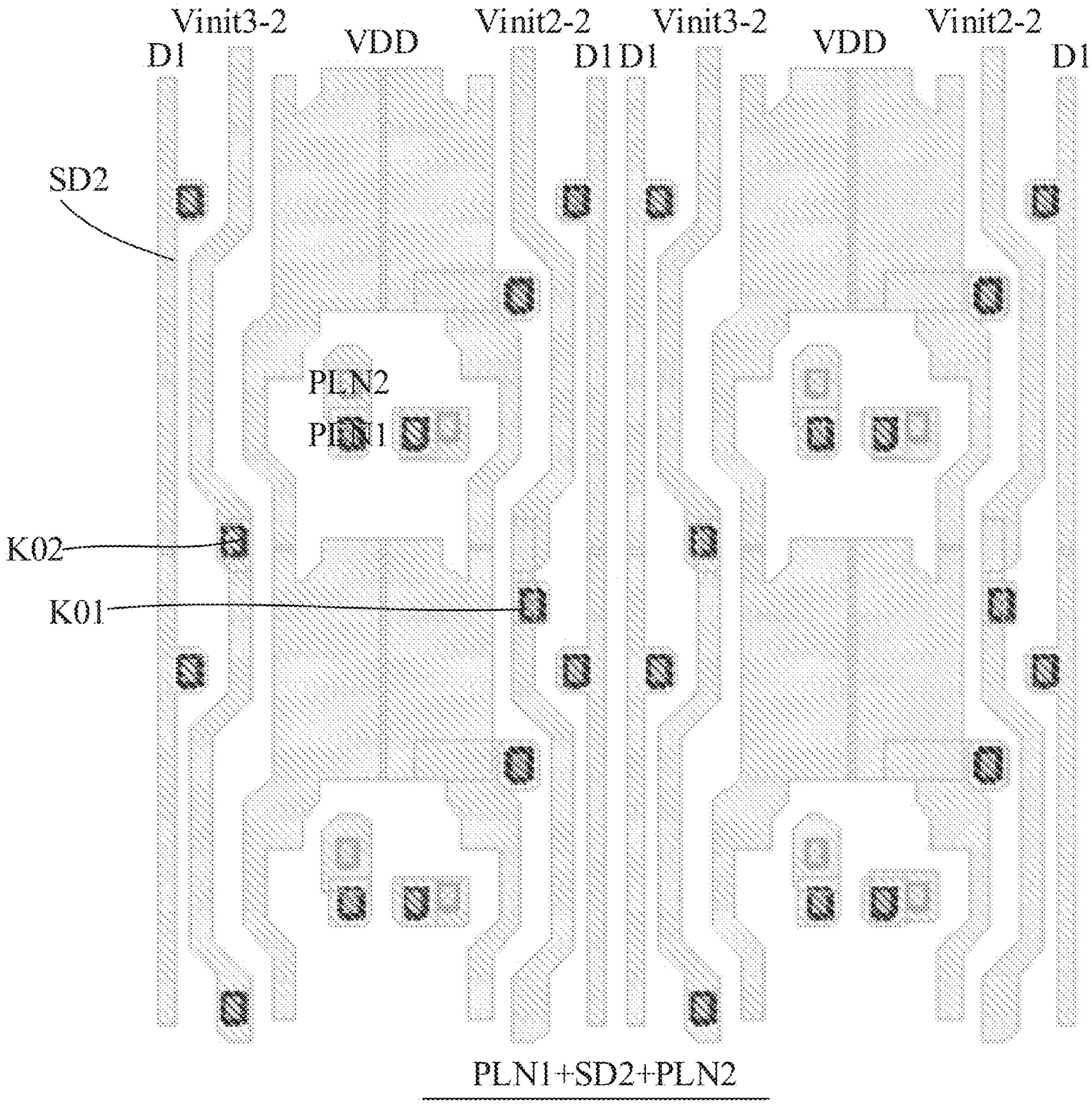
FIG. 46 is a structural layout of a first planarization layer, a second source-drain metal layer and a second planarization layer in a display panel shown on the basis of the structure shown in FIG. 18.

The structural layout shown in FIG. 46 includes a first planarization layer PLN1, a second source-drain metal layer SD2 and a second planarization layer PLN2.

Figure 47:
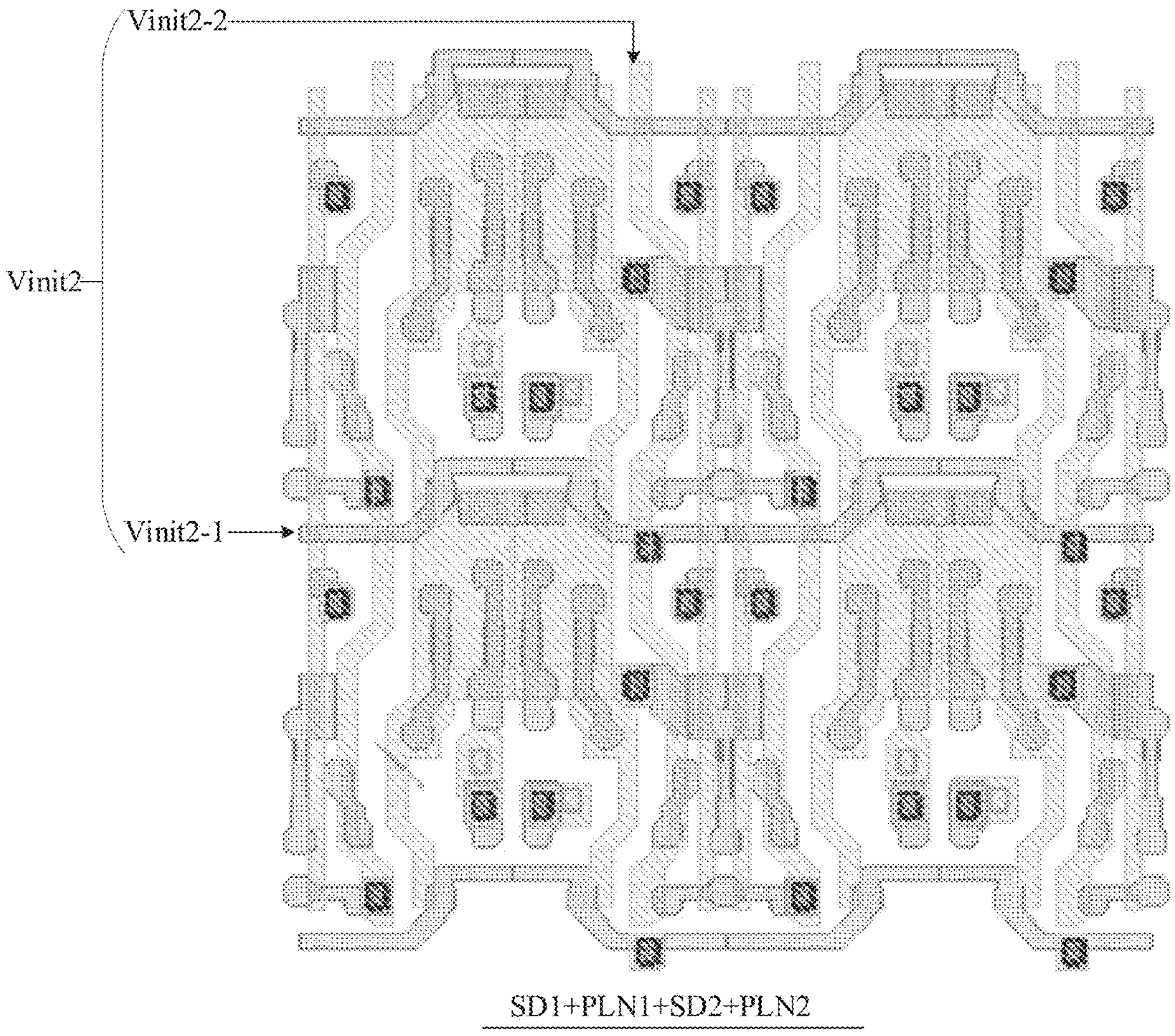
FIG. 47 is a structural layout of a first planarization layer, a second source-drain metal layer and a second planarization layer in a display panel shown on the basis of the structure shown in FIG. 18.

The structural layout shown in FIG. 47 includes the first source-drain metal layer SDT, the first planarization layer PLN1, the second source-drain metal layer SD2 and the second planarization layer PLN2 which are stacked.

Figure 48:
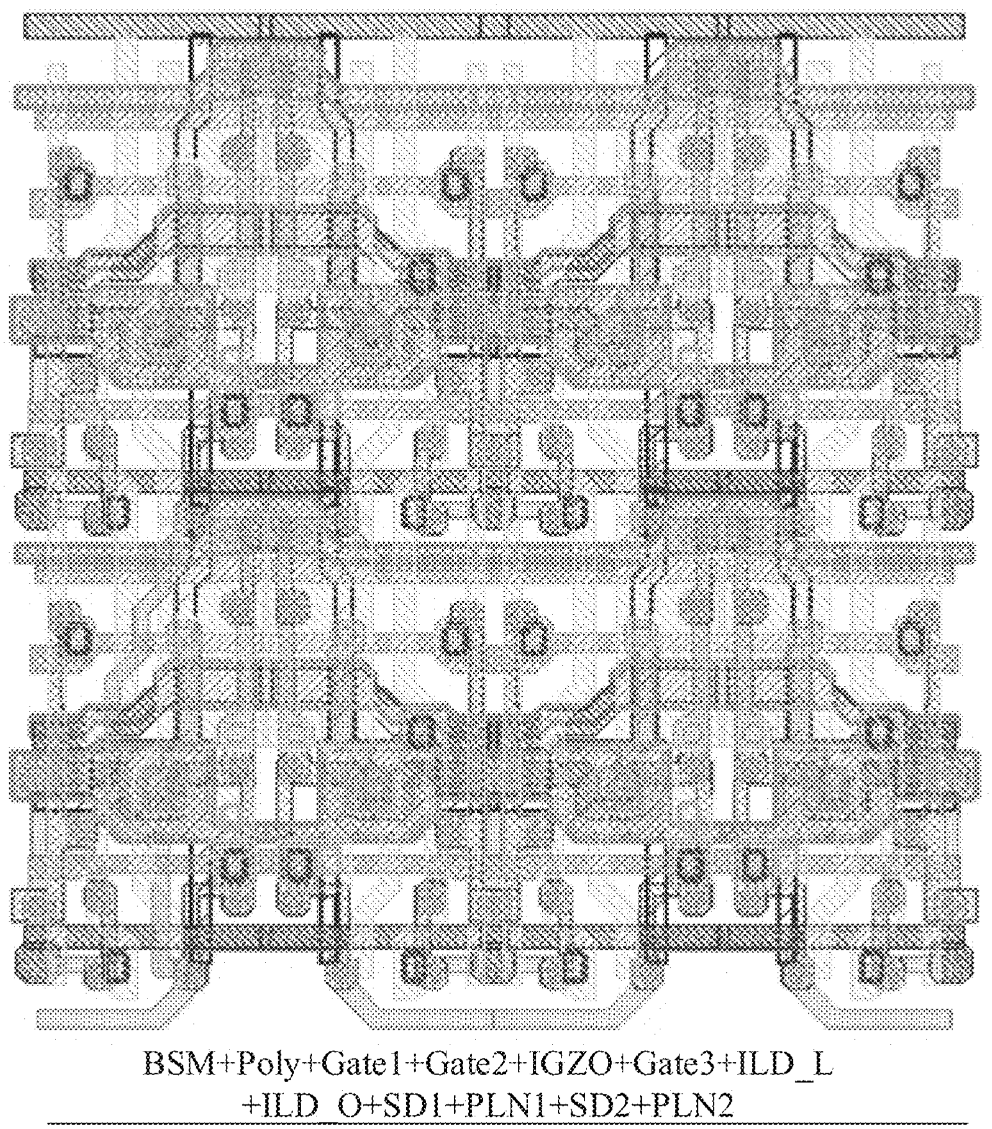
FIG. 48 is a structural layout of abase metal layer, an active layer, a first gate metal layer, a second gate metal layer, an active layer, a third gate metal layer, an active layer, an interlayer insulator layer, a first source-drain metal layer, a first planarization layer, a second source-drain metal layer and a second planarization layer in a display panel shown on the basis of the structure shown in FIG. 18.

The structural layout shown in FIG. 48 includes the base metal BSM, the active layer Poly, the first gate metal layer Gate1, the second gate metal layer Gate2, the active layer IGZO, the third gate metal layer Gate3, the interlayer insulator layer ILD, the first source-drain metal layer SDT, the first planarization layer PLN1, the second source-drain metal layer SD2 and the second planarization layer PLN2 which are stacked.

Figure 49:
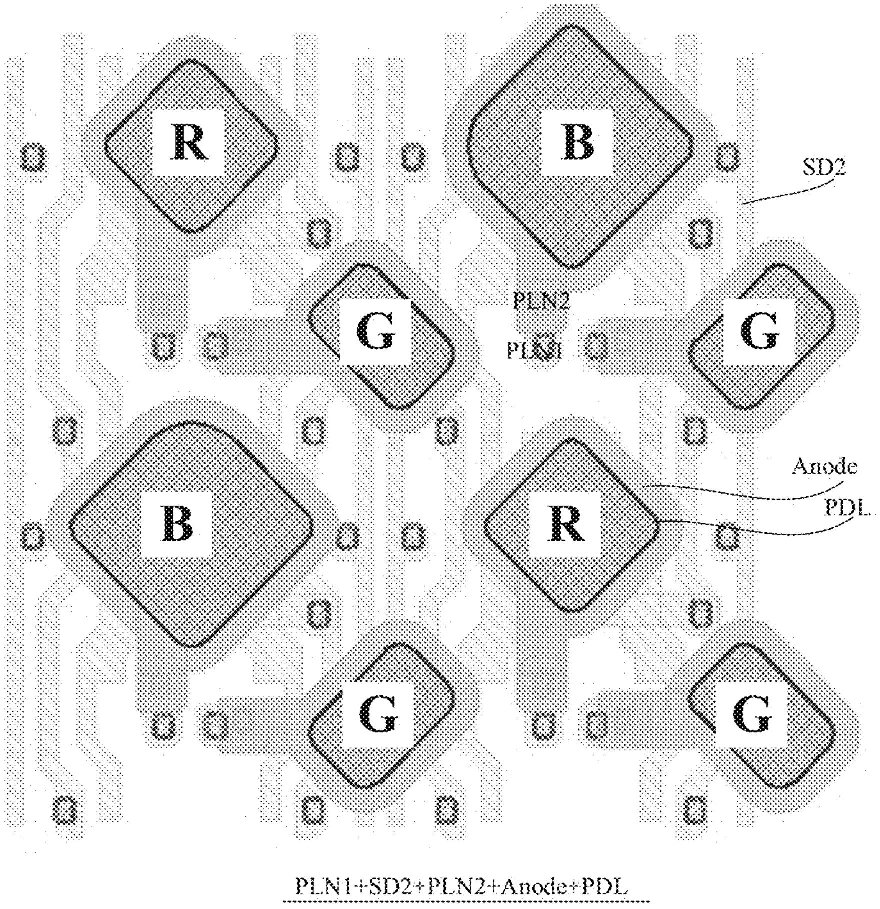
FIG. 49 is a structural layout of a first planarization layer, a second source-drain metal layer, a second planarization layer, an anode and a pixel defining layer in a display panel shown on the basis of the structure shown in FIG. 18.

The structural layout shown in FIG. 49 includes an anode Anode and a pixel defining layer PDL in addition to the first planarization layer PLN1, the second source-drain metal layer SD2 and the second planarization layer PLN2 shown in FIG. 46. In addition, FIG. 49 further schematically shows one sub-pixel R, two sub-pixels G, and one sub-pixel B.

Figure 50:
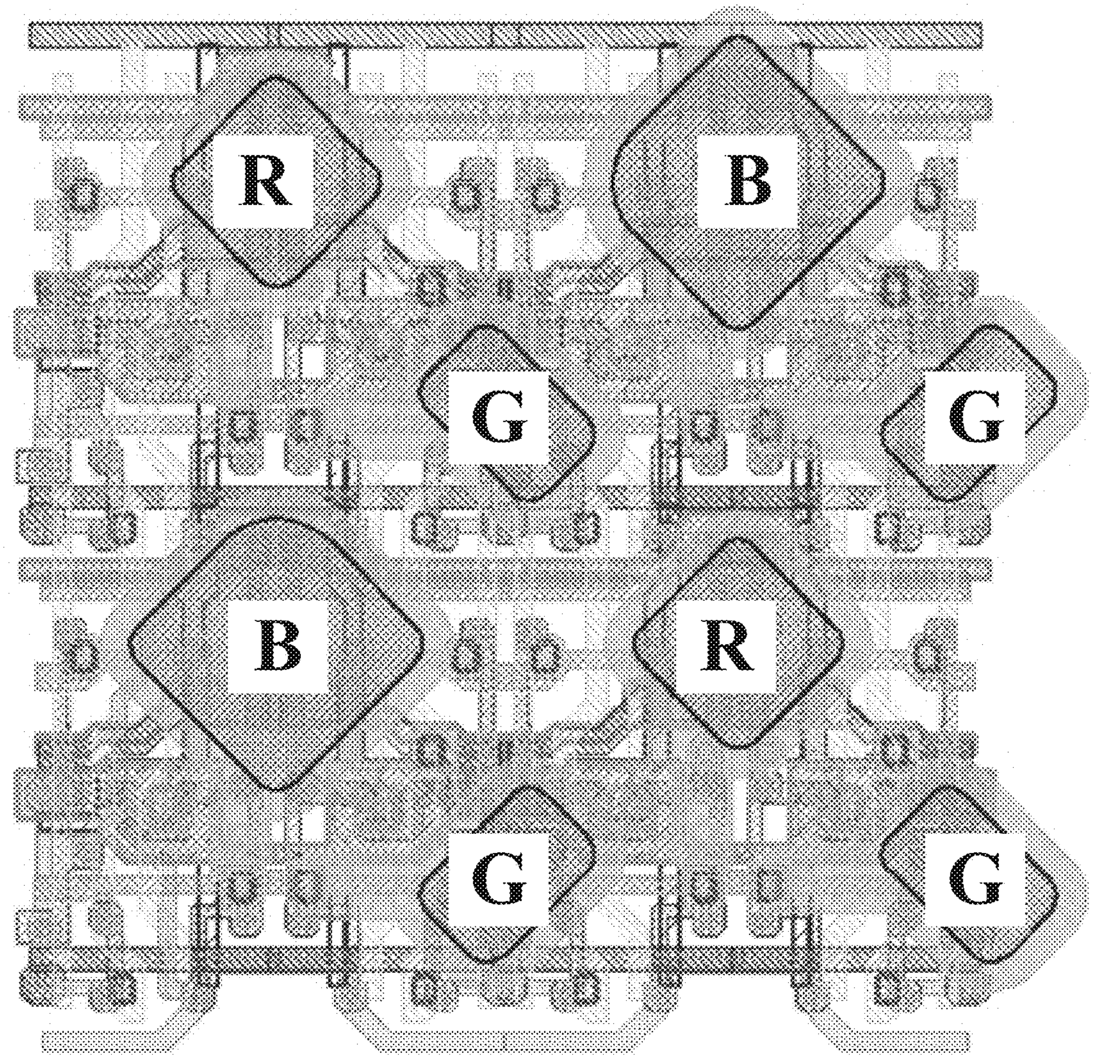
FIG. 50 is a structural layout of abase metal layer, an active layer, a first gate metal layer, a second gate metal layer, an active layer, a third gate metal layer, an active layer, an interlayer insulator layer, a first source-drain metal layer, a first planarization layer, a second source-drain metal layer, a second planarization layer, an anode and a pixel defining layer in a display panel shown on the basis of the structure shown in FIG. 18.

The structural layout shown in FIG. 50 includes the base metal BSM, the active layer Poly, the first gate metal layer Gate1, the second gate metal layer Gate2, the active layer IGZO, the third gate metal layer Gate3, the interlayer insulator layer ILD, the first source-drain metal layer SDT, the first planarization layer PLN1, the second source-drain metal layer SD2, the second planarization layer PLN 2, the anode Anode and the pixel defining layer PDL which are stacked.

In some embodiments, as described in the foregoing embodiments, the mesh-shaped signal lines in the embodiments of the present disclosure include the second initialization line Vinit2 and the third initialization line Vinit3.

As can be seen from FIG. 27 and FIG. 44, the first portion Vinit2-1 of the second initialization line Vinit2 extends along the first direction X1, and is disposed in the same layer as the first source-drain metal layer SDT.

As can be seen from FIG. 29, FIG. 46 and FIG. 47, the second portion Vinit2-2 of the second initialization line Vinit2 extends along the second direction X2, and is disposed in the same layer as the second source-drain metal layer SD2.

Alternatively, as can be seen from FIG. 19, the first portion Vinit2-1 and the second portion Vinit2-2 of the second initialization line Vinit2 are both disposed in the same layer as the first source-drain metal layer SDT.

As can be seen from FIG. 25 and FIG. 40, the first portion Vinit3-1 of the third initialization line Vinit3 extends along the first direction X1, and is disposed in the same layer as the third gate metal layer Gate3.

As can be seen from FIG. 29 and FIG. 46, the second portion Vinit3-2 of the third initialization line Vinit3 extends along the second direction X2, and is disposed in the same layer as the second source-drain metal layer SD2.

In addition, FIG. 29 and FIG. 46 both show a via hole K01 through which the first portion Vinit2-1 and the second portion Vinit2-2 of the second initialization line Vinit2 are connected, and a via hole K02 through which the first portion Vinit3-1 and the second portion Vinit3-2 of the third initialization line Vinit3 are connected. As can be seen from FIG. 14, the via hole K01 and the via hole K02 penetrate through the first planarization layer PLN1.

On the basis of this implementation, the first initialization line Vinit1 is not mesh-shaped. As can be seen from FIG. 23 and FIG. 38, the first initialization line Vinit1 extends along the first direction X1, and is disposed in the same layer as the second gate metal layer Gate2. The mesh-shaped signal lines further include a second power line VSS disposed in the display region AA of the substrate 01. As can be seen from FIG. 3 and FIG. 27, the first portion of the second power line VSS extends along the first direction X1, and is disposed in the same layer as the first source-drain metal layer SD1; and the second portion of the second power line VSS extends along the second direction X2, and is disposed in the same layer as the second source-drain metal layer SD2 (the meshed-shape of the second power line VSS is not shown in the figure).

Alternatively, the second power line VSS disposed in the display region AA of the substrate 01 is not mesh-shaped. As can be seen from FIG. 29, the second power line VSS disposed in the display region AA of the substrate 01 extends along the second direction X2, and is disposed in the same layer as the second source-drain metal layer SD2. The mesh-shaped signal lines further include the first initialization line Vinit1. As can be seen from FIG. 7 and FIG. 23, the first portion Vinit1-1 of the first initialization line Vinit1 extends along the first direction X1, and is disposed in the same layer as the second gate metal layer Gate2; and the second portion Vinit1-2 of the first initialization line Vinit1 extends along the second direction X2, and is disposed in the same layer as the second source-drain metal layer SD2.

The above is described by taking an example where the first initialization line Vinit1 or the second power line VSS disposed in the display region AA of the substrate 01 is mesh-shaped. Certainly, in some other embodiments, if the space of the display panel allows, the first initialization line Vinit1 and the second power line VSS disposed in the display region AA of the substrate 01 are both mesh-shaped. For the implementation of the mesh-shaped design, reference can be made to the foregoing embodiments, and details are not described herein again.

In addition, as can be seen from FIG. 21 and FIG. 36, the light emission control line EM extends along the first direction X1, and is disposed in the same layer as the first gate metal layer Gate1.

As can be seen from FIG. 23 and FIG. 25, and from FIG. 38 and FIG. 40, the second gate line G2 extends along the first direction X1, and is disposed in the same layer as the second gate metal layer Gate2 and the third gate metal layer Gate3, respectively.

As can be seen from FIG. 29 and FIG. 46, the data line D1 extends along the second direction X2, and is disposed in the same layer as the second source-drain metal layer SD2.

As can be seen from FIG. 23, FIG. 27 and FIG. 29, and from FIG. 38, FIG. 44 and FIG. 46, the first power line VDD includes three portions coupled to each other.

As can be seen from FIG. 23 and FIG. 38, one portion of the first power line VDD extends along the first direction X1, and is disposed in the same layer as the second gate metal layer Gate2. As can be seen from FIG. 27 and FIG. 44, another portion of the first power line VDD extends along the second direction X2, and is disposed in the same layer as the first source-drain metal layer SD1. As can be seen from FIG. 29 and FIG. 46, the other portion of the first power line VDD extends along the second direction X2, and is disposed in the same layer as the second source-drain metal layer SD2.

As can be seen from FIG. 36, the first reset line R1, the first gate line G1 and the second reset line R2 all extend along the first direction X1, and are disposed in the same layer as the first gate metal layer Gate1.

Alternatively, as can be seen from FIG. 27, the first reset line R1, the first gate line G1 and the second reset line R2 all extend along the first direction X1, and are disposed in the same layer as the first source-drain metal layer SD1. Based on this, it can be seen from FIG. 4 and FIG. 21 that the gate of the transistor (i.e., the fifth transistor T5) coupled to the first reset line R1, the gate of the transistor (i.e., the first transistor T1) coupled to the first gate line G1, and the gate of the transistor (i.e., the sixth transistor T6) coupled to the second reset line R2 are all disposed in the same layer as the first gate metal layer Gate1. Based on this, it can be seen from FIG. 28 that the first gate metal layer Gate1 and the first source-drain metal layer SD1 are lapped with each other to realize the coupling between the gate of the transistor and the corresponding signal line, for example, the reliable coupling between the first gate line G1 and the gate of the first transistor T1. The same is to the coupling between other signal lines and the gate of the transistor, which is not repeated herein.

In summary, the embodiments of the present disclosure provide a display panel. In the display panel, the pixel circuit of each sub-pixel includes a drive circuit and a reset circuit. The drive circuit can control the potential of the second node based on the potential of the first node and the potential of the third node, and when the second node is connected to the light-emitting element, the potential transmitted by the drive circuit to the second node can drive the light-emitting element to emit light. The reset circuit can transmit an initialization signal to the first node, the second node and the light-emitting element, respectively, to reset the first node, the second node and the light-emitting element. In this way, the potentials of the nodes in the pixel circuit can keep consistent, and each pixel circuit can reliably drive the light-emitting element to emit light, thereby solving the brightness difference and ensuring a better display effect.

In addition, in the embodiments of the present disclosure, at least one of the initialization lines which provide the initialization signals is set to be mesh-shaped, which can improve the stability of the initialization signal provided by the initialization line, thereby further ensuring a better display effect.

Figure 51:
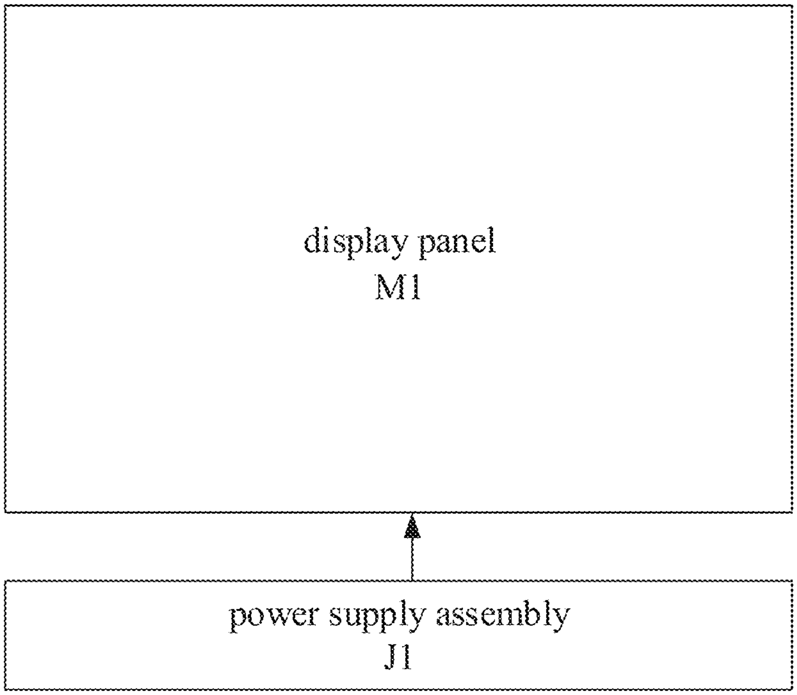
FIG. 51 is a schematic structural diagram of a display device according to some embodiments of the present disclosure.

FIG. 51 is a schematic structural diagram of a display device according to some embodiments of the present disclosure. As shown in FIG. 51, the display device includes a power supply assembly J1 and a display panel M1 as described in the foregoing embodiments.

The power supply assembly J1 is coupled to the display panel M1, and is configured to supply power to the display panel M1.

The display device described in the embodiments of the present disclosure includes any product or component having a display function, such as an OLED display device, a mobile phone, a tablet computer, a flexible display device, a television, and a display.

It should be noted that in the drawings, the dimensions of layers and regions are exaggerated for clarity of illustration. It is to be further understood that when an element or layer is referred to as being "on" another element or layer, it may be directly on other elements, or an intermediate layer may be present. Additionally, it is to be understood that when an element or layer is referred to as being "under" another element or layer, it may be directly under other elements, or more than one intermediate layer or element may be present. Additionally, it is to be understood that when a layer or element is referred to as being "between" two layers or two elements, it may be the unique layer between the two layers or two elements, or more than one intermediate layer or element may be present. Similar reference numerals indicate similar elements throughout.

The terms in the detailed description of the present disclosure are merely used for the purpose of explaining the embodiments of the present disclosure, and are not intended to limit the present disclosure. Unless otherwise defined, the technical terms or scientific terms used in the embodiments of the present disclosure shall be taken to mean the ordinary meanings as understood by those of ordinary skill in the art to which the present disclosure belongs.

For example, in the embodiments of the present disclosure, the terms "first," and "second" are merely used for descriptive purpose, but cannot be construed as indicating or implying any relative importance. The term "a plurality of" refers to two or more, unless specifically defined otherwise.

Similarly, the term "one," "a/an" or similar terms do not limit the quantity, but rather indicate the presence of at least one.

The term "include", "comprise" and similar terms are intended to mean that the element or object before "include" or "comprise" covers the elements or objects or equivalents listed after "include" or "comprise," without excluding other elements or objects.

The terms "on," "under," "left," "right," and the like only indicate the relative positional relationship, and when the absolute position of a described object changes, the relative positional relationship may also change accordingly.

The term "and/or" merely describes an association relationship between associated objects, which represents that there may exist three types of relationships. For example, A and/or B represents three situations: A exists alone, A and B exist simultaneously, and B exists alone. The character "/" herein generally represents an "or" relationship between the associated objects before and after the character.

The above descriptions are merely optional embodiments of the present disclosure, and are not intended to limit the present disclosure. Any variations, equivalent substitutions, improvements and the like made within the spirit and principles of the present disclosure shall be included within the protection scope of the present disclosure.

What is claimed is:

1. A display panel, comprising:

a substrate and a plurality of pixels disposed on the substrate;

wherein each of the plurality of pixels comprises a plurality of sub-pixels, and each of the plurality of sub-pixels comprises a pixel circuit and a light-emitting element, the pixel circuit comprising:

a drive circuit, coupled to a first node, a second node and a third node, wherein the drive circuit is configured to control a potential of the second node based on a potential of the third node and a potential of the first node; and a reset circuit, coupled to a first reset line, a second reset line, a first initialization line, a second initialization line, a third initialization line, the first node, the second node, and a first electrode of a light-emitting element which are disposed on the substrate, wherein the reset circuit is configured to:

control connection or disconnection between the first initialization line and the second node based on a first reset signal provided by the first reset line, control connection or disconnection between the second initialization line and the first electrode of the light-emitting element based on a second reset signal provided by the second reset line, and control connection or disconnection between the third initialization line and the first node based on the second reset signal provided by the second reset line;

wherein at least one of the first initialization line, the second initialization line and the third initialization line is mesh-shaped.

2. The display panel according to claim 1, wherein the pixel circuit further comprises:

a light emission control circuit, coupled to a first gate line, a second gate line, a light emission control line, a data line, a first power line, the first node, the second node, the third node and the first electrode of the light-emitting element which are disposed on the substrate, wherein the light emission control circuit is configured to control connection or disconnection between the data line and the first node based on a first gate driving signal provided by the first gate line, control connection or disconnection between the second node and the third node based on a second gate driving signal provided by the second gate line, and control, based on a light emission control signal provided by the light emission control line, connection or disconnection between the first power line and the first node and connection or disconnection between the second node and the first electrode of the light-emitting element;

wherein a second electrode of the light-emitting element is coupled to a second power line, and the light-emitting element is configured to emit light based on a potential of the first electrode and a potential of the second electrode.

3. The display panel according to claim 2, wherein the substrate has a display region; wherein at least part of the second power line is disposed in the display region, and the part of the second power line disposed in the display region is mesh-shaped.

4. The display panel according to claim 1, wherein for each mesh-shaped signal line, the signal line coupled to each sub-pixel has a first portion extending along a first direction, and the first portions of the signal line coupled to the plurality of sub-pixels in each pixel are communicated with each other in the first direction, the signal line coupled to at least one sub-pixel has a second portion extending along a second direction, and the second portions of the signal line coupled to different sub-pixels are spaced apart from each other in the first direction, and the first portion and the second portion are coupled to each other; and for at least part of the mesh-shaped signal lines, the first portion and the second portion of each of the signal lines are disposed in different layers, and for other mesh-shaped signal lines except the at least part of the mesh-shaped signal lines, the first portion and the second portion of each of the signal lines are disposed in a same layer;

for other signal lines except the mesh-shaped signal lines, each of the signal lines extends along the first direction or extends along the second direction;

wherein the first direction intersects the second direction.

5. The display panel according to claim 4, wherein at least two of the first initialization line, the second initialization line and the third initialization line are mesh-shaped; and each pixel comprises at least three sub-pixels;

wherein for each of the at least two mesh-shaped initialization lines, the initialization line coupled to one of the at least three sub-pixels has the second portion.

6. The display panel according to claim 5, wherein different sub-pixels are coupled to different initialization lines having the second portion.

7. The display panel according to claim 4, wherein at least two of the first initialization line, the second initialization line and the third initialization line are mesh-shaped; and each pixel comprises at least three sub-pixels;

wherein for each of the at least two mesh-shaped initialization lines, the initialization line coupled to partial sub-pixels of the at least three sub-pixels has the second portion.

8. The display panel according to claim 7, wherein a number of the partial sub-pixels is greater than or equal to 1, and the partial sub-pixels are not adjacent in the first direction; and two sub-pixels adjacent in the first direction are coupled to different initialization lines having the second portion.

9. The display panel according to claim 4, wherein at least two of the first initialization line, the second initialization line and the third initialization line are mesh-shaped; and each pixel comprises at least three sub-pixels;

wherein for one part of the at least two mesh-shaped initialization lines, the initialization line coupled to each sub-pixel of the at least three sub-pixels has the second portion, and for the other part of the at least two mesh-shaped initialization lines except the one part of the at least two mesh-shaped initialization lines, the initialization line coupled to partial sub-pixels of the at least three sub-pixels has the second portion.

10. The display panel according to claim 9, wherein a number of the partial sub-pixels is greater than or equal to 1, and the partial sub-pixels are not adjacent in the first direction.

11. The display panel according to claim 5, wherein each pixel comprises three sub-pixels or four sub-pixels; each of the first initialization line, the second initialization line and the third initialization line is mesh-shaped; or, the second initialization line and the third initialization line are mesh-shaped.

12. The display panel according to claim 11, wherein the three sub-pixels in each pixel comprise: one red sub-pixel, one green sub-pixel and one blue sub-pixel; and the four sub-pixels in each pixel comprise: one red sub-pixel, two green sub-pixels and one blue sub-pixel.

13. The display panel according to claim 5, wherein the pixel in the display panel comprises: a plurality of metal layers sequentially stacked in a direction going away from the substrate; wherein for the at least part of the mesh-shaped signal lines, the first portion is disposed in a same layer as one metal layer of the plurality of metal layers, and the second portion is disposed in a same layer as another metal layer of the plurality of metal layers; and for the other mesh-shaped signal lines except the at least part of the mesh-shaped signal lines, the first portion and the second portion are disposed in a same layer as a same metal layer of the plurality of metal layers;

each of the other signal lines is disposed in a same layer as any metal layer of the plurality of metal layers.

14. The display panel according to claim 13, wherein the plurality of metal layers comprise: a first gate metal layer, a second gate metal layer, a third gate metal layer, a first source-drain metal layer and a second source-drain metal layer which are sequentially stacked;

the mesh-shaped signal lines comprise: the second initialization line and the third initialization line; wherein the first portion of the second initialization line is disposed in a same layer as the first source-drain metal layer, and the second portion of the second initialization line is disposed in a same layer as the second source-drain metal layer; or, the first portion and the second portion of the second initialization line are disposed in a same layer as the first source-drain metal layer; and the first portion of the third initialization line is disposed in a same layer as the third gate metal layer, and the second portion of the third initialization line is disposed in a same layer as the second source-drain metal layer.

15. The display panel according to claim 14, wherein the light emission control line extends along the first direction, and is disposed in a same layer as the first gate metal layer;

the second gate line extends along the first direction, and is disposed in a same layer as the second gate metal layer and the third gate metal layer;

the data line extends along the second direction, and is disposed in a same layer as the second source-drain metal layer;

the first power line comprises three portions coupled to each other, wherein one portion extends along the first direction, and is disposed in a same layer as the second source-drain metal layer; another portion extends along the second direction, and is disposed in a same layer as the first source-drain metal layer, and the other portion extends along the second direction, and is disposed in a same layer as the second source-drain metal layer;

the first reset line, the first gate line and the second reset line extend along the first direction, and are disposed in a same layer as the first gate metal layer or disposed in a same layer as the first source-drain metal layer.

16. The display panel according to claim 14, wherein the first initialization line extends along the first direction, and is disposed in a same layer as the second gate metal layer;

the mesh-shaped signal lines further comprise: a second power line disposed in a display region of the substrate; wherein a first portion of the second power line is disposed in a same layer as the first source-drain metal layer, and a second portion of the second power line is disposed in a same layer as the second source-drain metal layer.

17. The display panel according to claim 14, wherein the second power line disposed in the display region of the substrate extends along the second direction, and is disposed in a same layer as the second source-drain metal layer;

the mesh-shaped signal lines further comprise: the first initialization line; wherein a first portion of the first initialization line is disposed in a same layer as the second gate metal layer, and a second portion of the first initialization line is disposed in a same layer as the second source-drain metal layer.

18. The display panel according to claim 1, wherein the light emission control circuit comprises: a first transistor, a second transistor, a third transistor, a fourth transistor and a storage capacitor; the reset circuit comprises: a fifth transistor, a sixth transistor and a seventh transistor; and the drive circuit comprises an eighth transistor; wherein a gate of the first transistor is coupled to the first gate line, a first electrode of the first transistor is coupled to the data line, and a second electrode of the first transistor is coupled to the first node;

a gate of the second transistor is coupled to the second gate line, a first electrode of the second transistor is coupled to the second node, and a second electrode of the second transistor is coupled to the third node;

a gate of the third transistor is coupled to the light emission control line, a first electrode of the third transistor is coupled to the first power line, and a second electrode of the third transistor is coupled to the first node;

a gate of the fourth transistor is coupled to the light emission control line, a first electrode of the fourth transistor is coupled to the second node, and a second electrode of the fourth transistor is coupled to the first electrode of the light-emitting element;

one terminal of the storage capacitor is coupled to the first power line, and the other terminal of the storage capacitor is coupled to the third node;

a gate of the fifth transistor is coupled to the first reset line, a first electrode of the fifth transistor is coupled to the first initialization line, and a second electrode of the fifth transistor is coupled to the second node;

a gate of the sixth transistor is coupled to the second reset line, a first electrode of the sixth transistor is coupled to the second initialization line, and a second electrode of the sixth transistor is coupled to the first electrode of the light-emitting element;

a gate of the seventh transistor is coupled to the second reset line, a first electrode of the seventh transistor is coupled to the third initialization line, and a second electrode of the seventh transistor is coupled to the first node; and a gate of the eighth transistor is coupled to the third node, a first electrode of the eighth transistor is coupled to the first node, and a second electrode of the eighth transistor is coupled to the second node.

19. The display panel according to claim 18, wherein the second transistor is an N-type oxide transistor; and the first transistor, the third transistor, the fourth transistor, the fifth transistor, the sixth transistor, the seventh transistor and the eighth transistor are P-type low-temperature poly-silicon transistors.

20. A display device, comprising: a power supply assembly, and a display panel; wherein the display panel comprises: a substrate and a plurality of pixels disposed on the substrate; wherein each of the plurality of pixels comprises a plurality of sub-pixels, and each of the plurality of sub-pixels comprises a pixel circuit and a light-emitting element, the pixel circuit comprising:

a drive circuit, coupled to a first node, a second node and a third node, wherein the drive circuit is configured to control a potential of the second node based on a potential of the third node and a potential of the first node; and a reset circuit, coupled to a first reset line, a second reset line, a first initialization line, a second initialization line, a third initialization line, the first node, the second node, and a first electrode of a light-emitting element which are disposed on the substrate, wherein the reset circuit is configured to control connection or disconnection between the first initialization line and the second node based on a first reset signal provided by the first reset line, control connection or disconnection between the second initialization line and the first electrode of the light-emitting element based on a second reset signal provided by the second reset line, and control connection or disconnection between the third initialization line and the first node based on the second reset signal provided by the second reset line;

wherein at least one of the first initialization line, the second initialization line and the third initialization line is mesh-shaped;

the power supply assembly is coupled to the display panel, and configured to supply power to the display panel.

* * * * *